US007084456B2

(12) United States Patent
Williams et al.

(10) Patent No.: US 7,084,456 B2
(45) Date of Patent: Aug. 1, 2006

(54) TRENCH MOSFET WITH RECESSED CLAMPING DIODE USING GRADED DOPING

(75) Inventors: Richard K. Williams, Cupertino, CA (US); Michael E. Cornell, Campbell, CA (US); Wai Tien Chan, New Territories (HK)

(73) Assignees: Advanced Analogic Technologies, Inc., Sunnyvale, CA (US); Advanced Analogic Technologies (Hong Kong) Limited, Kowloon (HK)

( * ) Notice: Subject to any disclaimer, the term of this patent is extended or adjusted under 35 U.S.C. 154(b) by 108 days.

(21) Appl. No.: 10/606,112

(22) Filed: Jun. 24, 2003

(65) Prior Publication Data

US 2005/0035398 A1 Feb. 17, 2005

Related U.S. Application Data

(63) Continuation-in-part of application No. 09/792,667, filed on Feb. 21, 2001, now abandoned, which is a continuation of application No. 09/318,403, filed on May 25, 1999, now Pat. No. 6,291,298.

(51) Int. Cl.
*H01L 29/94* (2006.01)
*H01L 31/062* (2006.01)
(52) U.S. Cl. .................. 257/329; 257/257; 257/330; 257/331; 257/333; 257/335; 257/E29.257; 257/E29.26
(58) Field of Classification Search ........ 257/328–333, 257/335, E29.131, E29.256, E29.257, E29.26, 257/611
See application file for complete search history.

(56) References Cited

U.S. PATENT DOCUMENTS

| | | | | | |
|---|---|---|---|---|---|
| 5,558,313 | A | * | 9/1996 | Hshieh et al. | 257/342 |
| 5,674,766 | A | * | 10/1997 | Darwish et al. | 438/270 |
| 5,686,128 | A | * | 11/1997 | Tracy et al. | 257/331 |
| 5,689,128 | A | * | 11/1997 | Hshieh et al. | 257/331 |
| 5,929,481 | A | | 7/1999 | Hshieh et al. | |
| 5,998,836 | A | | 12/1999 | Williams | |
| 6,049,108 | A | * | 4/2000 | Williams et al. | 257/314 |
| 6,198,127 | B1 | * | 3/2001 | Kocon | 257/328 |
| 6,211,549 | B1 | * | 4/2001 | Funaki et al. | 257/329 |
| 6,262,453 | B1 | * | 7/2001 | Hshieh | 257/341 |
| 6,396,102 | B1 | * | 5/2002 | Calafut | 257/331 |
| 6,511,885 | B1 | | 1/2003 | Harada et al. | |

* cited by examiner

*Primary Examiner*—Kenneth Parker
*Assistant Examiner*—Matthew E. Warren
(74) *Attorney, Agent, or Firm*—David T. Millers

(57) ABSTRACT

In a trench-gated MOSFET including an epitaxial layer over a substrate of like conductivity and trenches containing thick bottom oxide, sidewall gate oxide, and conductive gates, body regions of the complementary conductivity are shallower than the gates, and clamp regions are deeper and more heavily doped than the body regions but shallower than the trenches. Zener junctions clamp a drain-source voltage lower than the FPI breakdown of body junctions near the trenches, but the zener junctions, being shallower than the trenches, avoid undue degradation of the maximum drain-source voltage. The epitaxial layer may have a dopant concentration that increases step-wise or continuously with depth. Chained implants of the body and clamp regions permits accurate control of dopant concentrations and of junction depth and position. Alternative fabrication processes permit implantation of the body and clamp regions before gate bus formation or through the gate bus after gate bus formation.

3 Claims, 45 Drawing Sheets

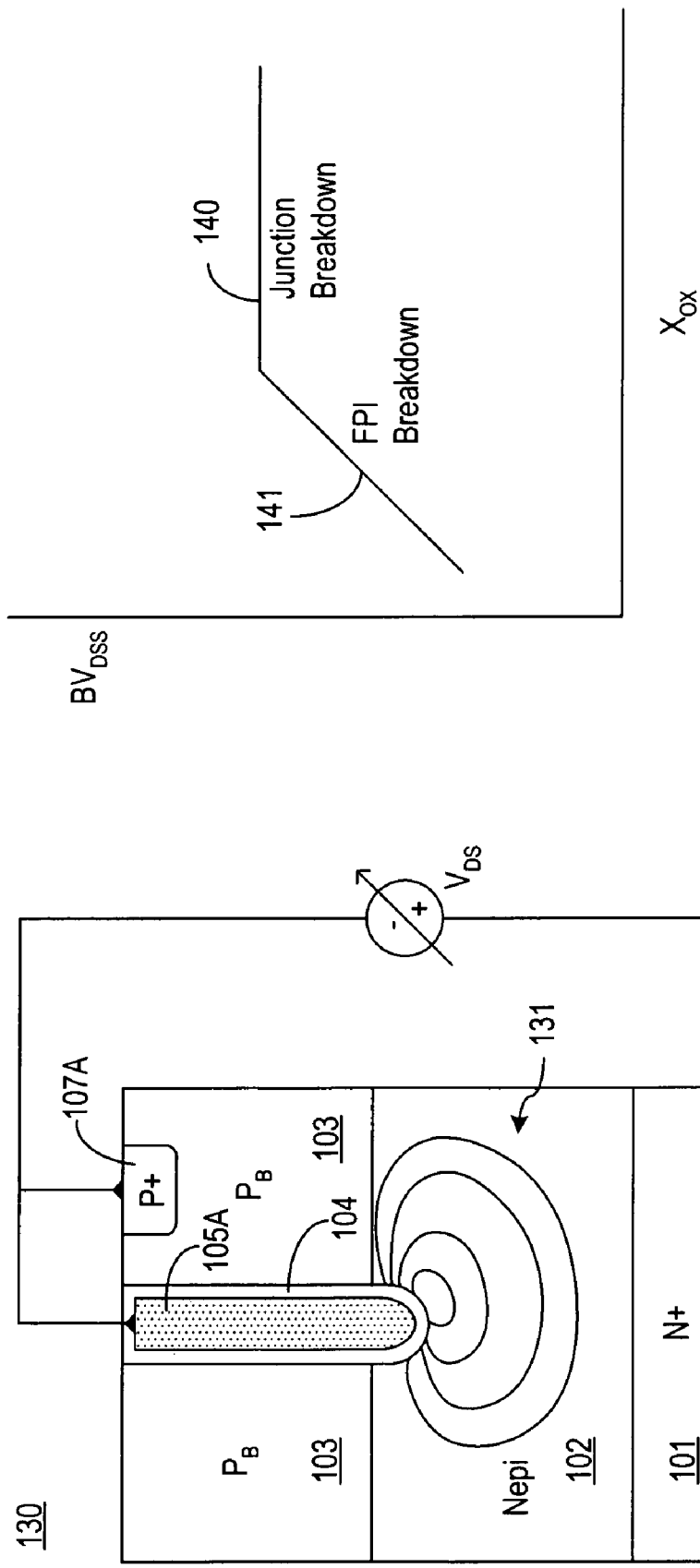

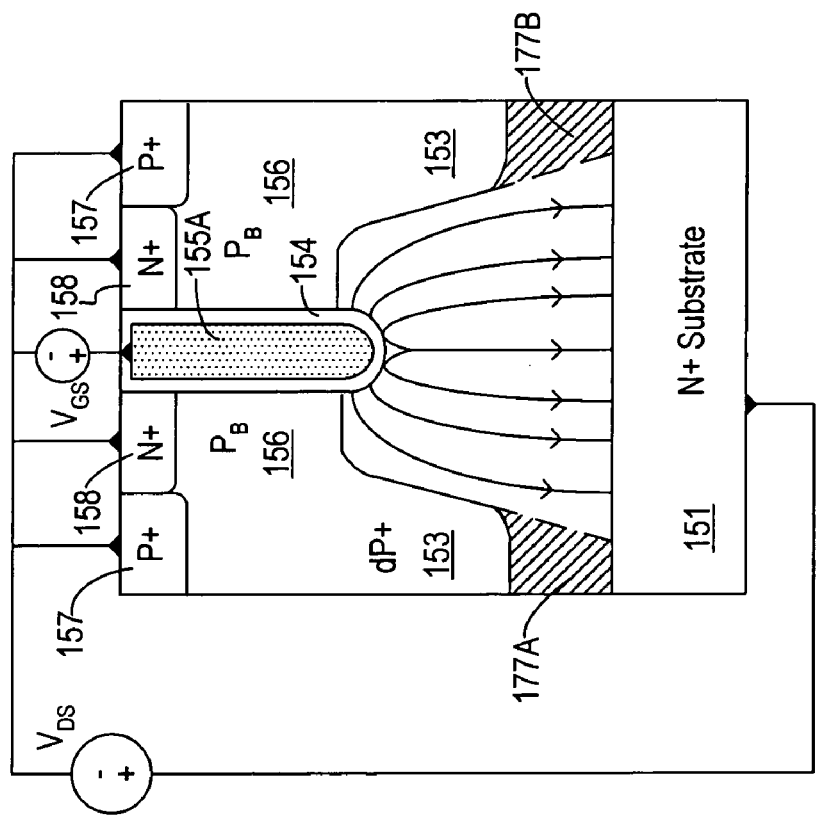
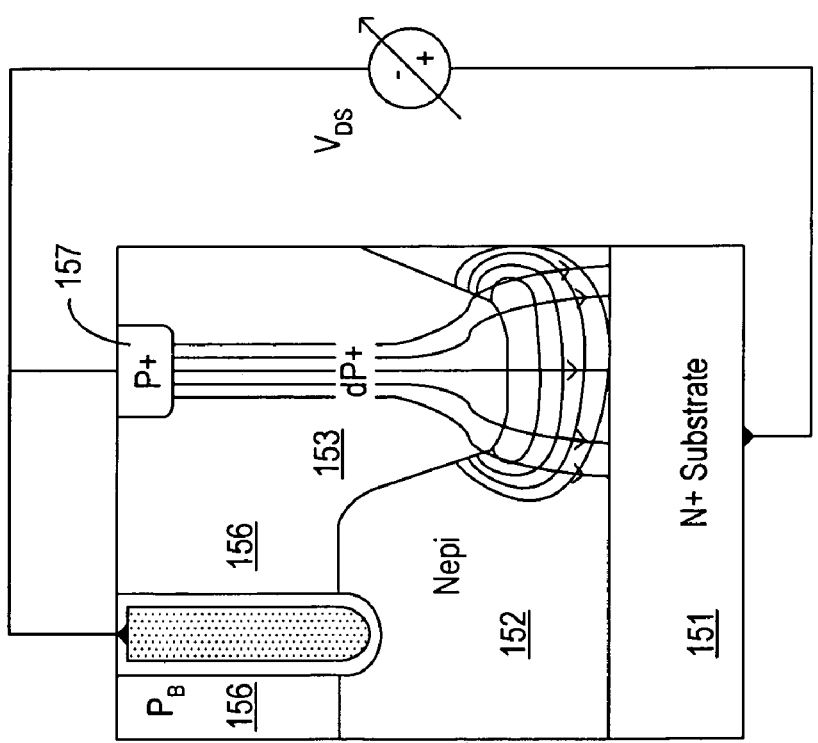
Fig. 2E
Fig. 2D

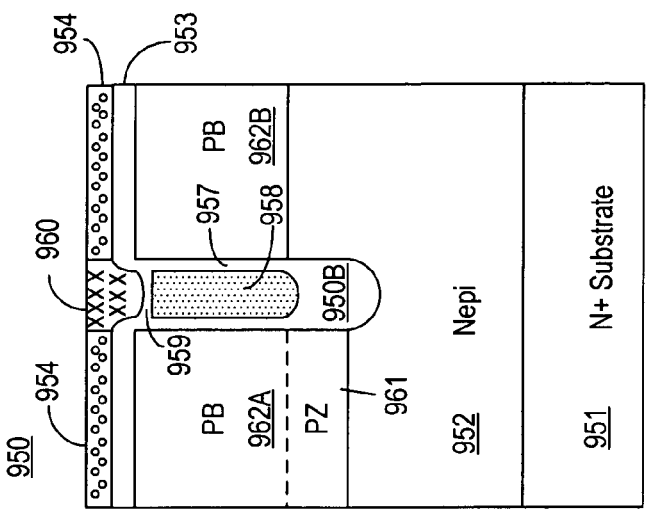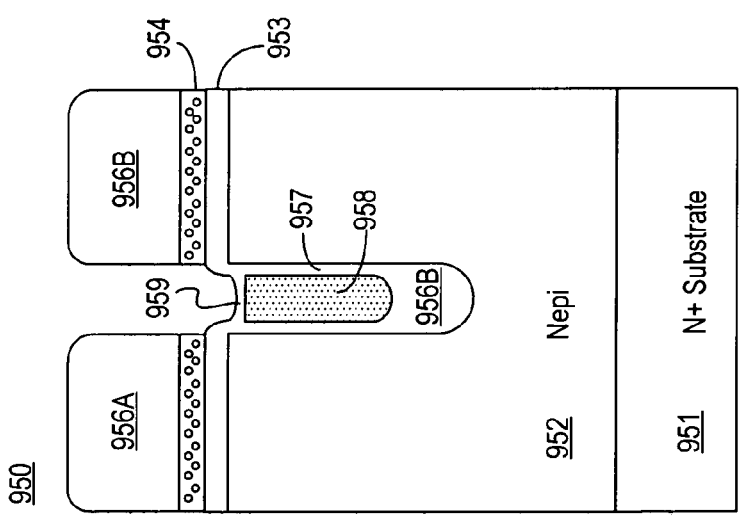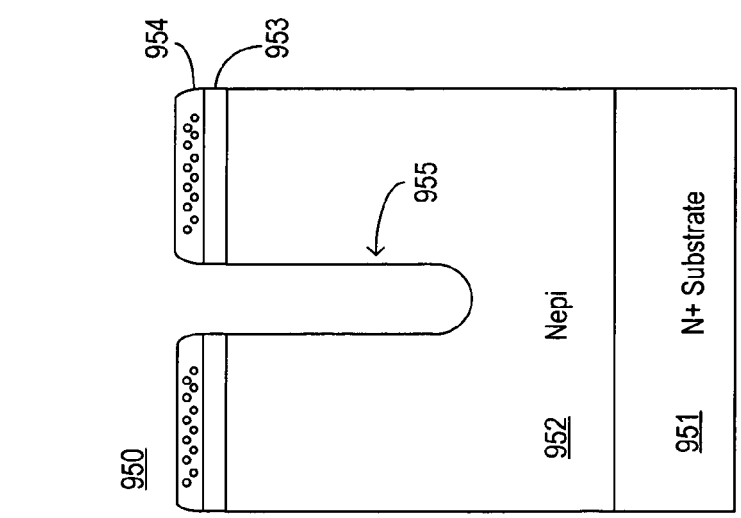

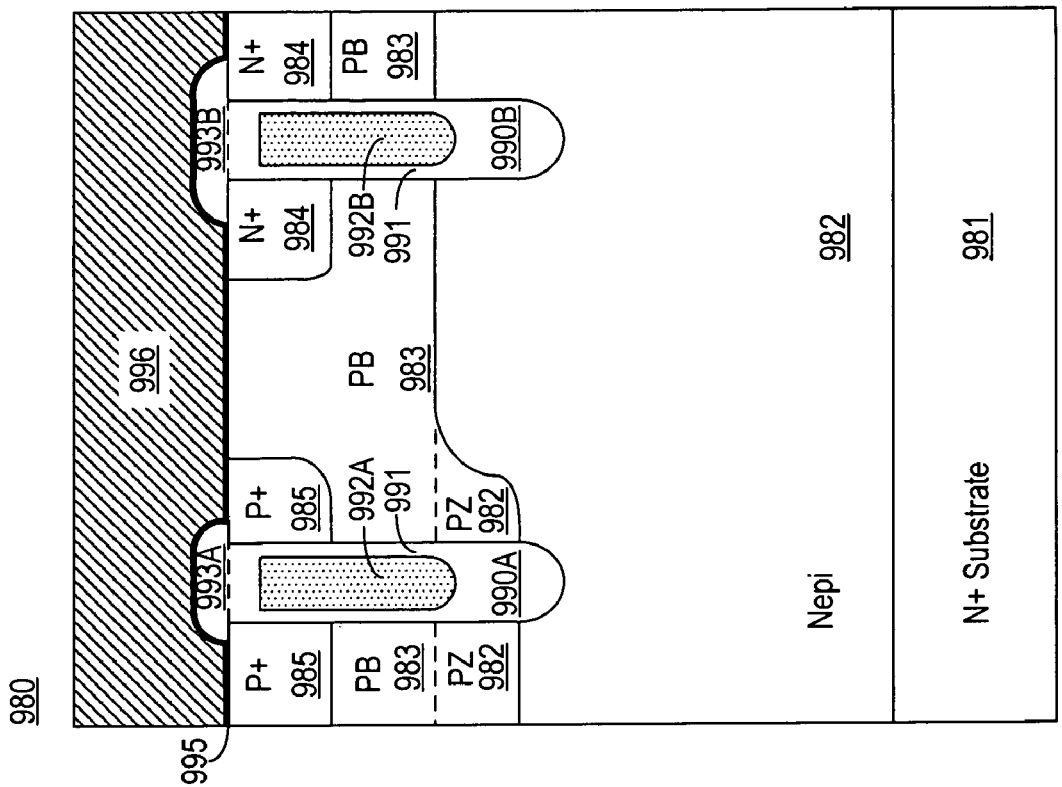
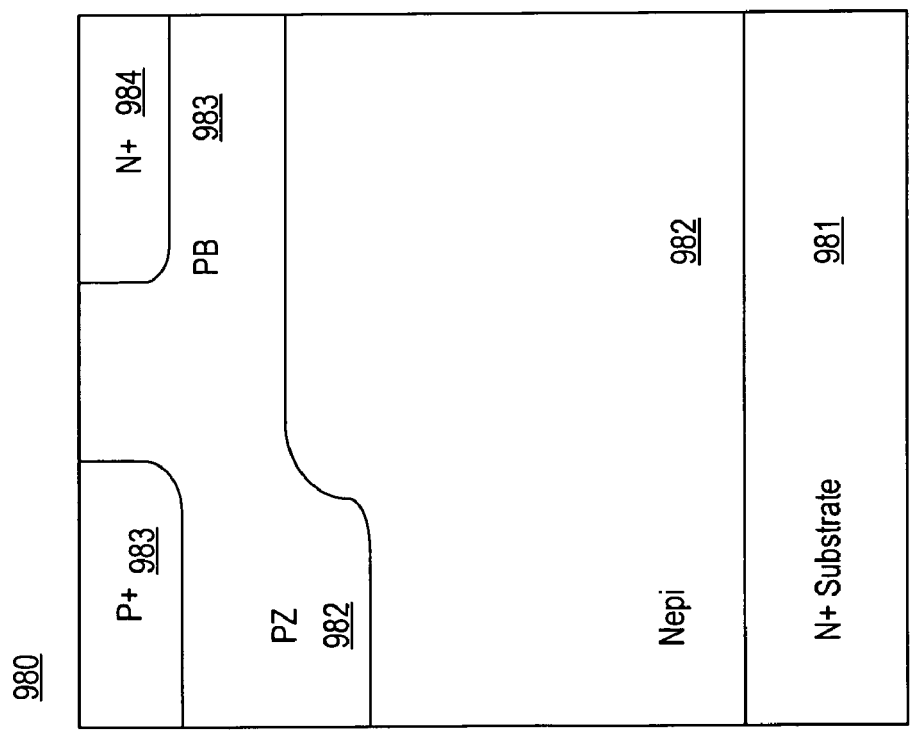
Fig. 16B
Fig. 16A

TRENCH MOSFET WITH RECESSED CLAMPING DIODE USING GRADED DOPING

CROSS-REFERENCE TO RELATED APPLICATIONS

This is a continuation-in-part of U.S. patent application Ser. No. 09/792,667, filed Feb. 21, 2001 now abandoned, which is a continuation of U.S. patent application Ser. No. 09/318,403, filed May 25, 1999 (now U.S. Pat. No. 6,291,298). U.S. patent application Ser. Nos. 09/792,667 and 09/318,403 are hereby incorporated by reference in their entirety.

BACKGROUND

The vertical trench-gated power MOSFET has rapidly displaced all other forms of low voltage power MOSFETs due to its off-state voltage blocking capability, high cell-density, high current capability and its intrinsically low on-state resistance. The trench-gated MOSFET 100, as shown in the prior-art cross-section of FIG. 1A, includes an array of etched trenches lined with a thin gate oxide 104 and containing an embedded polysilicon gate 105. The entire device is formed in an epitaxial layer 102 grown atop a heavily doped substrate 101 having the same conductivity type as the epitaxial layer 102. The epitaxial layer 102, functioning as the drain of the trench gated MOSFET 100, is adjusted in thickness and dopant concentration to adjust an optimum tradeoff between off-state breakdown voltage and on-state conduction characteristics.

The MOSFET 100 is often referred to as a trench-gated DMOS device, where the "D" is an acronym for "double" originally named for the formation of the device's channel region by double diffusion (i.e., two successive diffusions one inside the other). The deeper of the two diffusions, body region 103 has a conductivity type opposite that of epitaxial layer 102, forming the body-to-drain junction of the MOSFET 100. The shallower region 106 (including regions 106A, 106B, 106C, 106D, etc.) serves as the source of the MOSFET 100 and forms a junction with the opposite conductivity type body region 103 which contains it. The MOSFET's channel region is therefore disposed vertically within body region 103 along the side of embedded gate 105.

In the illustration, the source region 106 (labeled as N+ to denote its high concentration) is N-type, body region 103 (denoted by the label PB) is P-type, while the epitaxial layer 102 (labeled as Nepi) is N-type. A MOSFET having an N-type source and drain is referred to as an N-channel device. A fabrication process for MOSFET 100 is capable of integrating from one up to millions of transistors electrically connected in parallel, but all of the N-channel variety. Alternatively the substrate, epitaxial layer, and source can be made P-type (and the body region N-type) to form an electrically parallel array of entirely P-channel devices. The net result is a device as shown schematically in FIG. 1B having only three electrical terminals: a source, a drain, and a gate, despite the integration of millions of devices. Unlike in conventional CMOS integrated circuits, there is currently no convenient way to integrate both N-channel and P-channel trench MOSFET devices into a single piece of silicon.

In sharp contrast to conventional surface MOSFETs used in ICs, the key characteristic of a DMOS device is its channel length as determined by the difference in the depth between source-body and body-drain junctions, not in the photolithographic dimensions of its polysilicon gate. Since the gate and the channel of a trench-gated MOSFET are perpendicular to the surface of the die, the current flows vertically into the bulk of the silicon, and eventually out the back of the wafer. Such a device is therefore referred to as a vertical conduction device. Thick metal 109 (typically including aluminum with some small percentage of copper and silicon) is used to facilitate contact to source region 106 and to electrically short the body region 103 to the source region 106 through shallow P+ contact regions 107 (including regions 107A, 107B, etc.) Electrical connection to the body region 103 is needed to bias the body region 103 for a stable threshold voltage and to suppress a parasitic bipolar junction transistor whose presence and significance shall be discussed in greater detail below. Electrical contact to the drain is facilitated through the backside of the substrate 101, typically by a titanium, nickel, and silver sandwich formed after wafer thinning (i.e., after fabrication has been completed).

When using diffusion processes to form the MOSFET 100, the concentration of the source region 106 is necessarily higher than the body region 103, which in turn is more heavily doped than the epitaxial layer 102. Since the body concentration exceeds that of the epitaxial layer 102, the majority of depletion spreading in the MOSFET 100 during operation under reverse bias occurs in the lightly doped epitaxial drain 102, not in the body region 103. So, the MOSFET 100 with a short channel length can support large reverse bias voltages without the risk of the depletion region "punching through" to the source region 106. Typical channel lengths are one half micron or less, even in a 30V or 100V rated device. In conventional surface MOSFETs, a half-micron channel length can only support around 5V to 10V.

In more recent inventions like those described in U.S. Pat. No. 6,413,822 (Williams, et al.), the double diffusion has been replaced with an all implanted implementation where virtually no diffusion is required. The short channel resulting from the as-implanted (i.e., dopant profiles are not redistributed by diffusion) DMOS junction is still similar to double-diffused versions except that as-implanted dopant profiles may include sequential implants of varying dose and energy and therefore need not follow the Gaussian dopant profiles characteristic of diffused junctions. Such a device may still be referred to as a DMOS, but modifying the D to symbolize the double junctions (source within body within drain), and not the double diffusion process method.

Referring again to the schematic of FIG. 1B, the equivalent circuit of the trench DMOS 120 includes an idealized MOSFET 121 and a gated diode 122. The diode 122 represents the body-to-drain PN junction formed by body region 103 and drain region 102. The gate represents the field plate effect of the polysilicon gate 105 on this junction, especially since the gate 105 overlaps into the drain region 102 with only a thin gate oxide 104 separating the two elements. While the thin gate oxide 104 is protected from rupture in its off state from depletion sharing between adjacent body regions 103, the presence of the gate 105 can adversely influence junction avalanche, both in the breakdown voltage rating of the trench DMOS 120, and in the location of the avalanche process.

This principle is illustrated in FIG. 1C where a trench MOSFET 130 is shown absent of any source region to exemplify the field plate induced breakdown concept. A reverse bias $V_{DS}$ applied to the junction between body 103 and epitaxial drain 102 results in carrier multiplication as shown by the contours 131 of impact ionization located in the vicinity of the trench gate 105. The ionization rates are much greater and of different shape than if the trench gates 105 were not present. The plot of gated diode breakdown $BV_{DSS}$ vs. gate oxide thickness Xox in FIG. 1D illustrates that oxide thickness can influence the avalanche value of the reverse biased PN junction. For the example shown, when gates-source voltage $V_{GS}$ is 0, i.e., when the gate 105 is tied to the p-type body, a thick gate oxide avoids oxide thickness dependence as illustrates by region 140 of the plot. For thinner oxides however, the breakdown will degrade linearly with oxide thickness as evidenced by region 141 of the plot. As labeled, the reduced avalanche value in region 141 is due to the field plate induced (FPI) breakdown effect.

Another way to illustrate field plate induced breakdown is as a plot of junction breakdown vs. gate bias as shown in FIG. 1E. In this configuration, negative gate bias, where the source is biased so as to accumulate the body majority carrier concentration, can also adversely degrade the breakdown voltage of a device. As shown, junction breakdown 142 is reduced by the presence of the field plate effect of the trench gate. Starting at some negative gate bias, typically several volts beyond the source potential (i.e., where $VGS \leq 0$), curve 143 illustrates the onset of FPI breakdown, which generally degrades BVD linearly with gate potential. Even so, the device of curve 143 exhibits minimal FPI effects since the breakdown remains at its full voltage at gate-source voltage $V_{GS}$ equal to 0. Curve 144 of a different device exhibits a stronger FPI effect, showing breakdown reduction even for gate-source voltage VGS equal to 0. This curve 144 represents an example where the trench gate penetrates the body by a greater extent, or with a thinner oxide than that of the device of curve 143. Clearly the adverse effects of FPI breakdown are more prevalent with thin oxide devices. Thin oxide devices, commonly employed for lower-voltage device operation in battery-powered applications, therefore exhibit higher sensitivity to FPI related problems.

One way to reduce the impact of the gate on breakdown is to electrostatically shield the bottom of the trench using deep junctions of the same conductivity type as the body regions as described in U.S. Pat. No. 5,072,266, entitled "Trench DMOS Power Transistor With Field-Shaping Body Profile And Three-Dimensional Geometry," to Bulucea et al. FIG. 2A illustrates a portion of a trench MOSFET 150 having deep body regions 153 that are diffused deeper than the bottom of trench gates 155. Deep body regions 153 have the same potential as body regions 156, but typically have a higher dopant concentration. Both regions 153 and 156 are contacted at the surface by heavily doped contact regions 157.

The electrical properties of trench MOSFET 150 can be represented by the schematic shown in FIG. 2B where MOSFET 171 includes a gated diode 172. But rather than the gate of the gated diode 172 being connected directly to the gate of the MOSFET 171 as in the flat bottom body device 120 of FIG. 1B, the device 150 of FIG. 2A exhibits an effect best explained as that of a JFET 173 connection between the actual gate of the device 150 and the gate describing the FPI gated diode effect. At sufficient reverse bias, the depletion regions spreading from the adjacent deep body regions 153 merge together and essentially pinch off or disconnect the field plate effect from the junction potential (see cross-hatched region of FIG. 2C). The FPI effect is then greatly diminished in magnitude, and a high breakdown is preserved.

FIG. 2B also illustrates the addition of a zener diode 174 representing the PIN junction formed between deep body region 153 and heavily-doped substrate 151. In a high current avalanche, most of the current flows through the heavily doped region body region 153 rather than through body region 156 as illustrated in FIG. 2D. The deep region 153 forms a junction that carries more current in avalanche due to its lower breakdown voltage (as illustrated by the ionization contours) and lower series resistance (being more highly doped than the body region 156). The breakdown of zener diode 174 is lower than gated diode 172 since the region 153, which forms the diode's anode, is in closer proximity to substrate 151 than that of shallow body 156, thereby reducing its PIN breakdown voltage. So since this breakdown occurs at a lower voltage than the body junction breakdown, deep body region 153 adds a second degree of protection by clamping the maximum drain voltage to a lower value and never letting the voltage rise to the point that field plate induced breakdown occurs. Avoiding FPI breakdown is advantageous since the FPI breakdown involves semiconductor surfaces and interfaces that may charge and therefore are intrinsically less reliable than bulk silicon avalanche breakdown. It should be noted the term "zener" is not in reference to a zener breakdown mechanism (a type of tunneling phenomena), but simply refers to the voltage clamping action of the diode.

Whilst the deep body region 153 can greatly improve the robust character of the trench MOSFET 150 in avalanche, the deep body region 153 also imposes some problematic limitations in the on-state performance of the trench MOSFET 150. FIG. 2E, for example, illustrates that current in the on-state condition flows vertically from the topside sources 158 along the gate oxide 154 within the body regions 156A then expands or spreads into the epitaxial layer 152 after passing the bottom of the trench.

The spreading of current indicates that the entire cross-sectional area is not being fully utilized in carrying current. Hence, the device is not operating at its theoretical lowest on-state resistance. Moreover the spreading angle of the current (which unimpeded occurs at approximately 45°) becomes further limited by the intrusion of the lateral diffusion of the deep body regions 153. In fact, epitaxial layer portions 177A and 177B directly beneath deep body regions 153 never carry any current at all, contributing to a higher resistance.

The on-resistance penalty of deep body diodes surrounding each trench gate 155 becomes even more problematic as cell dimensions are decreased (i.e., at higher cell densities). In FIG. 2F, for example, an increase in cell density ideally should increase the number of parallel transistors, thereby reducing the overall resistance of a given area device. To avoid comparing devices of dissimilar area, the on-resistance RDS is often normalized by the area A and described by a figure of merit known as specific on-resistance RDSA, having units of on-resistance times area such as $m\Omega cm^2$. In region I (for densities below approximately 12 $Mcell/in^2$), an increase in cell density reduces specific on-resistance as expected. Above that density, in region II, the limitation of the deep body on confining the current spreading in the epitaxial layer causes an increase in on-resistance per cell that offsets the benefit gained by having more parallel conducting cells in the same region. The limitation of current spreading results in a constant specific on-resistance, so that no benefit in resistance is gained by increasing the cell density. In region III (for densities above for example 24 $Mcells/in^2$), the on-resistance starts to climb rapidly. This effect occurs when the high concentration of the deep body begins to adversely interfere with the channel concentrations thereby increasing the threshold voltage of the device.

FIG. 2G illustrates a top view of a closed cell array (in this case square) of a trench-gated MOSFET 180 illustrating the polysilicon filled trench regions 181, and mesa regions 182 between the trenches, along with the deep body regions 183 located within each mesa region 182. Whenever the spacing between deep body regions 183 and the trench regions 181 gets too close, the high concentration of the deep body regions 183 adversely interfere with the channel concentrations as noted above. This effect can result from making the deep body regions 183 too large, or by shrinking the cell pitch without shrinking the deep body region by a proportional amount. The deep body regions 183 must have at least a minimum size to be diffused past the bottom of the trench. If the deep body region 183 becomes smaller than its depth, the diffusion will start to exhibit starved diffusion effects (where the surface concentration along the entire surface is affected by both lateral and vertical diffusion). The effect of starved diffusion is that the junction depth of the deep body will become shallower than in wider areas and will not reach below the bottom of the trench, hence no benefit will be gained from the presence of the deep body.

In an alternative approach described in U.S. Pat. No. 6,140,678, entitled "Trench-Gated Power MOSFET with Protective Diode" to W. Grabowski, R. Williams, and M. Darwish, the deep body region is not introduced into every mesa region, but instead is limited to a fraction of the device's mesa regions, typically ⅟₁₆th of the total active device cells. In FIG. 3A, the cross-section of device 200 illustrates an array of trenches with gate oxide 204 and embedded trench polysilicon 205 formed in an epitaxial layer 202 atop a heavily doped substrate 201. The body diffusion (collectively as 203) is formed in every mesa region between the trenches including active channel portions 203A, 203B, 203C, 203E, and 203F. Body region 203D is formed in a diode-only cell lacking a source but integrating a deep body region 209 (labeled as dP+ in the N-channel example as shown) having a width $y_{dP+}$, which may extend entirely between two adjacent trenches.

While the device 200 looks like the device 150 of FIG. 2A, operation of device 200 is substantially different and phenomenologically indicated in schematic FIG. 3B. In FIG. 3B, the MOSFET 220 and zener diode 222, which is in parallel with MOSFET 220, have dissimilar areas. Their respective areas, as denoted by the label "1/A" for the diode and "(n−1)/A" for the MOSFET, describe that in an active area A (comprising n cells) 1 cell will constitute a diode cell and the other (n−1) cells include active transistors. The active transistors also contain their integral body-to-drain PN junction diode 221, gated by the trench gate electrode. The benefit of deep-body charge sharing (the JFET effect) that minimizes gated diode breakdown in the device 150 of FIG. 2A is lost in the 1-of-n design since the deep body is not present in or near every cell. Without the charge sharing effect, the protection of the device falls totally on the zener diode, which is repeated at a regular interval, sparsely yet uniformly. Note that without charge sharing, the zener breakdown voltage of diode 222 must therefore have a breakdown lower than that of gated diode 221 to provide any degree of protection.

In an "n" cell device, 1-of-n cells include the protective zener diode clamp 222, and the rest of the cells include active devices. The layout is best understood by a top view of a closed cell array vertical trench gated MOSFET shown in FIG. 3C. In such a design, the trench gate array 231 contains a repeated array of sixteen cells, fifteen cells containing active devices 234 and one diode cell 232 containing a deep body 233. The entire array repeats at regular intervals.

In principle, the diode clamp 222 formed by deep body opening 233 limits the maximum voltage imposed upon the device. The contact and junction area of the zener diode must be of adequate area to carry the avalanche current without damage. Practically speaking, however, the deep body dimension $y_{dP+}$ must generally be smaller than the mesa region 232 or the lateral diffusion of the deep junction will spill over into adjacent active cells and prevent their conduction.

FIG. 3D illustrates the 1-of-n design operating in avalanche, carrying current while sustaining a high voltage and high fields at the point of silicon avalanche. In proper operation, deep body 209 sustains the highest fields in the device, and the ionization contours indicate the breakdown and resulting current flow occurs at the bottom of the deep body diffusion far away from trench gate oxide 204. To keep the ionization low in the vicinity of the trench gate (under body 203C near the trench), the avalanche breakdown of deep body diode 209 to epitaxial layer 202 must be substantially lower than the breakdown of body 203C to epitaxial layer 202 junction gated by the trench gate.

This principle is illustrated in the graph of FIG. 3E where the component diode breakdown voltages BV are shown as a function of the gate oxide thickness Xox. The breakdown BV(PB) of the flat body junction has an avalanche voltage given by line 242 until the gate oxide gets thin enough to induce field plate induced breakdown shown by line 243. The avalanche breakdown voltage $BV_Z$ of deep body zener diode clamp given by line 240 is intentionally designed to be lower than that of the body diode (line 242) so that breakdown will not occur near the trench gate. A voltage margin of 4V to 10V is desirable to allow for manufacturing variations so that the FPI breakdown voltage never falls below the zener voltage.

Whenever the FPI breakdown drops below the zener voltage BVz of line 240, the device is no longer protected. This problem occurs for higher epitaxial dopant concentrations in the epitaxial layer and for thinner gate oxides, conditions needed to optimize low voltage trench devices for the lowest possible on-resistances. This effect is further exemplified in the graph of FIG. 3F illustrating the epitaxial concentration dependence of the PN junction transitioning from avalanche breakdown 250 to FPI breakdown 251 at higher epitaxial concentrations. The zener voltage BVz shows very little concentration dependence in region 253, while the zener diode is in PIN reach-through avalanche, i.e., when its depletion region at avalanche has completely depleted the epitaxial layer (or more specifically the net epitaxial layer between the bottom of the deep body junction and the top of the heavily doped substrate). At a higher dopant concentration, the epitaxial layer no longer depletes, and the diode shows the classic PN doping dependence of region 254. Before that happens, however, the FPI breakdown of the body junction drops below BVz and the device is no longer protected.

In conclusion, the 1-of-n clamp is limited in its ability to clamp and protect against FPI breakdown in low voltage devices. For example, to protect a 30V rated MOSFET with a thin gate oxide, the zener must be designed to breakdown at 34V, and the gated body diode must use light enough epitaxial doping to breakdown above 40V. In essence a 40V MOSFET is used to operate safely at 30V. The extra 10V avalanche guard-band means the device has the on-resistance of a 40V device not a 30V device. This method still results in a higher than desirable on-resistance, albeit not as severe as in device 150 of FIG. 2A.

A method to reduce the impact of the FPI breakdown problem is described in U.S. Pat. No. 6,291,298 to Williams et al., which is incorporated herein in its entirety. As shown in FIG. 4A a trench gated vertical power MOSFET 300 shown in cross-section having trench gates with embedded polysilicon gates 304A to 304C (collectively referred to as gates 304) and thin sidewall gate oxides 310A to 310C (collectively referred to as sidewall gate oxide 310), incorporates a region of thick oxide 303A to 303C (collectively referred to as thick bottom oxide 303) located at the bottom of each trench. The thick bottom oxide (TBOX) with a typical thickness of 2 kÅ greatly reduces the influence of the trench gate on the junctions formed by body regions 305A to 305D (collectively referred to as body 305), reducing field plate induced impact ionization, protecting against oxide wear-out from carrier injection at the trench bottom, and reducing drain-to-gate overlap capacitance. The effect of the thickness of sidewall gate oxide 310 on the PN junction breakdown of body 305 to epitaxial layer 302 is greatly diminished in the presence of the TBOX region 303, especially if the body of gate polysilicon 304 only overlaps just beyond body 305. The body regions are shown to be more optimally formed using high energy ion implantation and as-implanted dopant profiles not redistributed by thermal diffusion.

The device is shown with uniform cells having source regions 306A to 306D shorted to metal 311 and also contains contacts to the body regions 305, contacted by metal 311 in the 3D projection of the device (not shown in the particular cross-section of FIG. 4A). Each trench is insulated from the source metal by a top dielectric 308A to 308C. The equivalent schematic of the device 300 is shown in FIG. 4B containing a MOSFET 320 in parallel with body-to-drain junction 321. No zener diode clamp is present, nor is any substantial field plate induced breakdown mechanism present.

FIG. 4C illustrates the advantage of the thick bottom oxide in surviving avalanche without the need for voltage clamping. Biasing the trench device into avalanche (shown in simplified form as a gated diode in FIG. 4C), the ionization contours illustrate avalanche occurring at the trench bottom against TBOX region 303B and not near the overlap of thin gate oxide 310B beyond body region 305C. In this structure, minimal hot carriers are injected into thin sidewall gate oxide 310B, despite the proximity of gate electrode 304B to the junction formed by body regions 305B, 305C and the opposite conductivity type epitaxial layer 302. The hot carrier reliability of such a device is greatly improved over an unclamped device with an entirely thin gate oxide lining the trench. Furthermore, the breakdown of such a device shows minimal dependence on the thickness of gate oxide 304B. Note however that some lateral current flow during avalanche may occur within body region 305 (as shown in the body region 305C of FIG. 4C). This lateral current flow is undesirable when compared to purely vertical current flow, a matter of important consideration discussed below.

FIG. 5A illustrates the phenomena of hot carrier trapping and oxide wear-out in a conventional uniform gate oxide trench-gated diode 340 (or any similar trench gated MOSFET). The presence of gate electrode 346 induces FPI carrier generation of a reverse bias junction between body 343A, 343B and epitaxial layer 342. Including curvature effects of the trench that locally enhance the electric fields in region 350, electron-pairs are generated via impact ionization. Even at a voltage below avalanche, these carriers are accelerated by the high localized electric fields of the reverse biased junction, the electrons being swept toward the wafer's backside contact and the holes being accelerated toward the negatively biased gate electrode. If the holes gain sufficient energy, they can overcome the energy barrier of the oxide-silicon interface and bury themselves into the oxide 345, gradually charging and damaging the thin gate oxide 345.

In contrast, a trench gated device 360 having a TBOX region 361 as illustrated in FIG. 5B exhibits impact ionization induced hot carrier generation primarily in a region 367, which leads to hot-hole injection into thick oxide 361 with virtually no effect on device reliability. Only hot carrier generation in a region 368 in the vicinity of thin sidewall gate ox 362 can degrade the conduction characteristics and long term reliability of device 360. Since the failure mode is a stochastic process and statistical phenomena, the small cross-sectional area of region 368 leads to minimal charge injection and in the worst case causes very slow degradation. With such low injection, twenty years or more of reliable operation and product lifetime are achievable. So while thick bottom oxide 361 avoids hot carrier induced damage, thick bottom oxide 361 does not protect fully against double injection effects, which may occur during high current avalanche conditions.

This double injection effect is illustrated in FIG. 6A, where the a thin gate trench gated vertical power MOSFET 380 not only includes the gated diode structure of the prior illustration (including gate 385, thin gate oxide 384, body regions 383A, 383B and highly doped body-contact regions 386A, 386B) but also includes opposite conductivity type source regions 387A, 387B (shown as N+ regions). The pre-avalanche current from impact ionization as shown by the current flow lines includes electrons in the n-type epitaxial layer 382 and holes in the p-type body region flowing laterally within body region 383B into body contact P+ region 383B. Assuming the body 383B remains relatively undepleted during such operation, the hole current in the P-type body region 383B constitutes majority carrier conduction. As shown in FIG. 6B, hole conduction in p-type material exhibits a voltage drop associated with the parasitic resistance $r_b$ and an increase in the potential of the body region 383C to a voltage $V_B(y)$ above the source/body ground potential (zero volts). So, the gated diode 391 creates a FPI ionization current that results in a de-biasing of the body voltage. If voltage $V_B(y)$ exceeds the potential of N+ source 387C by more than 0.6V (i.e., a forward biased diode voltage), then N+ source 387C will begin to inject electrons into the thin p-type body region 383C. These injected electrons give rise to a collector current of a parasitic NPN bipolar including N+ source 387C as emitter, P-type body 383C as base, and N-type epitaxial layer 382 as collector, hence the name double injection. This electron current flow is electrically in parallel with the gated diode current leading to positive feedback and a potential runaway condition, especially at high temperatures. The positive feedback of the NPN parasitic worsens at high temperatures, leading to localized heating, hot spots, and device burnout from high local current densities.

The solution to the double-injection problem is to keep the length of N+ region source region 387C short so that the resistance rb remains low, and to keep the concentration of the body region 383C as high as possible (given a target threshold voltage and gate oxide thickness). This principle of a good source-body short is clearly illustrated schematically in FIG. 6C where MOSFET 400 includes drain-to-body PN diode 401 (which may include FPI effects in avalanche) along with parasitic NPN transistor 403, and a source-body shorting contact that still has some parasitic base resistance 402 of magnitude rb. If the short is perfect and ideal, resistance rb will remain zero and the NPN transistor 403 can never turn on, avoiding electron injection from the N+ source and hence avoiding the risk of sustaining voltage snapback as illustrated in the current $I_D$ vs. drain-source voltage $V_{DS}$ characteristic shown in FIG. 5D.

The resistance rb remains difficult to minimize especially in narrow mesa trench gated power MOSFETs that lack adequate room to contact the P+ body contact along the entire length of the body region. In a device 500 having cross-sections shown in FIG. 6E and FIG. 6F, the resistance rb to the P+ contact 505A can be substantial, especially for current flowing within P-type body 503 under N+ source 504A. The source must be interrupted to make room to contact the P+ contact 505A leading to an undesirable tradeoff between the amount of source perimeter (lower on-resistance) and the body contact P+ (reduced resistance rb and improved snapback).

So in summary, double injection can lead to a further reduction in the off-state blocking characteristics of a trench-gated power MOSFET to voltages below that resulting from field plate induced (FPI) impact ionization and FPI avalanche current. Moreover, without a voltage clamp, it is difficult to shunt (i.e., reroute) high avalanche currents away from the trench edge (to avoid lateral current flow in the body region) and to thereby suppress double injection induced snapback. The deep-body method such as implemented in device 150 of FIG. 2A and the distributed (1-of-n type) diode clamp such as implemented in device 200 of FIG. 3A suppress double injection but increase device on-resistance. The added resistance is a severe limitation to cell density for device 150, which requires a deep body in every cell. The resistance increase in the distributed clamp is also substantial, needing at least 10V of overdesign to avoid FPI breakdown (which can lead to 20 to 40% increases in on-resistance) while still not completely eliminating FPI impact ionization currents.

As shown in the cross-section of device 550 in FIG. 7, using the 1-of-n clamp concept but with a shallow heavily-doped body 554 or shallow-zener voltage clamp does not adequately protect the device 550, since the trench gate 556A, 556B is deeper than the clamping diode junction, and therefore breaks down first. As an example, asymmetries in the device manufacturing can even cause the avalanche to occur on one side of the trenches, e.g., in regions 558 and 559, rather than uniformly on both sides, making double injection more likely due to the localized high ionization currents.

The thick bottom oxide has been shown to reduce FPI impact ionization currents, increase the onset of avalanche, and raise the device's breakdown voltage, but by itself cannot guarantee that the onset of double injection can be prevented, especially when and if the device is driven into high current breakdown operation (a condition common for power application circuits with inductive loads).

Available methods to clamp the voltage (and divert avalanche currents) to avoid snapback in trench gate power MOSFETs lead to increased on-resistance, and available methods to reduce impact ionization from thin-gate field-plate-induced (FPI) effects do little to prevent double injection and snapback. What is needed is a device that avoids (or at least minimizes) FPI impact ionization (even for thin gate oxides) while still clamping or diverting avalanche current without undue increases in on-state reduction.

SUMMARY

In accordance with an aspect of the invention, a trench-gated MOSFET includes: an epitaxial layer over a substrate of like conductivity; trenches containing thick bottom oxide, sidewall gate oxide, and conductive gates; body regions of the complementary conductivity that are shallower than the gates; and zener clamp regions that are deeper and more heavily doped than the body regions but shallower than the trenches. The zener junctions clamp a drain-source voltage lower than the FPI breakdown of body junctions near the trenches, but the zener junctions, being shallower than the trenches, avoid undue degradation of the maximum drain-source voltage.

One specific embodiment of the invention is a semiconductor device that includes a gate structure in trenches in the substrate. In each of the trenches, the gate structure includes a conductive (e.g., polysilicon or silicide) gate surrounded by an insulating material such as silicon dioxide that has a first thickness at a sidewall of the trench and a second thickness at a bottom of the trench. The first thickness is the gate oxide thickness and the second thickness is a bottom oxide thickness that is greater than the first thickness. A first region (e.g., a body region) of a second conductivity type is adjacent to at least one of the trenches and extends to a first depth in the substrate. A second region (e.g., a zener clamp region) of the second conductivity type is in electrical contact with the first region and extends to a second depth that is deeper than the first depth and shallower than the trenches. The conductive gate generally extends to a depth that is deeper than the first depth and shallower than the second depth.

A third region (e.g., a source region) of the first conductivity type is atop the body region and adjacent to the gate and gate oxide, and a voltage on the conductive gate control a current flow from the third, region through the first region to an underlying portion of the substrate. The current typically flows from the third region through the first region and through an epitaxial layer to the heavily doped semiconductor substrate.

The structure of the substrate can be varied to control the characteristics of the device. Generally, the substrate includes a first semiconductor layer (e.g., epitaxial layer) atop a semiconductor substrate that is more heavily doped than the first semiconductor layer, and the trenches extend into the first semiconductor layer. The first layer can be given a graded dopant profile such that a concentration of dopants of the first conductivity increases with depth in the layer. A series of implantations having varying depths and dopant concentrations similarly provide dopant concentrations of the same conductivity type as the epitaxial layer that increase with depth. Alternatively, the substrate can further include a second semiconductor layer atop the first semiconductor layer, wherein the second semiconductor layer is more lightly doped than the first semiconductor layer. In this configuration, the first or body region preferably forms a junction with the second semiconductor layer; and the second or zener clamp region forms a junction with the first semiconductor layer.

The zener clamp region can include a series of implantations at varying depths or can be diffused to the desired depth. However, the as-implanted structure of the zener clamp generally provides better junction profiles and excellent process reproducibility. In one configuration, the zener clamp regions completely fill the distance between adjacent trenches at selected locations and can extend farther to a set of adjacent mesas that are between the trenches. Alternatively, the zener clamp regions can be included in selected active transistor cells.

A gate bus that is electrically connected to the gate structure in the trenches can overlie a portion of the substrate that includes at least part of the body region and/or zener clamp region. In particular, the body and/or clamp regions can be formed before the gate bus or after the gate bus using implantations that pass through the gate bus.

Another specific embodiment of the invention is a fabrication process for a semiconductor device such as a trench-gated MOSFET. The process includes: (a) forming a plurality of trenches in a substrate of a first conductivity type; (b) depositing a thick oxide on bottoms of the trenches; (c) forming a gate oxide layer on sidewalls of the trenches; (d) filling the trenches with a conductive material; (e) forming body regions of a second conductivity in the substrate in areas corresponding to one or more mesas that are between the trenches, wherein the body regions have a first depth; (f) forming clamp regions of the second conductivity in areas corresponding to one or more mesas that are between the trenches, wherein the clamp regions have a second depth that is greater than the first depth but shallower than the trenches; (g) forming active regions of the first conductivity type above the body regions; and (h) providing electrical connections to the conductive material, the active regions, and the substrate. In alternative process flows, steps (a) to (d) can be performed before or after steps (e) and (f).

The process can use alternative process flows to form a gate bus. In one process flow, patterning the conductive material forms the gate bus overlying the substrate. Implanting dopants of the second impurity type through the gate bus can then form the body and/or clamp regions. Alternatively, the process of claim 18 removes the conductive material from a surface the substrate (e.g., by an etchback or chemical mechanical polishing process) and then forms the gate bus after forming the body regions and the clamp regions.

BRIEF DESCRIPTION OF THE DRAWINGS

FIG. 1C illustrates the gated diode effect.

FIG. 1D is a plot of trench-gated junction breakdown vs. oxide thickness for the device of FIG. 1A.

FIG. 2D shows a cross-section of the device of FIG. 2A illustrating avalanche current flow lines through the center of every cell.

FIG. 2E shows a cross-section of the device of FIG. 2A illustrating on-state conduction current flow including current "spreading" in an epitaxial drain.

FIGS. 15A to 15E show cross-sections of structures formed during a process for fabricating a zener clamped TBOX Trench-Gated MOSFET is accordance with an embodiment of the invention.

FIG. 16A shows a cross-section illustrating a masked implant formation of doped regions in an alternate process flow for a zener clamped TBOX trench-gated MOSFET.

FIG. 16B shows a cross-section illustrating trench formation, fill, contacts, and metallization in an alternate process flow for a zener clamped TBOX trench-gated MOSFET.

Use of the same reference symbols in different figures indicates similar or identical items.

DETAILED DESCRIPTION

Figure 8:
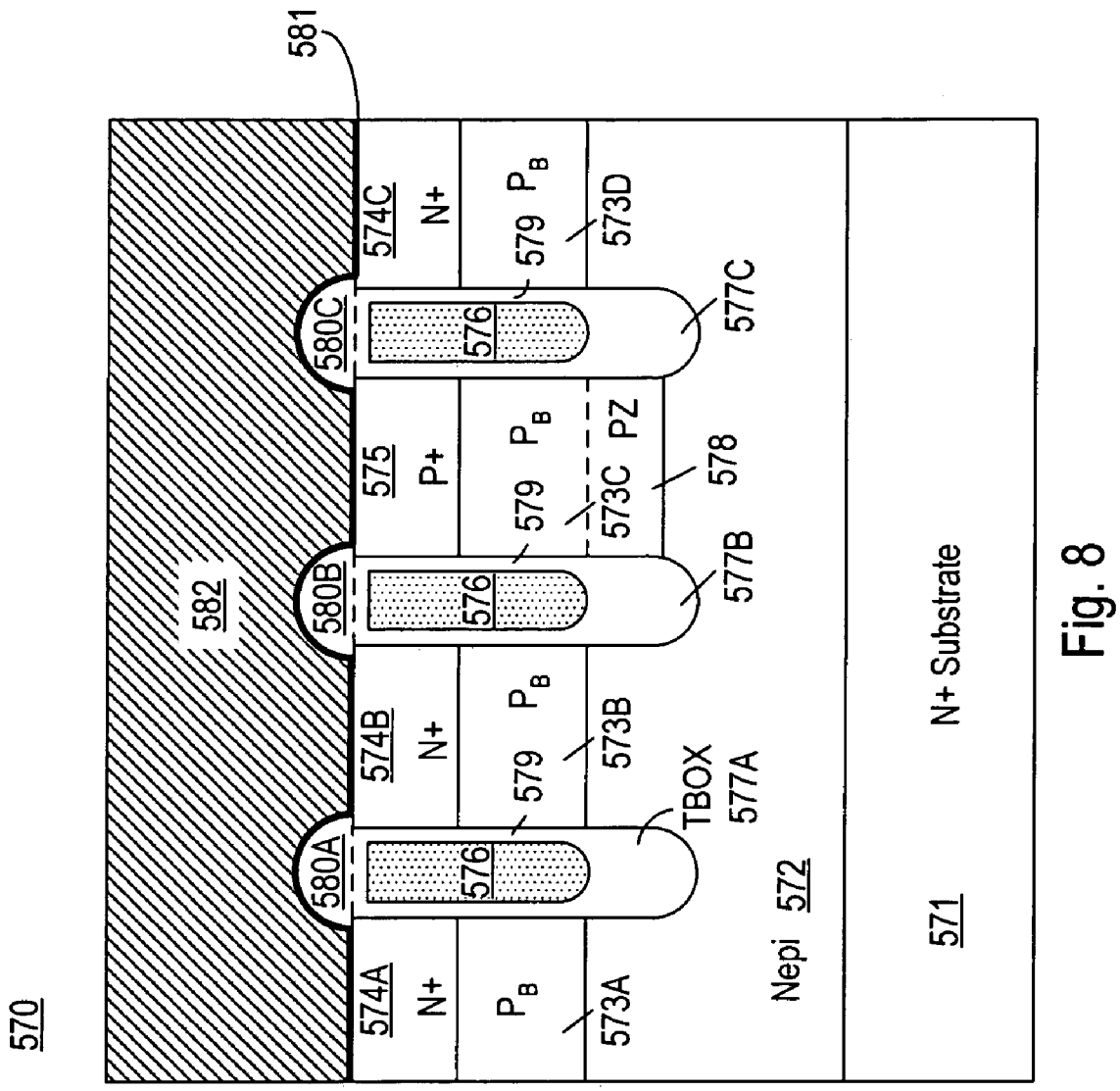
FIG. 8 shows a cross-section of a zener-clamped TBOX trench-gated MOSFET in accordance with an embodiment of the invention.

FIG. 8 illustrates a cross-section of trench gated MOSFET device 570 in accordance with one embodiment of this invention. The device 570 includes an array of trench with embedded polysilicon gates 576 and thick bottom oxide 577A, 577B, 577C formed in an epitaxial layer 572 atop a heavily-doped substrate 571 of like conductivity type. In the silicon mesa regions between trenches, a diffused or implanted body 573 (specifically body regions 573A through 573D) of opposite conductivity type to the epitaxial layer 572 has a depth slightly shallower than the bottom extent of the embedded polysilicon gates 576. The body 573 may be formed using a chain implant of varying energy and dose ion implantations to create arbitrary dopant profiles (including box and Gaussian shaped profiles) with little or no dopant redistribution via thermal diffusion after implantations. These as-implanted profiles are consistent with low thermal budget and low-temperature processes.

A number of active transistor cells or stripes are formed in the silicon mesas between the trenches. In FIG. 8, each active cell includes a body region 573A, 573B, or 573D and a source region 574A, 574B, or 574C. Contact to the body regions 573A to 573D is made in the third dimension, i.e., in the z-direction and is not shown in the cross-section of FIG. 8.

Note that in FIG. 8, the active cell source regions 574A, 574B, and 574C are labeled as N+ and the epitaxial layer 572 as Nepi to indicate N-type doping, and the body 573 is labeled $P_B$ to indicate P-type doping of the body. The doping polarities can be reversed to form a P-channel device.

In the mesa containing body region 573C, a deeper junction and/or more heavily doped region 578 including dopant of the same conductivity type as the body region 573C is formed to act as a localized zener diode clamp. The zener diode formed at the junction between region 578 and epitaxial layer 572 is designed to avalanche at a lower voltage than is the junction between the body 573 and epitaxial layer 572, and therefore the zener diode formed by region 578 clamps the source-to-drain voltage of device 570. To achieve clamping at a voltage lower than the FPI breakdown of the trench gated body junction, the zener implanted region 578 (labeled here as PZ) should have a depth greater than the bottom of the embedded polysilicon gate 576, but to avoid degrading the breakdown, the junction should be shallower than the bottom of the trench. So the zener implanted region 578 should be deeper than the polysilicon gate 576 but shallower than the trench, a method only possible in the presence of thick bottom oxide 577A, 577B, and 577C. The combination of a shallow voltage clamp and the thick bottom oxide together therefore yields a non-obvious benefit that neither element can achieve by itself.

To complete the device 570, each trench is covered with a top oxide 580A, 580B, 580C to prevent the embedded gate 576 from shorting to the thick aluminum-copper-silicon source metallization 582. A TiN or silicide barrier layer 581 is used to facilitate contact between metal 582 and source regions 574A, 574B, and 574C and body-contact regions 575 (all of which may not shown in the cross-section of FIG. 8 but may vary or alternate in the z-direction).

Figure 9B:
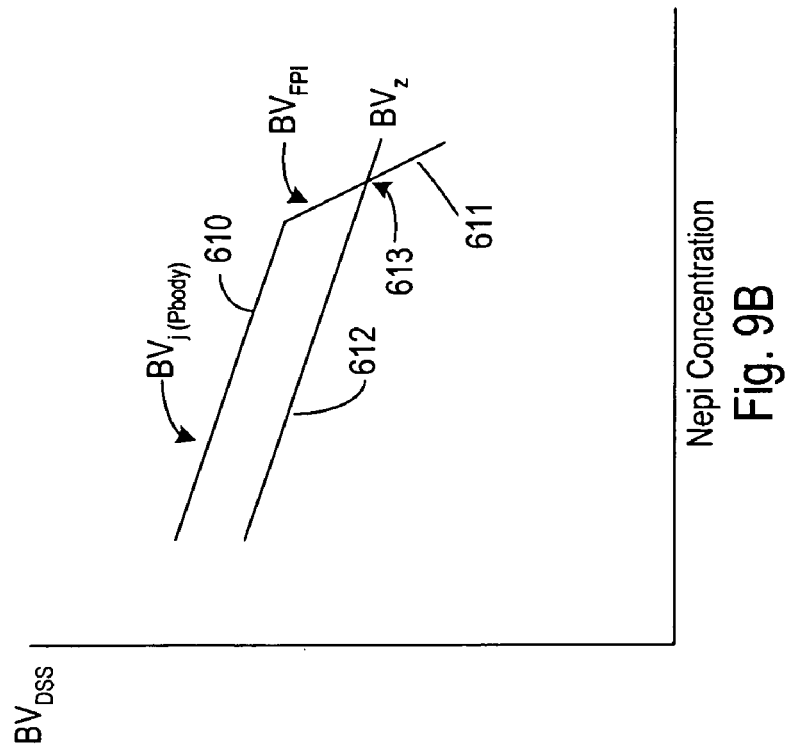
FIG. 9B is a plot of breakdown voltage vs. epitaxial dopant concentration for the zener diode and the body diode of FIG. 9A.
Figure 9A:
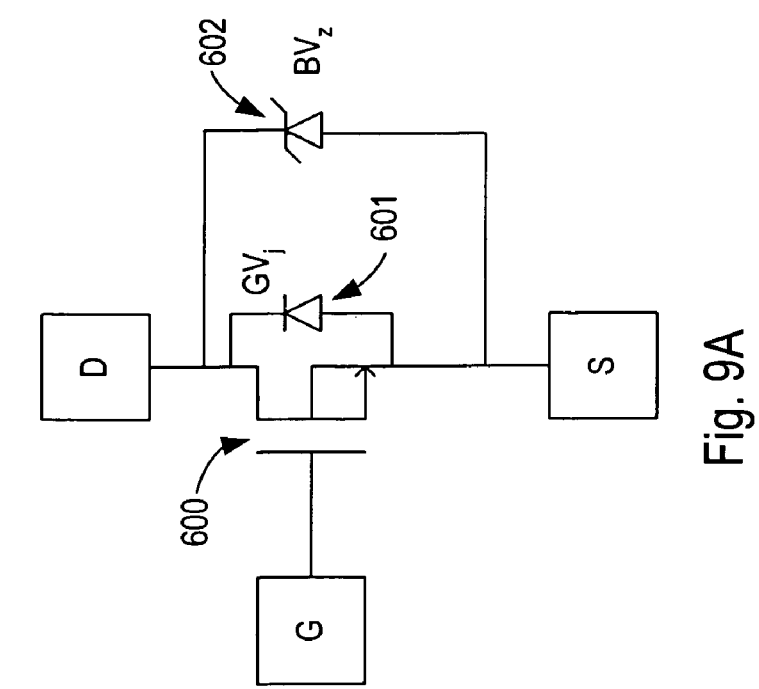
FIG. 9A is an equivalent schematic of the device of FIG. 8, illustrating a field-plate free drain diode and a zener clamp.

The equivalent schematic of the device 570 of FIG. 8 is shown in FIG. 9A. In FIG. 9A, a MOSFET 600 has an intrinsic body to drain diode 601 and a zener diode clamp 602. The body to drain diode 601 has a breakdown BVj that has little or no FPI degradation (since the gate 576 overlaps only slightly beyond the junction between body 573 and epitaxial layer 572 in FIG. 8). The breakdown BVz of zener diode 602 is programmed by a dedicated implant and diffusion or a chain implanted epitaxial layer and need only be slightly below that of the body-to-epitaxial junction because the thick bottom oxide shields the gate oxide from hot carrier damage.

This principle is illustrated by FIG. 9B in a plot of $BV_{DSS}$ vs. the dopant concentration Nepi. The body-to-epitaxial junction exhibits two breakdown mechanisms, one junction avalanche of magnitude $BVj_{(Pbody)}$ as shown by line segment 610; the other FPI avalanche $BV_{FPI}$ shown by line segment 611 which occurs only at very high epitaxial concentrations, when the gate oxide is extremely thin, and statistical process variations drives the trench gate well past the body junction (i.e., over-etched). Under nominal conditions of the epitaxial doping, gate oxide thickness, and trench depths, the FPI mechanism for a TBOX fabricated device may not occur at all. In any event, when compared to standard trench gated MOSFETs, the onset of FPI breakdown occurs at a significantly higher voltage using a TBOX filled trench gate. The voltage improvement may be as much as ten volts in some cases.

FIG. 9B also illustrates that the zener diode clamp design has a breakdown value $BV_Z$ given by line 612, which for most conditions is lower than the body junction's breakdown $BVj_{(Pbody)}$. Having an implanted zener anode that is deeper and/or has higher dopant concentration than the body region, it's the zener diode clamp has a breakdown voltage that is intrinsically lower than the body junction breakdown voltage for virtually any epitaxial concentration up to the point labeled 613 (where FPI effects eventually degrade than body junction's breakdown to a lower value). Since the onset of FPI breakdown occurs at a much higher voltage (if at all), and since $BV_Z$ is intrinsically lower than $BVj_{(Pbody)}$, tracking each other with epitaxial concentration, then the voltage guard band between the breakdown voltages can be minimal, even a couple of volts.

So unlike some prior trench-gated MOSFETS, where a large voltage-over-design was employed to guarantee clamping at voltages low enough that FPI breakdown never was reached, the new device's zener-clamped TBOX trench-gate MOSFET naturally maintains this condition. By virtually eliminating the FPI condition using its TBOX gate, both zener and body junction breakdown-voltages track one another for virtually any epitaxial concentration, allowing use of higher epitaxial concentrations and lower voltage-guard-bands. A trench-gated MOSFET formed in accordance with one aspect of this invention therefore exhibits a lower on-resistance than prior trench-gated MOSFETs while avoiding performance and reliability degradation resulting from field-plate-induced breakdown that is problematic in thin-gate devices.

The magnitude of on-resistance improvement gained occurs in proportion the higher epitaxial doping for any voltage device. While the principle can be applied for any voltage device, the impact of voltage-overdesign is more of an issue in lower-voltage devices (where every volt counts in a highly competitive market). In devices below 50V, the improvement using the new design and process is roughly linear with respect to voltage. For example if a thin gate 30V device made in accordance with this invention is designed to nominally breakdown at 33V (and still avoids FPI breakdown). In contrast, preventing FPI breakdown in some prior devices requires a significantly lighter epitaxial doping, roughly targeted for 43V. Comparing a 33V epitaxial layer to a 43V epitaxial layer, the on-resistance benefit will be roughly 33/44 or roughly a 25% lower. Since both devices in this comparison are clamped at 33V for reliability reasons, the prior device can only be sold as a 30V rated MOSFET despite its lightly doped epitaxial layer and proportionately higher on-resistance.

Figure 9C:
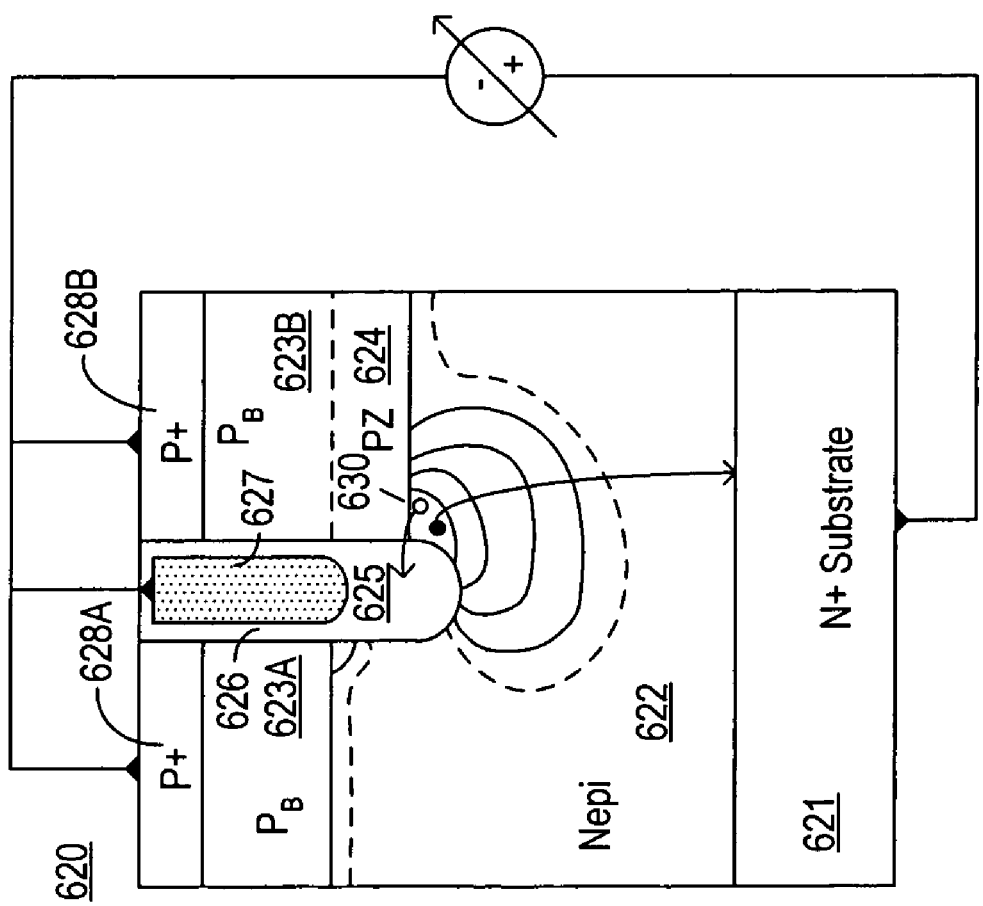
FIG. 9C shows a cross-section of a device illustrating a zener clamp forcing an avalanche adjacent to a TBOX region.

FIG. 9C illustrates biasing and operation a voltage-clamped TBOX-trench-gate MOSFET made in accordance with this design, shown in a cross-section where the source regions are not present. Device 620 includes an epitaxial layer 622 grown atop heavily doped substrate 621 (both N-type in the example shown). A trench in epitaxial layer 622 contains a polysilicon gate electrode 627, a thin gate oxide sidewalls 626 and a thick bottom oxide (TBOX) region 625. The two mesa regions adjacent to the trench contain ($P_B$) P-type body 623A, 623B and highly-doped P+ contact regions 628A, 628B respectively; and one of the mesa regions also contains a $P_Z$ zener-diode anode-region 624, heavier in concentration than body regions 623A, 623B and having a depth at least as deep as the body regions 623A, 623B and preferably shallower than the bottom of the trench and the deepest portion of TBOX oxide 625.

As shown in FIG. 9C, an external voltage supply biasing device 620 into its offs state generates electric fields that are strongest along the junction of $P_Z$ region 624 and N-type epitaxial layer 622, especially near the trench gate. Any impact ionization at point 630 will inject hot carriers, if at all, into thick oxide 625 far away from thin sidewall gate oxide 626. The ionization rate of the body 623A to epitaxial layer 622 PN-junction adjacent to thin sidewall gate 626 can be shown to be orders of magnitude lower and therefore protected by the voltage-clamped TBOX-gate structure formed in accordance with this embodiment of the invention.

So a preferred embodiment of the invention is a trench gated MOSFET with a thick bottom oxide trench gate and a zener-clamping-implant (or PZ region) being deeper than the body but shallower than the bottom of the trench, designed so that the breakdown of the zener diode clamp remains lower than that of the body junction for any given gate oxide thickness.

Referring once again to FIG. 8, note that the N+ source regions 574A, 574B, 574C are present only in mesa regions containing the body regions 573A, 573B, 573D but not in body region 573C where the $P_Z$ zener anode 578 is integrated. Instead only a P+ contact implant 575 is formed in body region 575. Accordingly, it follows (as another preferred embodiment of this invention) that the P-type zener implant region 578 should be formed only in mesa regions (or local portions of a stripe mesa region) contacted by P+ body contact regions 575 with no source (N+) implant 574 present locally. By avoiding the combination of N+ source 574 and PZ region 578 in the same mesa or vicinity, the zener-clamp regions 578 of the device 570 (where avalanche is forced to occur) do not risk the aforementioned problem of double-injection, parasitic NPN transistor turn-on, and snap-back breakdown since no N+ region is present to act as an emitter of a parasitic bipolar NPN transistor.

Figure 10B:
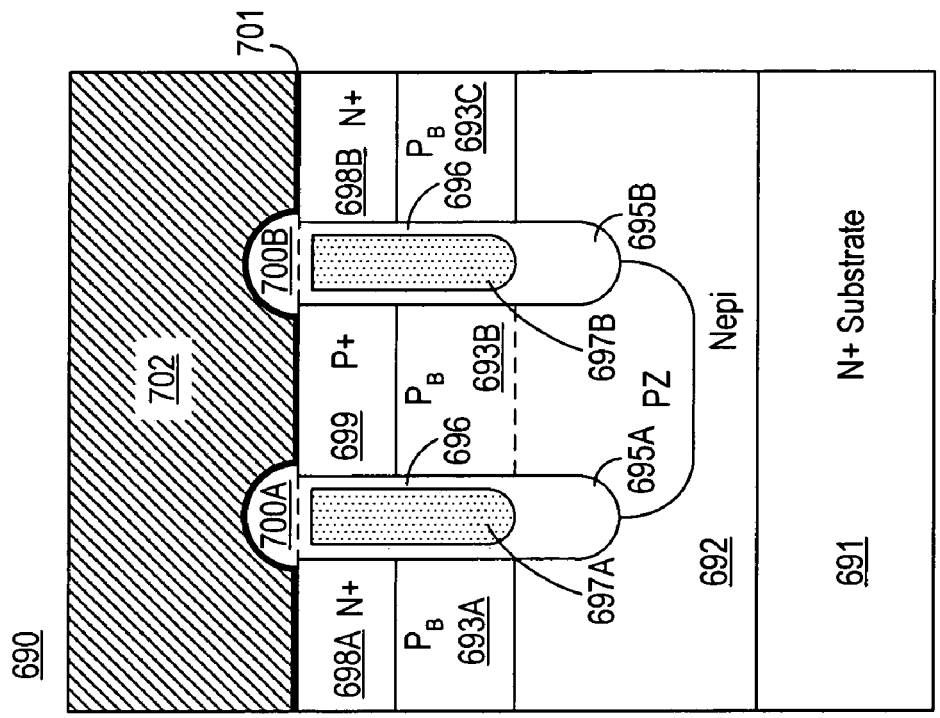
FIG. 10B shows a cross-section of a TBOX trench gate MOSFET having a deep zener clamp.
Figure 10A:
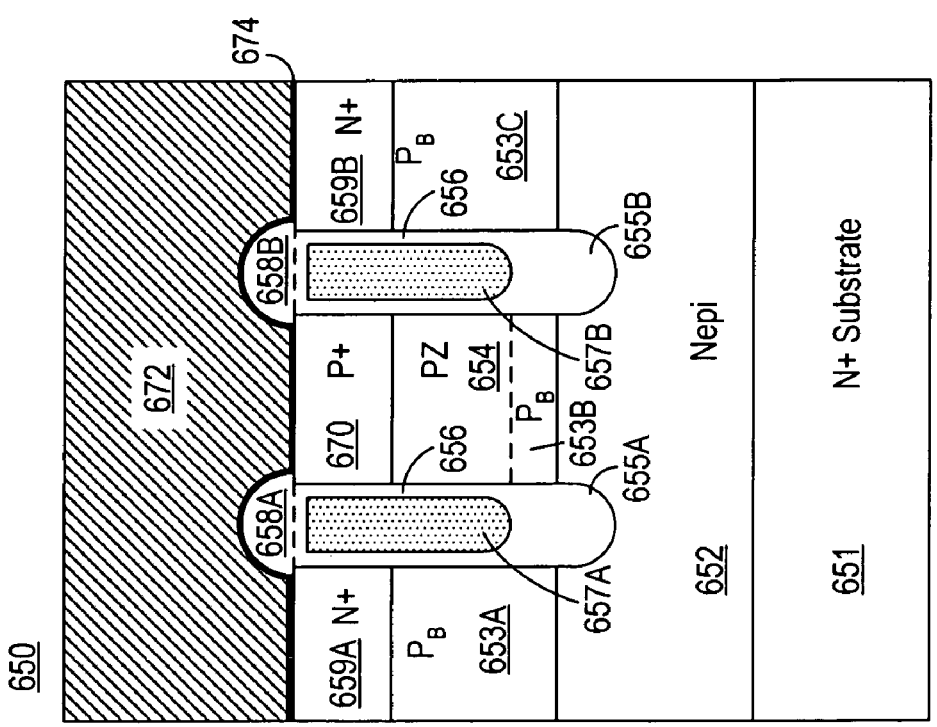
FIG. 10A shows a cross-section of a TBOX trench gate MOSFET in accordance with an embodiment of the invention having a shallow zener clamp.

FIG. 10A and FIG. 10B illustrate two variants 650 and 690 of a voltage clamped TBOX trench gated MOSFET design for different PZ conditions. In FIG. 10A, the PZ zener region 654 is slightly shallower than body 653B. To guarantee breakdown occurs due to the zener implant 654, the dopant concentration of zener region 654 must be higher than the dopant concentration of body 653B region, by at least 40% or no clamping benefit is gained. Such a structure remains sensitive to some hot-carrier injection in a thin gate 656 adjacent to PZ zener region 654, but since the zener implant region 654 is formed only where P+ contact regions 670 are present, hot carrier damage does not affect the active cells or the MOSFET's characteristics. Likewise in the absence of an N+ region 659A or 659B above the PZ zener region 654, no double injection or snapback can occur in the avalanching region.

In FIG. 10B, the zener region 694 of device 690 is implanted (or diffused) deeper than the bottom of the thick bottom oxide 695A, 695B. This design is less favorable in on-resistance than the preferred embodiment of FIG. 8 since the deeper zener region 694 reduces the breakdown voltage of the device 690 without lowering on-resistance. The reduction in breakdown voltage of the device 690 is due to reach-through (PIN) breakdown between the bottom of PZ zener region 694 and the top of N+ substrate 691 (where epitaxial layer 692 becomes completely depleted during the off state).

Figure 1B:
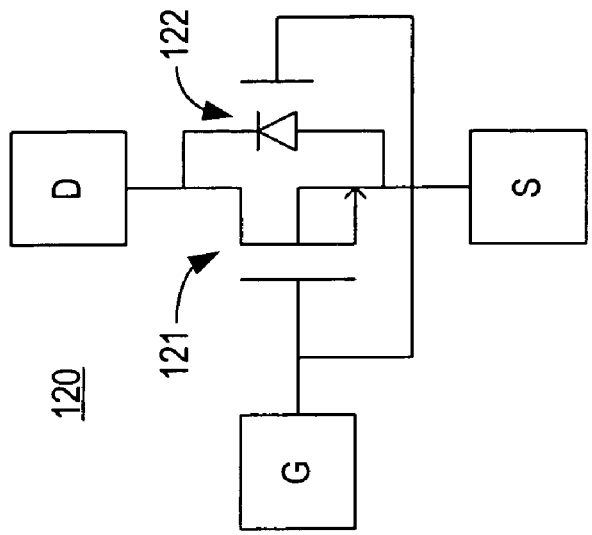
FIG. 1B is an equivalent schematic diagram of the device of FIG. 1A.
Figure 1A:
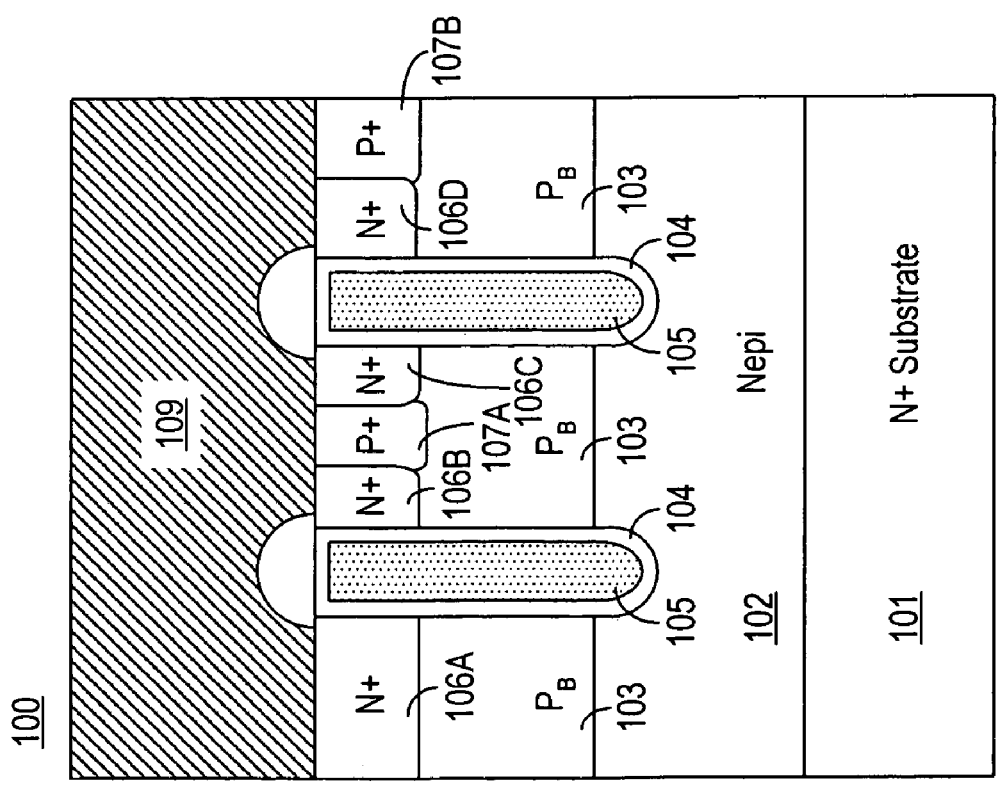
FIG. 1A is a cross-sectional view of a conventional "Flat Bottom" trench-gated power MOSFET with uniform gate oxide.
Figure 1E:
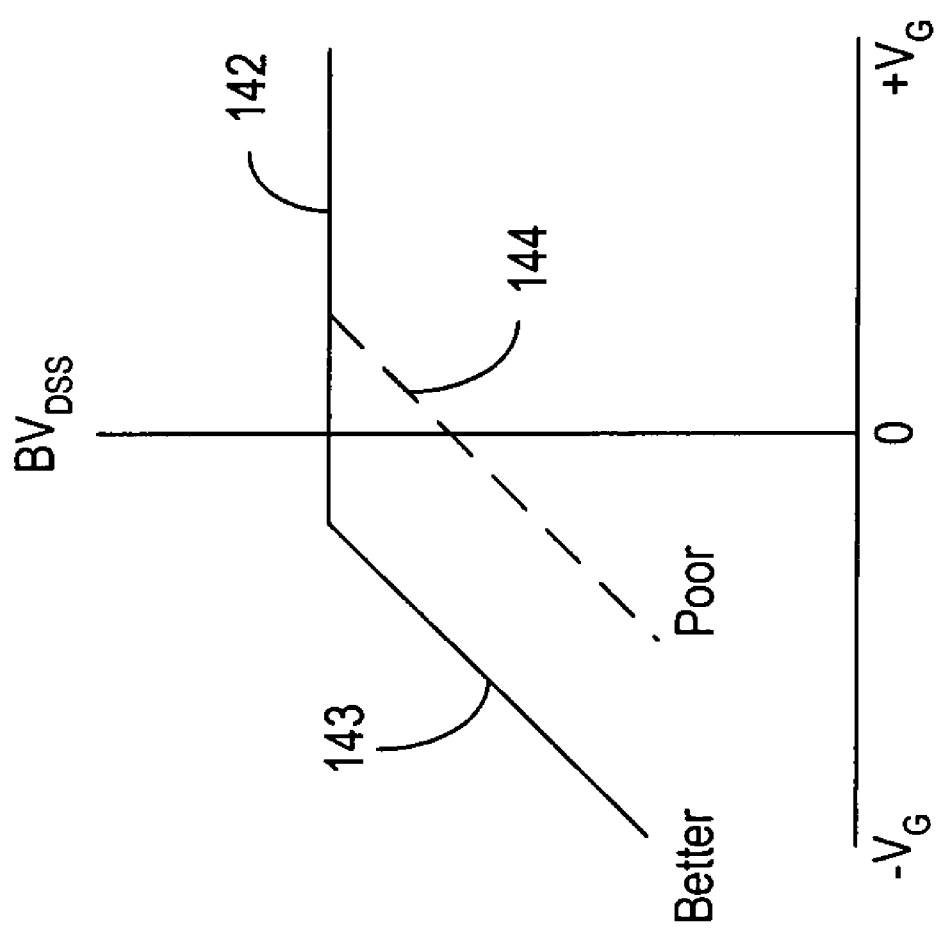
FIG. 1E is a plot of trench-gated junction breakdown vs. gate bias for the device of FIG. 1A.
Figure 2A:
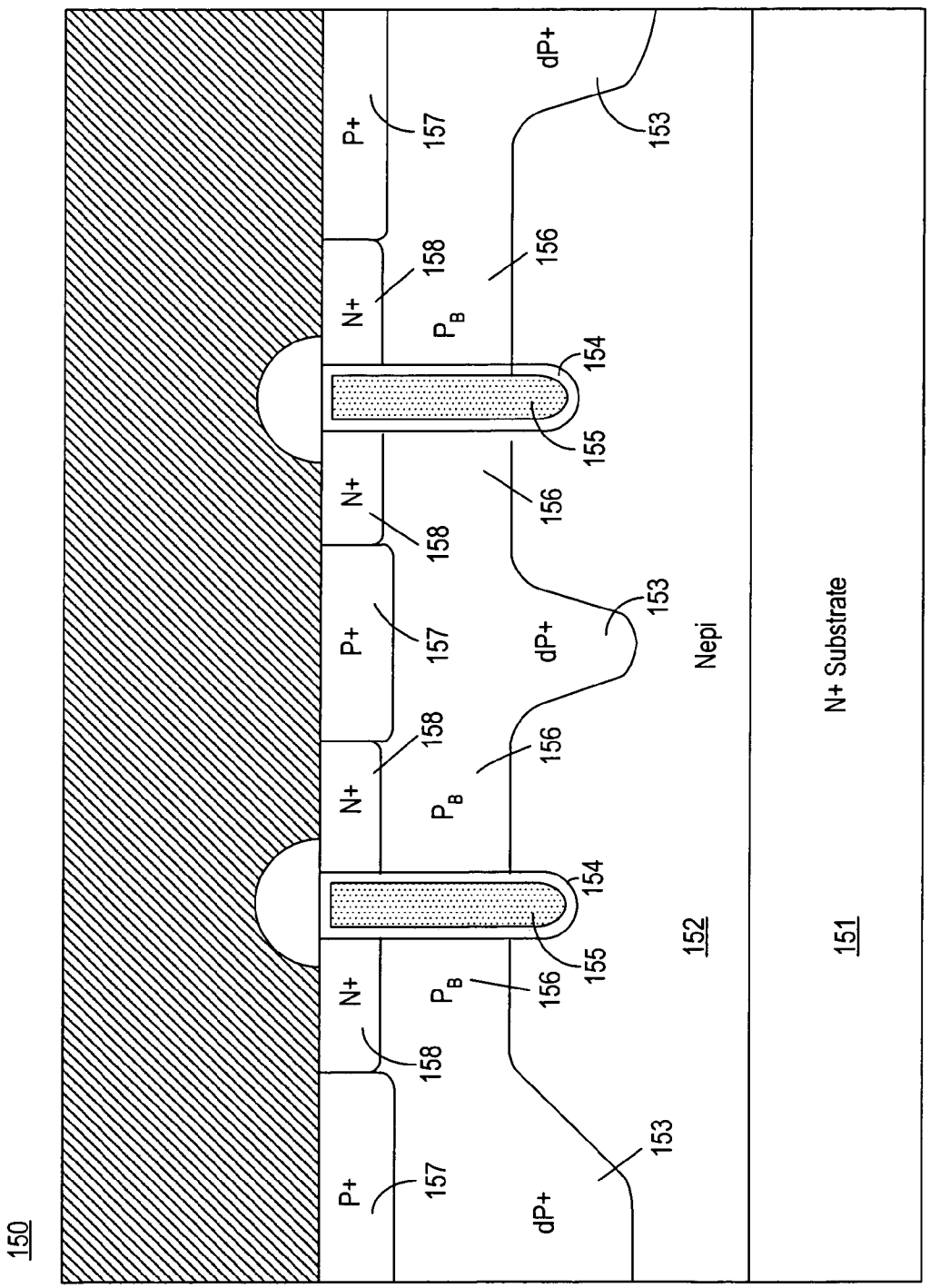
FIG. 2A is a cross-sectional view of a known deep-body-shielded trench gated power MOSFET with uniform gate oxide.
Figure 2C:
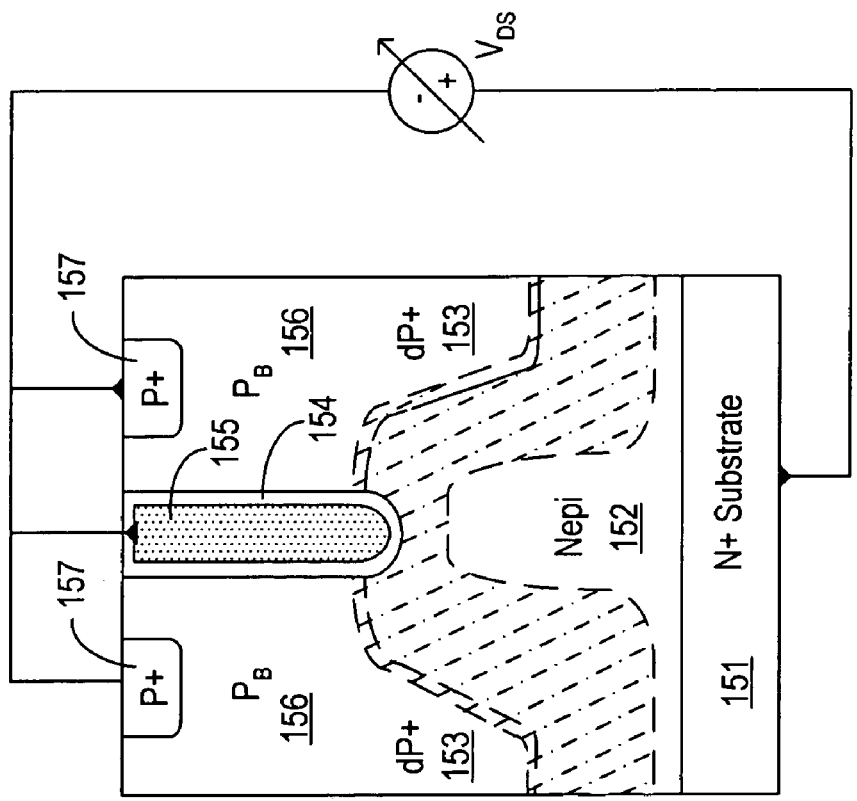
FIG. 2C shows a cross-section of the device of FIG. 2A illustrating shielding effect of depletion spreading
Figure 2B:
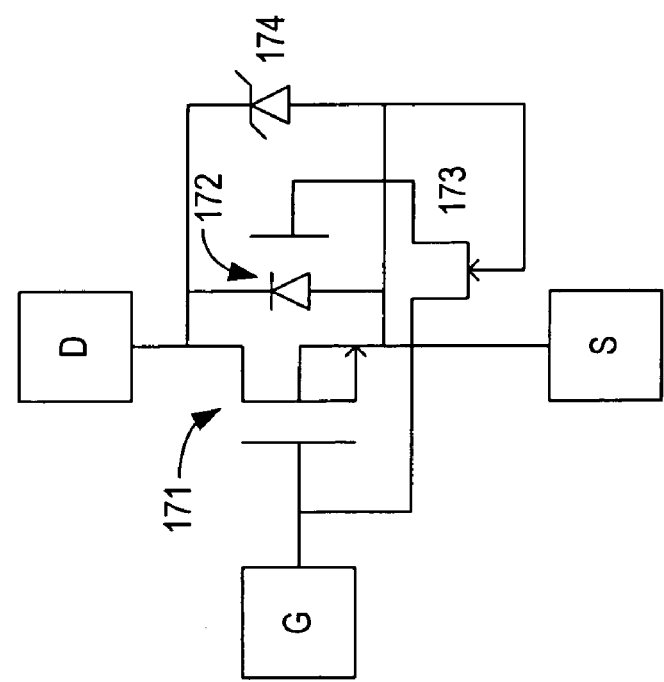
FIG. 2B is a schematic of the device of FIG. 2A showing a JFET shielding of a gated diode.
Figure 2F:
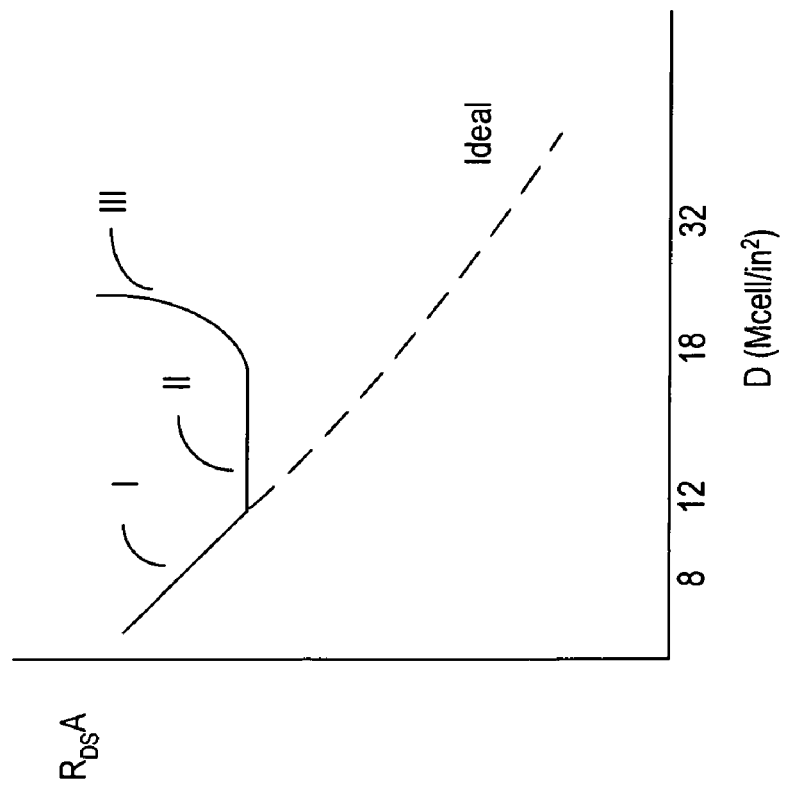
FIG. 2F is a plot illustrating on-resistance as a function of cell density across three operating regions of the device of FIG. 2A.
Figure 2G:
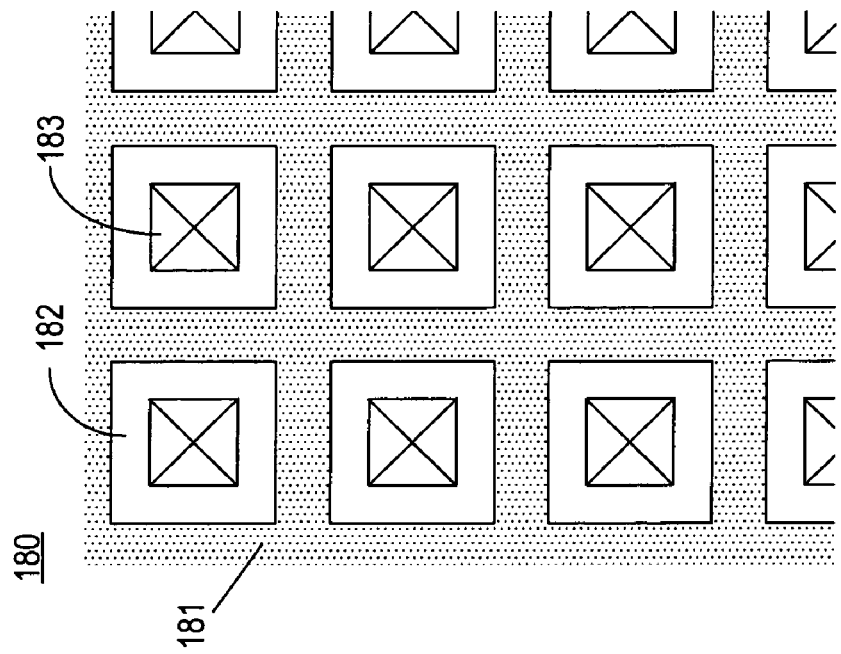
FIG. 2G is a plan view of a trench-gated MOSFET having clamping diodes in every cell.
Figure 3A:
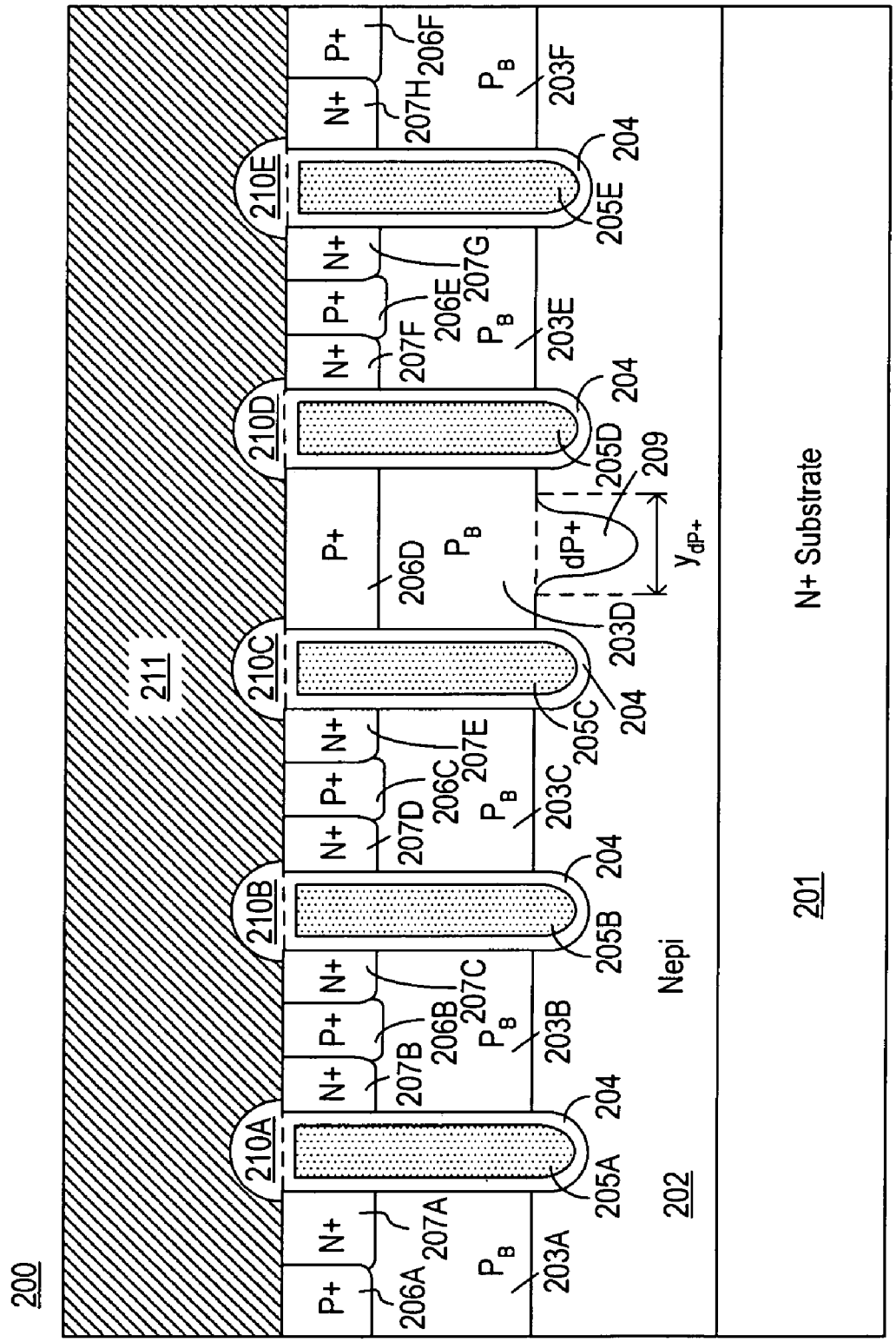
FIG. 3A is a cross-sectional view of a known 1-of-n zener clamped trench-gated power MOSFET with uniform gate oxide.
Figure 3C:
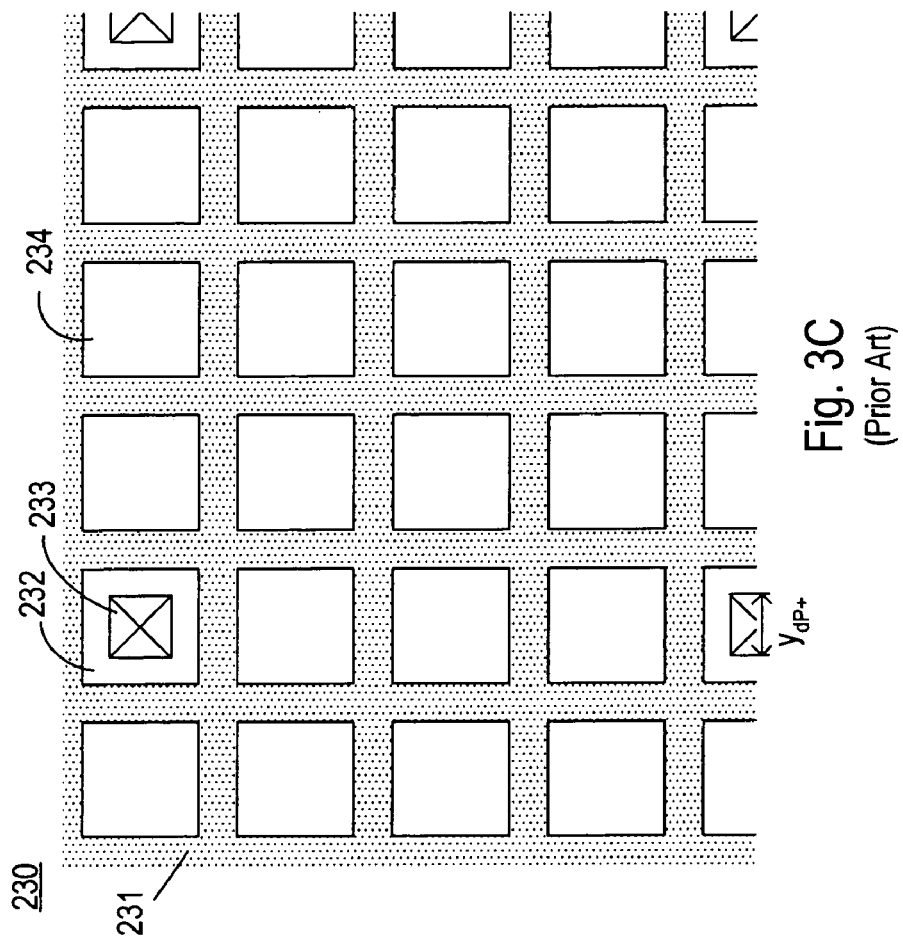
FIG. 3C is a plan view of a "1-of-16" zener-clamped trench gated MOSFET.
Figure 3B:
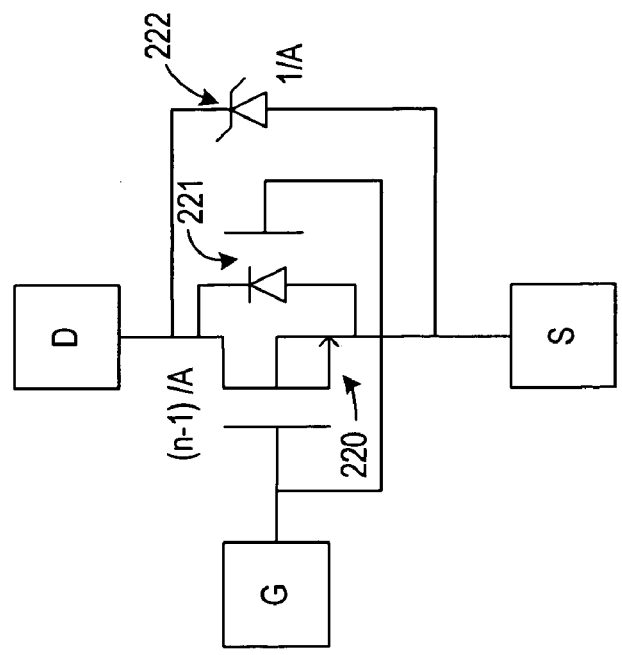
FIG. 3B is an effective schematic of the device of FIG. 3A showing zener clamping of a gated diode.
Figure 3E:
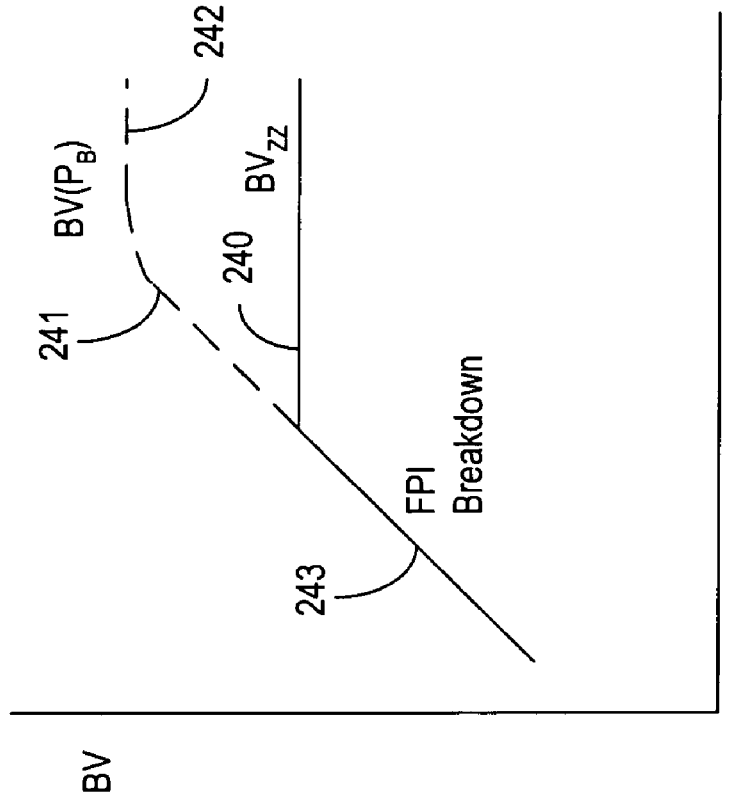
FIG. 3E is a plot of trench-gated junction breakdown vs. oxide thickness for the device of FIG. 3A.
Figure 3D:
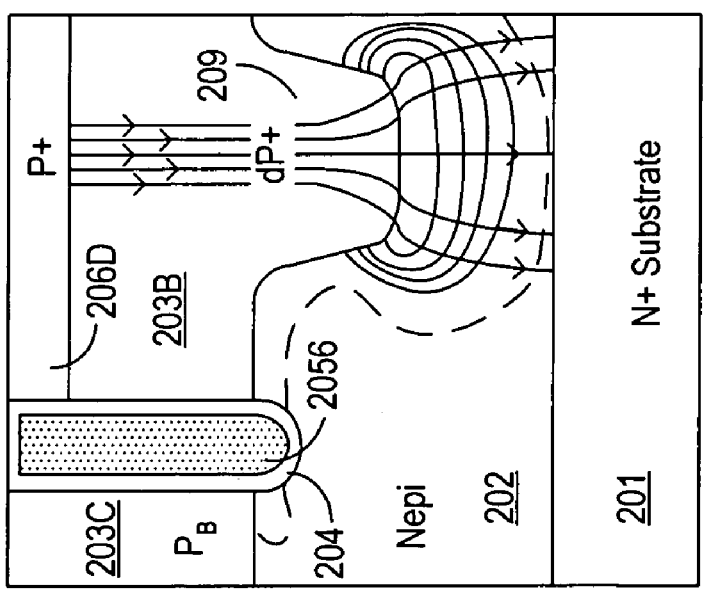
FIG. 3D is a cross-section of the device of FIG. 3A illustrating avalanche current flow lines through the zener clamp cell.
Figure 3F:
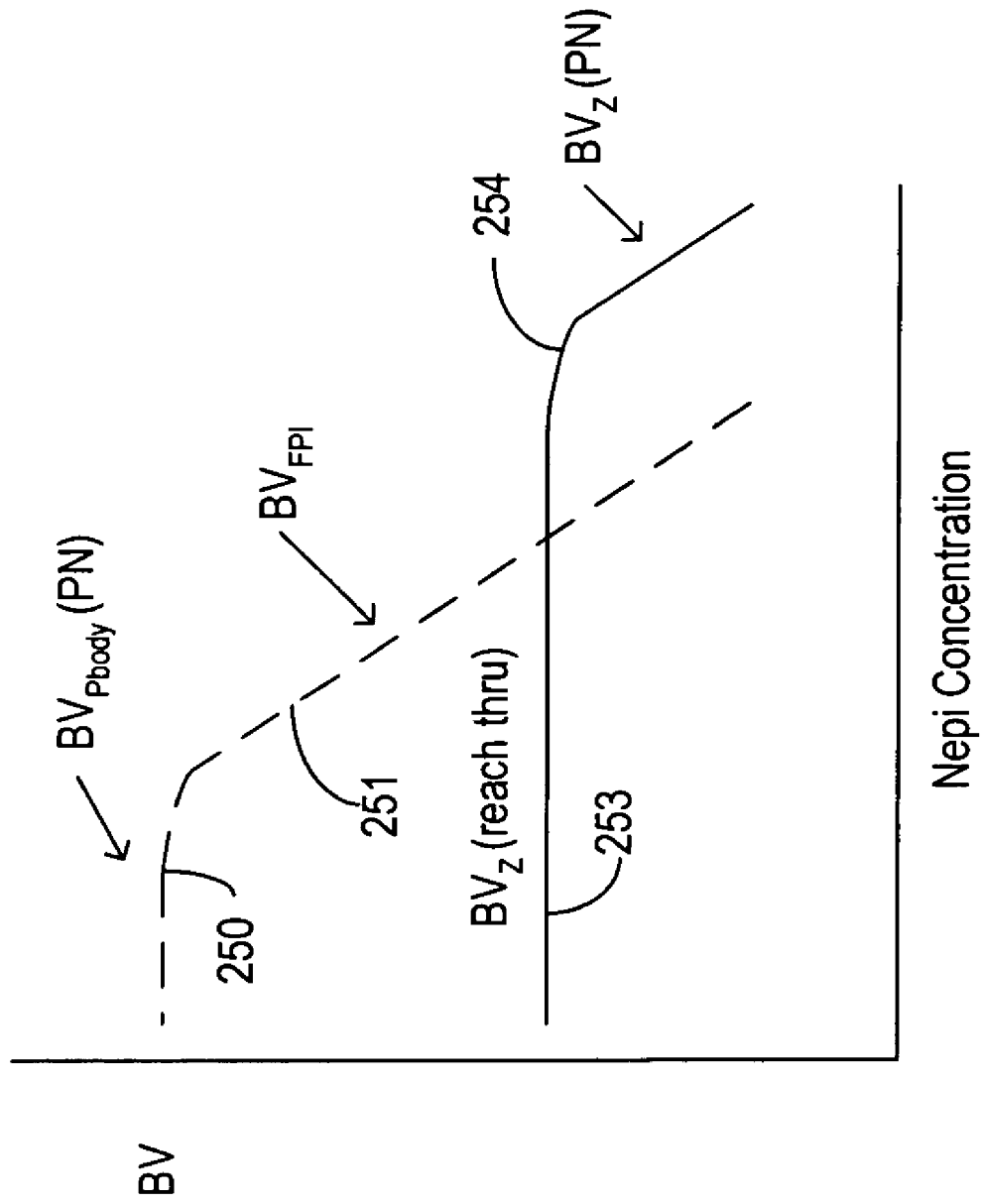
FIG. 3F is a plot of trench-gated junction breakdown vs. epitaxial dopant concentration in the device of FIG. 3A.
Figure 4A:
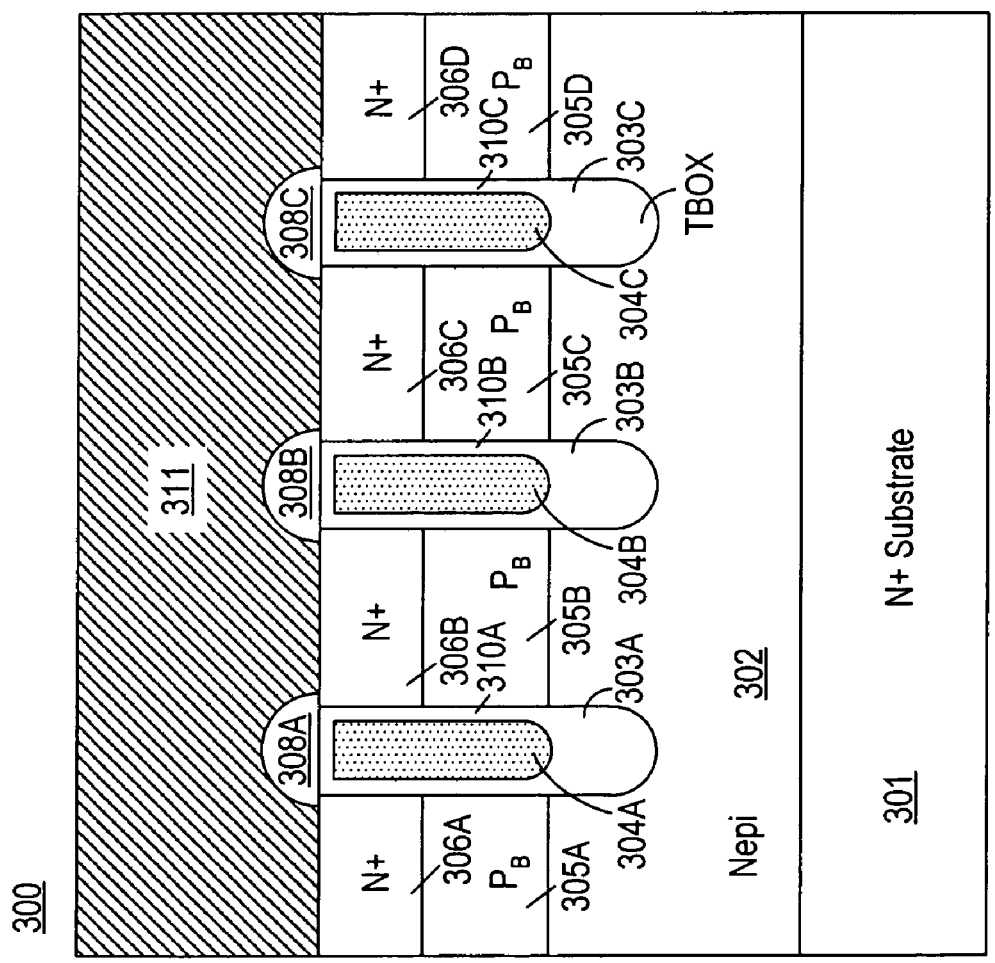
FIG. 4A shows a cross-section of a known unclamped trench-gated MOSFET with thick bottom oxide.
Figure 4C:
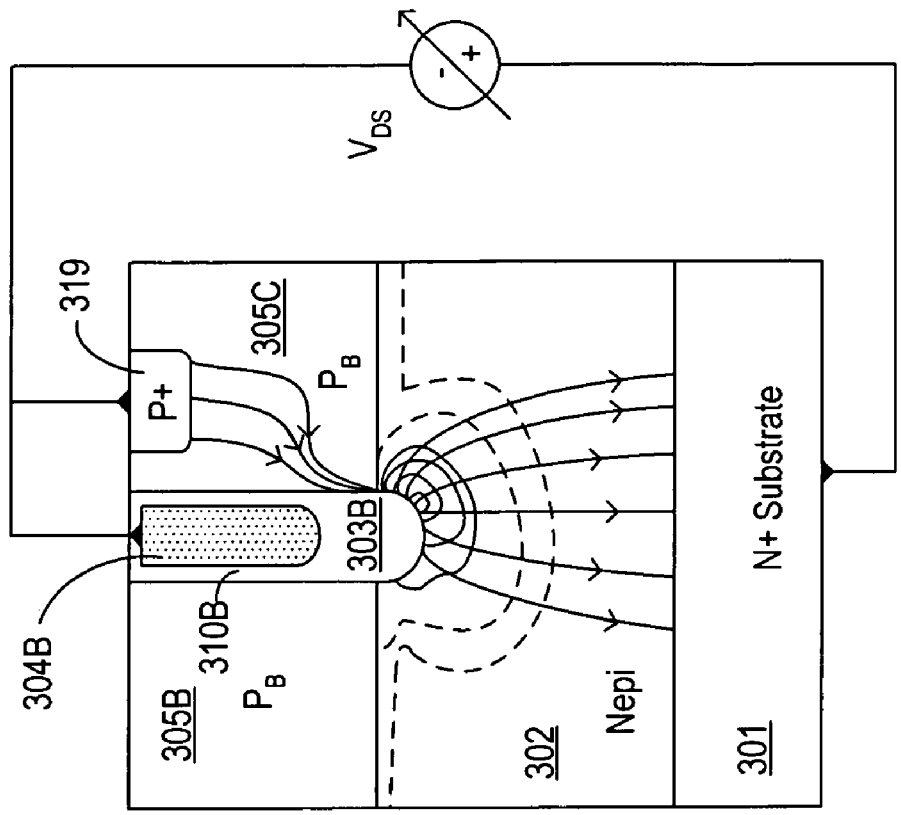
FIG. 4C shows a cross-section of a device illustrating avalanche current flow lines.
Figure 4B:
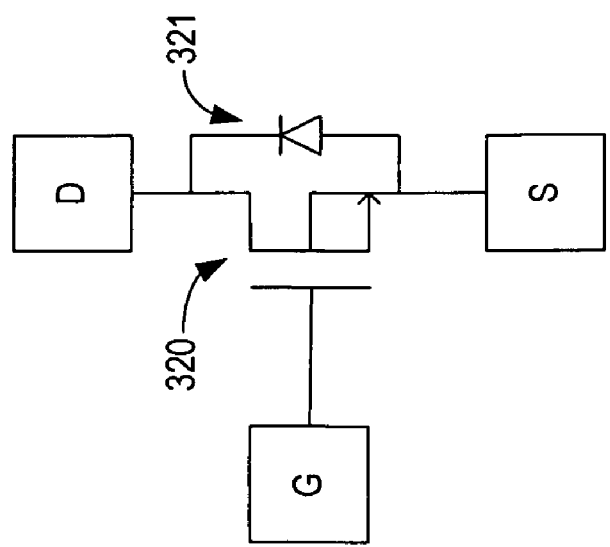
FIG. 4B is an equivalent schematic of the device of FIG. 4A, revealing the lack of a gate diode.
Figure 5B:
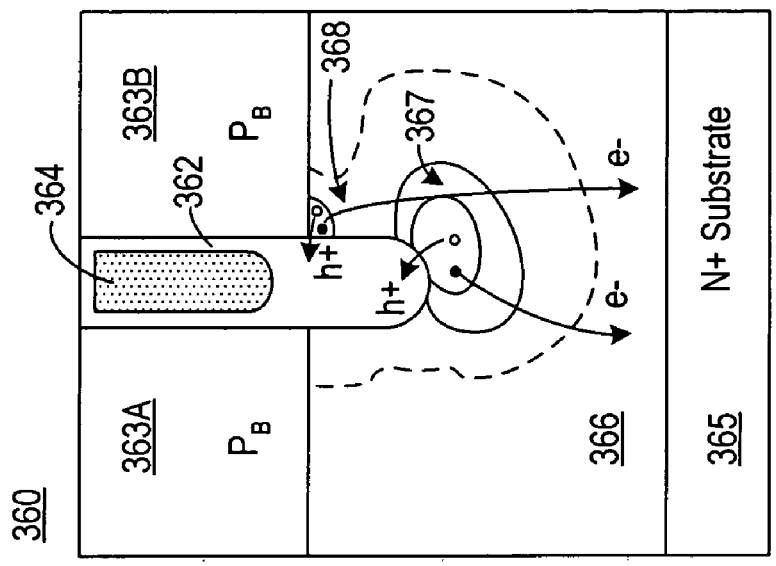
FIG. 5B shows a device cross-section illustrating how impact ionization in a TBOX trench gate device injects hot carriers into thick oxide with little injected into the thin gate oxide.
Figure 5A:
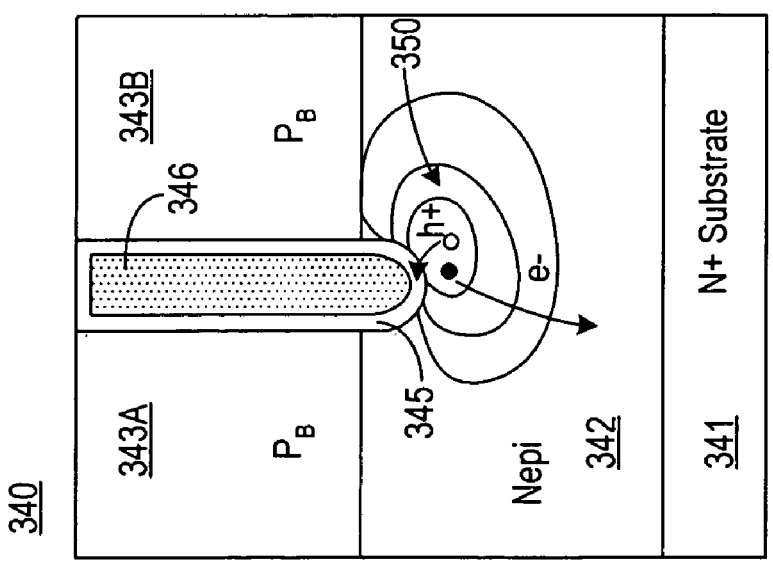
FIG. 5A shows a device cross-section illustrating how impact ionization in a uniform gate oxide trench device injects hot carriers into and through a thin gate oxide.
Figure 6B:
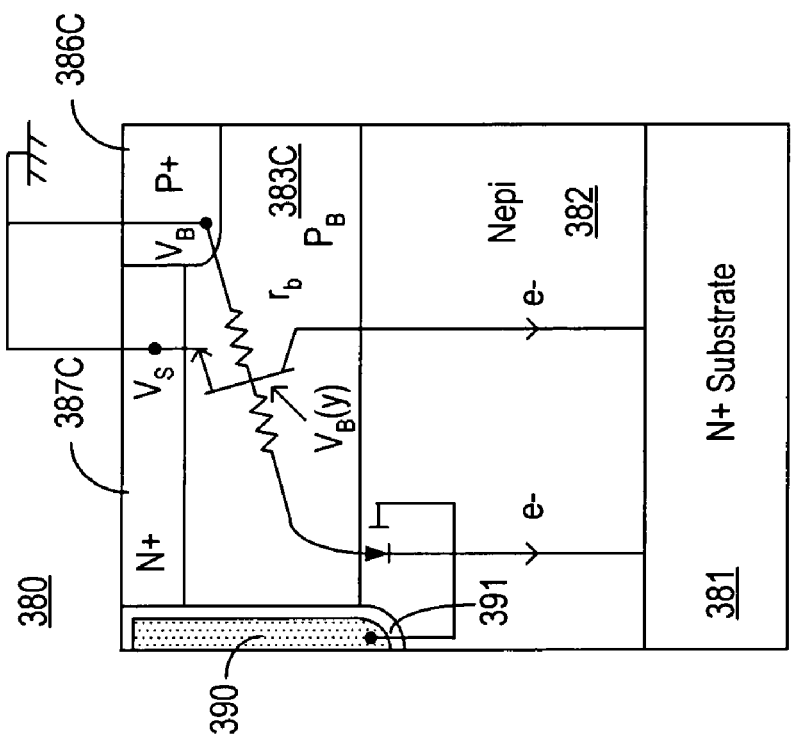
FIG. 6B shows an equivalent circuit of a parasitic bipolar transistor superimposed on a device cross-section for illustration of the double injection mechanism.
Figure 6A:
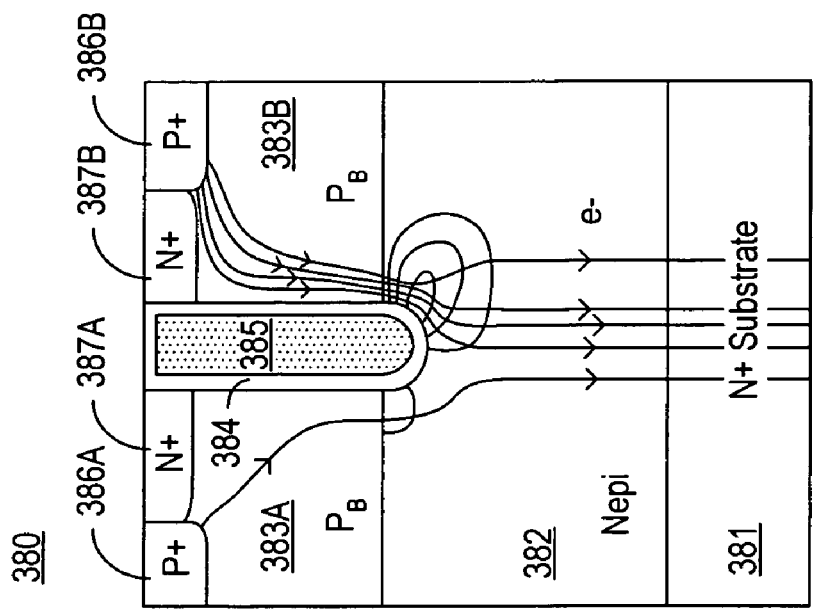
FIG. 6A shows a cross-section illustrating current flow lines in an unclamped vertical trench-gated MOSFET with thick bottom oxide.
Figure 6D:
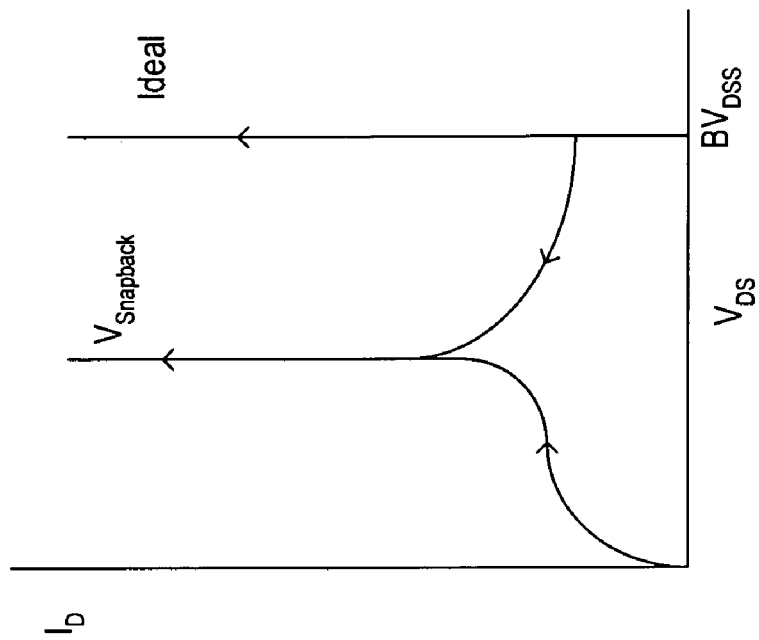
FIG. 6D shows the current-voltage characteristic of a parasitic bipolar induced snapback breakdown.
Figure 6C:
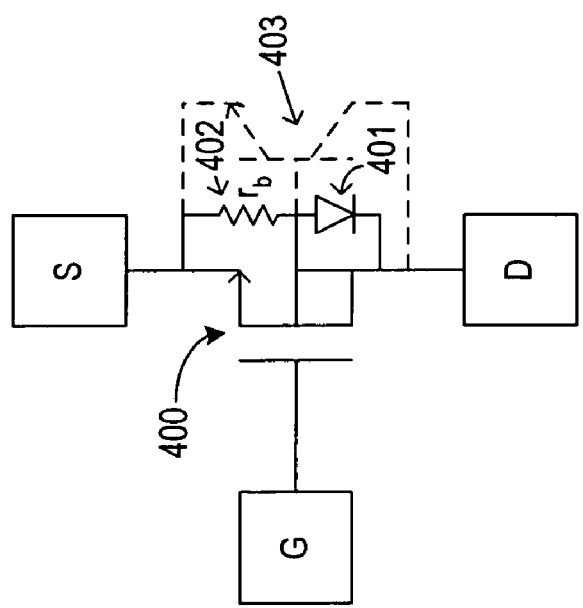
FIG. 6C is an equivalent circuit diagram of a trench MOSFET with an integral parasitic bipolar transistor, a drain diode, and a resistive emitter to base short.
Figure 6F:
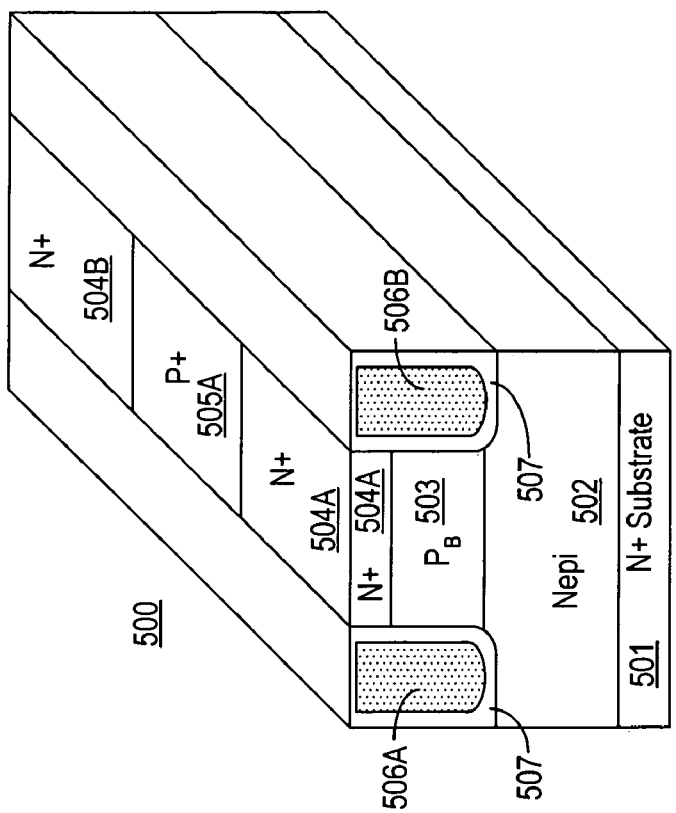
FIG. 6F a cutaway representation showing the stripe-geometry trench MOSFET with a bamboo source-body mesa contact design.
Figure 6E:
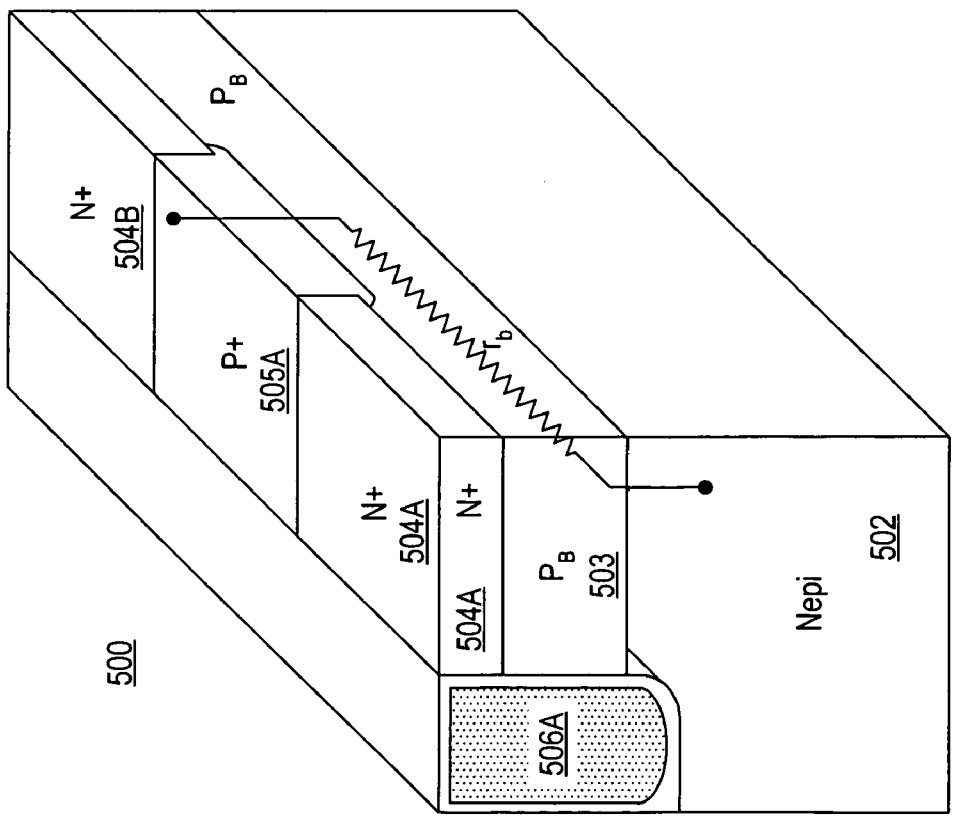
FIG. 6E is a cutaway representation of a trench MOSFET illustrating the origin of a parasitic bipolar base resistance.
Figure 7:
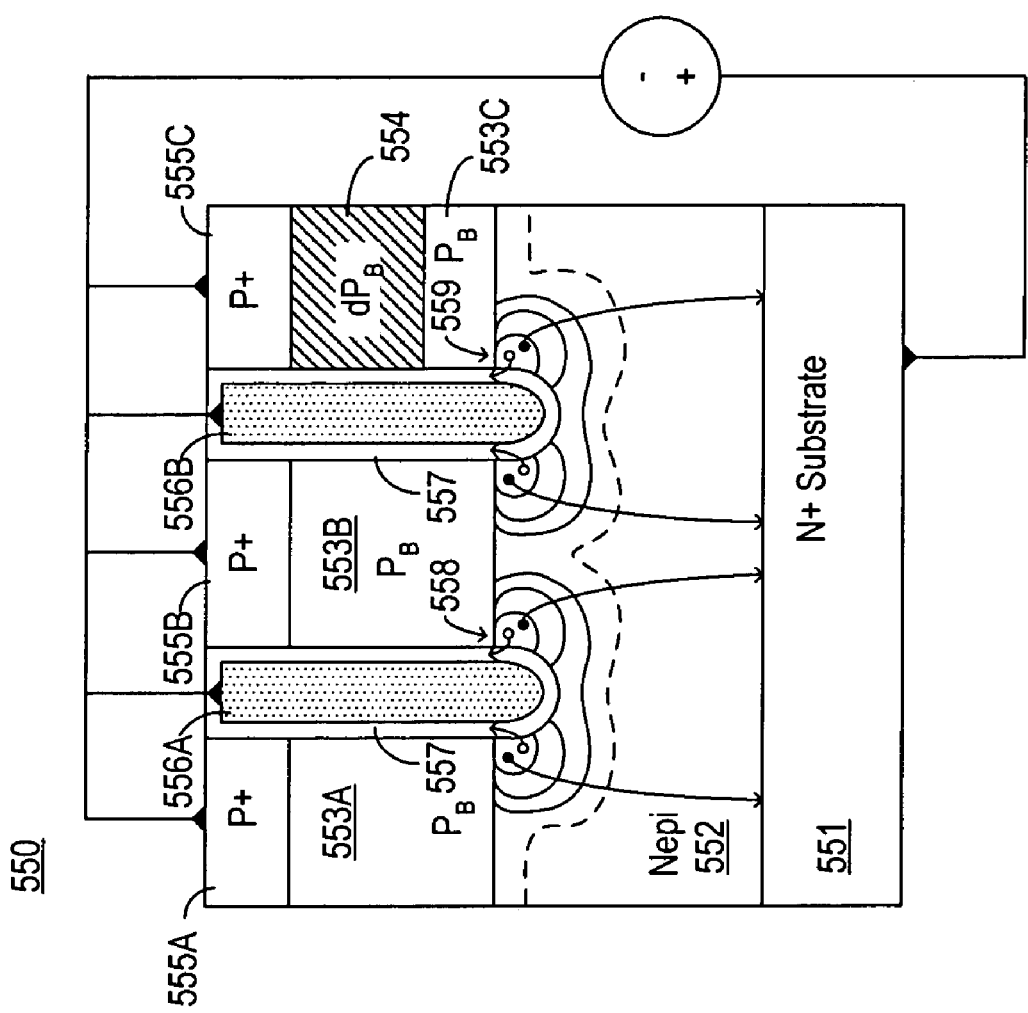
FIG. 7 shows a cross-section of a uniform gate oxide trench MOSFET illustrating how a shallow zener diode fails to prevent substantial impact ionization at a thin gate oxide.

While the structure of device 690 looks similar to device 200 of FIG. 3A, the operation of device 690 is substantially different. In the prior device 200, the thin gate oxide 204 causes a field-plate-induced enhancement of electric fields, ionization, and lowering of breakdown voltage. Only by lowering the breakdown of the zener clamp diode to a voltage below the lowest possible FPI breakdown (under all operating and process conditions), can FPI breakdown be avoided in device 200. Even so, some hot carrier generation still occurs in the proximity of the gate 205. The maximum voltage imposed on the device 200, i.e., its breakdown, also sets the ionization condition near the gate 205, which remains dependent on gate oxide thickness.

In the device 690 of FIG. 10B, the TBOX 695A, 695B virtually eliminates FPI generated currents near the gate 697A, 697B, even during avalanche. The FPI ionization phenomena and the zener clamping voltage are hence completely decoupled. In such a device, it is virtually impossible to force the device into any field-plate-induced failure mode since the zener will absorb most avalanche energy long before the region in the vicinity of the gate sees any electric fields at all. So while device 690 has a lower breakdown than device 670 of FIG. 8, device 690 does offer a very low resistance voltage clamp from its deeper PZ zener clamp 694. Also, the doping profile of the device 200 of FIG. 3A is necessarily Gaussian as an artifact of its fabrication process. For a reach-through clamping diode, a box-shaped doping profile yields a more reproducible breakdown than the highly variable graded-profile of a deeply-diffused junction. Using a low thermal budget process with no dopant redistribution, the as-implanted dopant profile of the PZ zener region 694 can be formed using chained implants to produce any shape junction. By shaping its concentration profile, the loss in breakdown voltage from the deepest portion of PZ zener region 694 can be minimized, especially by using lower implant doses for the deeper junctions, e.g., to form a stair-stepped box shaped profile with two different concentrations.

Figure 10C:
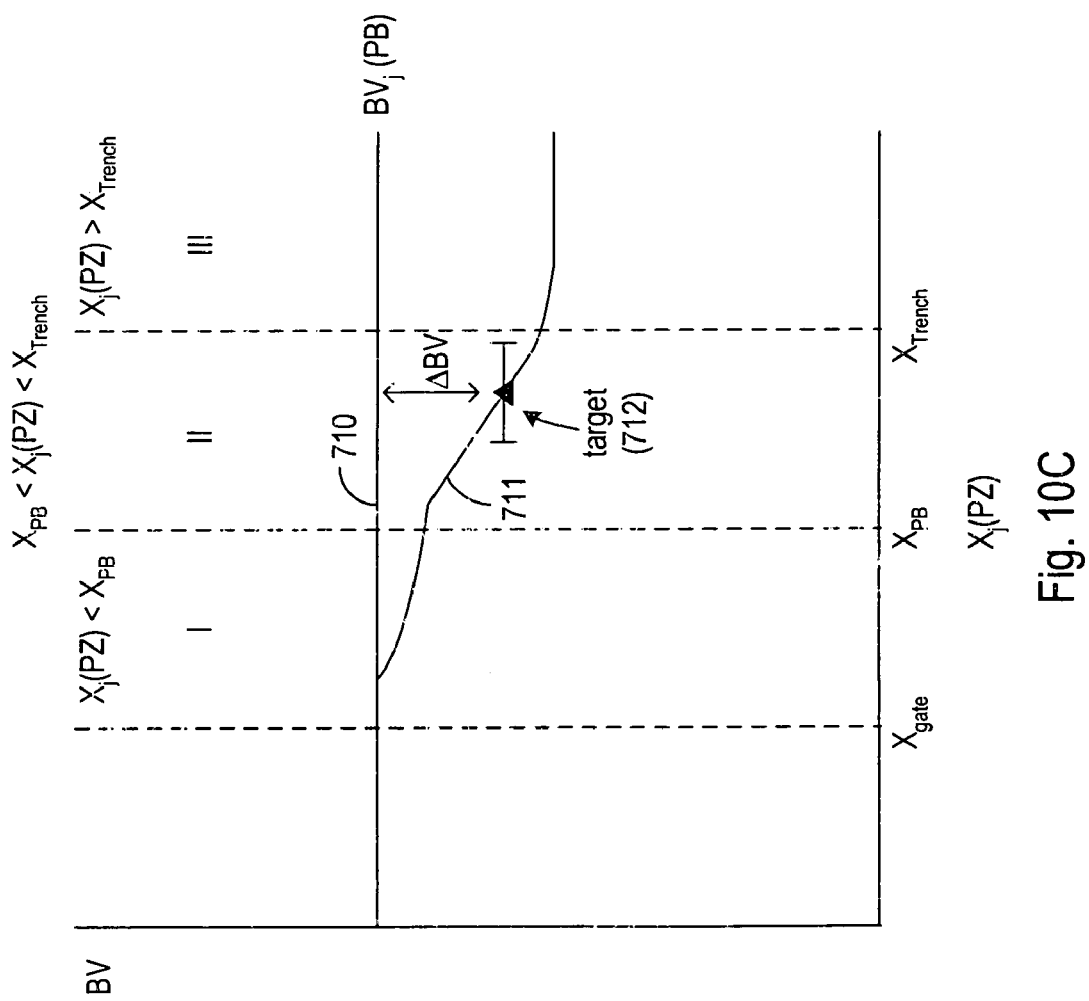
FIG. 10C is a graph of breakdown voltage vs. depth of PZ zener anode.

By varying the depth of the PZ zener region (as shown in the device cross-sections of FIG. 10A, FIG. 8, and FIG. 10B), the guard band in the breakdown-voltage clamping of TBOX trench-gated MOSFETs, i.e., the difference $\Delta BV$ in epi-to-body breakdown 710 and epi-to-zener breakdown voltages 711, may be parametrically varied. As illustrated in the graph of FIG. 10C., the relationship between $\Delta BV$ and device behavior may be divided into three cases depending on the relative depths of the body, trench, and zener regions.

In case I, which is represented by the device of FIG. 10A, the depth of the zener region 654 is shallower than that of the body 653 and the only reduction in breakdown voltage results from the lack of two-sided depletion spreading in the diode. So while the clamp acts to divert avalanche current away from other areas by its higher doping (and correspondingly lower series resistance), the magnitude of voltage clamping $\Delta BV$ is small.

In case II, a preferred embodiment of this invention (see FIG. 8 for a representative cross-section) has the zener junction 578 deeper than the body 573 but shallower than the trench and the bottom of the thick bottom oxide 577. Because of the combination of zener clamping and thick bottom oxide, in case II even a moderate-degree of voltage clamping $\Delta BV$ provides excellent protection to the MOSFET. As such, the zener junction 578 clamps the voltage and the TBOX 577 protects against FPI breakdown reduction, so that the body diode 573 maintains a breakdown voltage higher than the zener breakdown voltage, especially in the vicinity of the gate 576 (where body 573 and sidewall gate oxide 579 touch).

The junction avalanche breakdown mechanism in both case I and case II is that of a standard PN junction (in a 1-D approximation, the PN junction exhibits a triangular-shaped electric field peaking at the body-to-epitaxial junction) and depends primarily on the doping (of both the zener region and the epitaxial material) but is, not significantly influenced by epitaxial thickness over nominal manufacturing variations.

Case III, where the zener region is deeper than both the body junction and the bottom of the trench (as shown in device 690 of FIG. 10B), offers superior clamping but with a tradeoff against lower breakdown voltage and/or higher resistance. Because the deep zener clamp 694 acts as a low-impedance clamp during avalanche, virtually all avalanche-current is diverted away from the active cells 693A and 693B. It lower avalanche voltage means that the device 690 has a lower voltage rating for a given on-resistance, or that device 690 must be retargeted using a thicker and/or more lightly doped epitaxial layer, giving the device a higher on-resistance.

Not only is voltage difference $\Delta BV$ larger in case III conditions, but the physical avalanche mechanism of the zener diode differs as well (when compared to case I and case II). For an optimum epitaxial thickness (where the epitaxial layer is chosen to be as thin as possible and still meet a target breakdown voltage) the "net" epitaxial layer between the bottom of the zener region and the top of the N+ substrate in a case III device becomes fully-depleted (i.e., all free carriers in the epitaxial region are swept away by the applied electric field) prior to reaching avalanche. Such a diode is said to operate in "reach-through" breakdown reflecting the full depletion of the epitaxial layer reaching through to the substrate. Since the epitaxial layer is fully depleted, the concentration of the epitaxial layer has little influence on the device, and the epitaxial region behaves in the off-state like an electrically-induced intrinsic layer. The breakdown voltage of such a diode (referred to as a PIN diode), depends only on the thickness of the intrinsic net epitaxial layer (i.e., the "I" portion of the PIN diode), and not on the epitaxial layer doping. So in case III, the device exhibits a lower breakdown for a given on-resistance and a greater sensitivity to variation in epitaxial thickness Referring once again to FIG. 10C, the nominal design of a device should be chosen to tolerate expected variations in process conditions. The greatest variations in such a zener-clamped TBOX-trench-gate vertical MOSFET design are due to epitaxial and trench-etch fabrication steps, especially in regards to the relative depth of the bottom of the trench embedded polysilicon gate to the body and zener junction depth. Using a low-thermal-budget process, however, the reproducibility of the as-implanted zener region and body chain-implants is extremely consistent making the trench depth the number one variable to control.

In the preferred embodiment of this invention, target condition 712 is chosen nominally within case II so that the influence of process variations avoids the fabrication condition to statistically drift into shallow-zener case I (which offers less protection and more problems with FPI ionization currents) or into deep-zener case III (which penalizes the device in on-resistance or breakdown). With a 3 kÅ thick bottom oxide, high-energy chained-implants, and dry silicon trench etching, maintaining device fabrication in case II is possible using today's modern processing equipment. As such, the highest reliability thin-gate-ox trench-gated MOSFET with a low on-resistance, high breakdown, and good avalanche energy absorption capability is possible for a device made in accordance with this invention.

Figure 11:
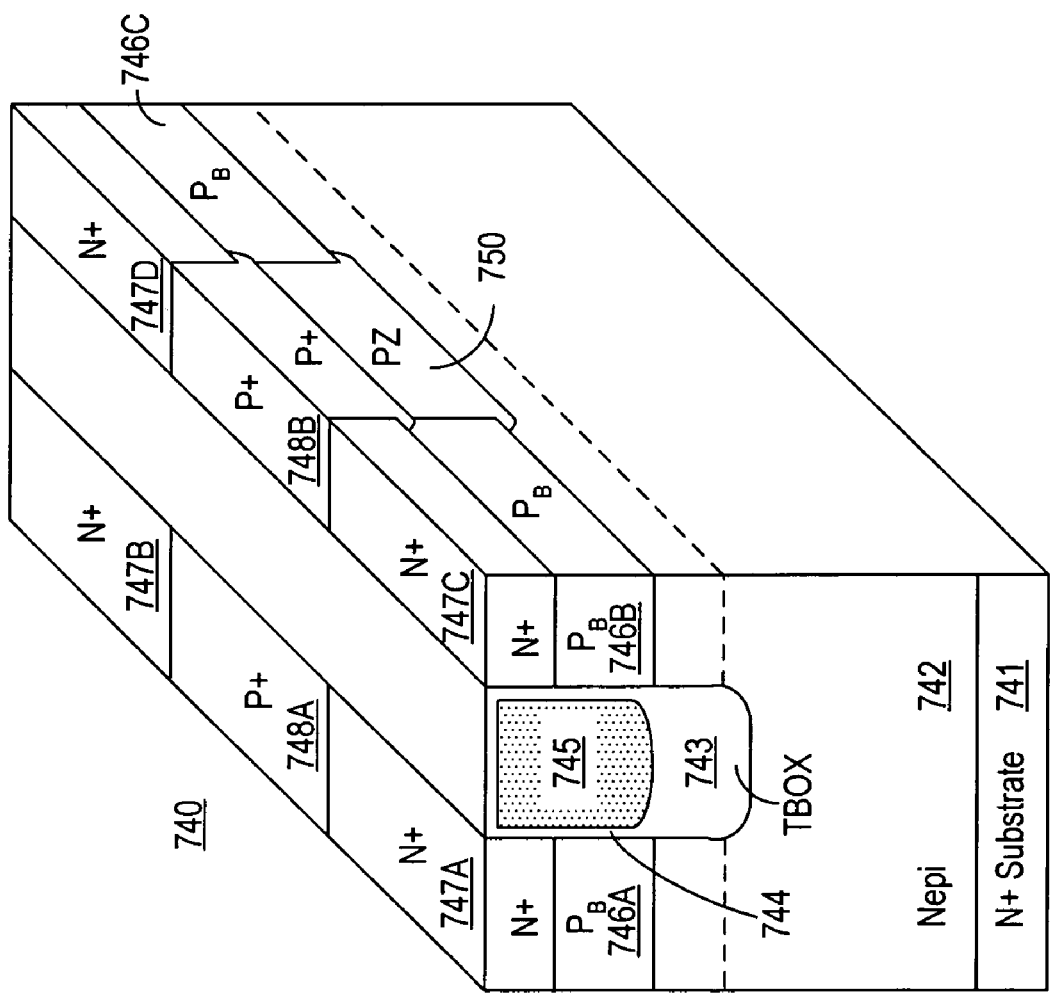
FIG. 11 shows a cutaway vies of a zener-clamped TBOX Trench-Gated MOSFET in accordance with an embodiment of the invention.

FIG. 11 illustrates a 3-D cut-away projection of a voltage-clamped TBOX trench-gated MOSFET 740 similar to the device shown in FIG. 8. The device 740 includes an array of cellular or stripe trench gates including an embedded polysilicon gate 745, thin gate-oxide sidewall 744 and thick bottom oxide TBOX 743 formed in an N-type epitaxial layer 742 formed atop an N+ substrate 741. Top metal and any surface contact mask or dielectric feature above the silicon surface is not shown in FIG. 11.

P-type body region 746 (shown as 746A, 746B, 746C) is formed within epitaxial layer 742 with a depth shallower than the bottom of the embedded trench gate 745. The body regions 746 may be formed uniformly or masked and localized to active MOSFET channel regions. N+ source regions 747 (shown as 747A to 747D) formed within and with junction depths shallower than body regions 746 are located along the perimeter of the trench gate and embedded polysilicon 745. Portions of the silicon surface where N+ regions 747 are blocked include shallow P+ regions 748 (shown as 748A, 748B) to facilitate electrical contact to the underlying P-type body regions 746.

Zener region 750 is included to control the avalanche characteristics and breakdown voltage of device 740. The PZ zener region 750, having a depth shallower than the etched silicon trenches (and therefore shallower than the bottom of the TBOX 743) yet deeper than the bottom of the embedded gate 745 (and therefore deeper than the top of TBOX 743), are located in portions of the silicon mesa regions between trench gates. Ideally the PZ zener regions 750 are located beneath or overlapping shallow P+ regions 748, with no or little overlap under N+ source regions 747.

The body contact regions 748 and PZ zener regions 750 may be uniformly distributed and may include stripes transverse to trench gate and N+ source stripes.

Formation of the zener clamp may be added to any number of trench MOSFET fabrication sequences so long as the fabrication sequence integrates thick bottom oxide and deep zener clamp regions.

Figure 12B:
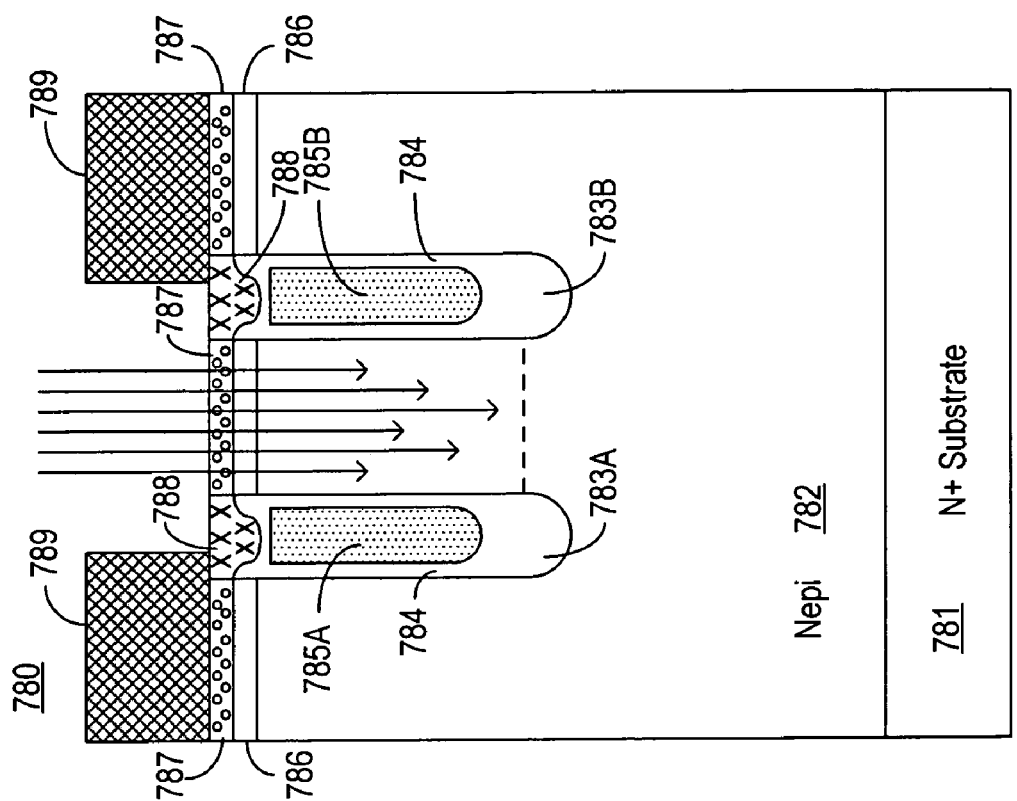
FIG. 12B shows a cross-section of device undergoing a chained-implant through a silicon nitride hardmask for formation of a zener diode.
Figure 12A:
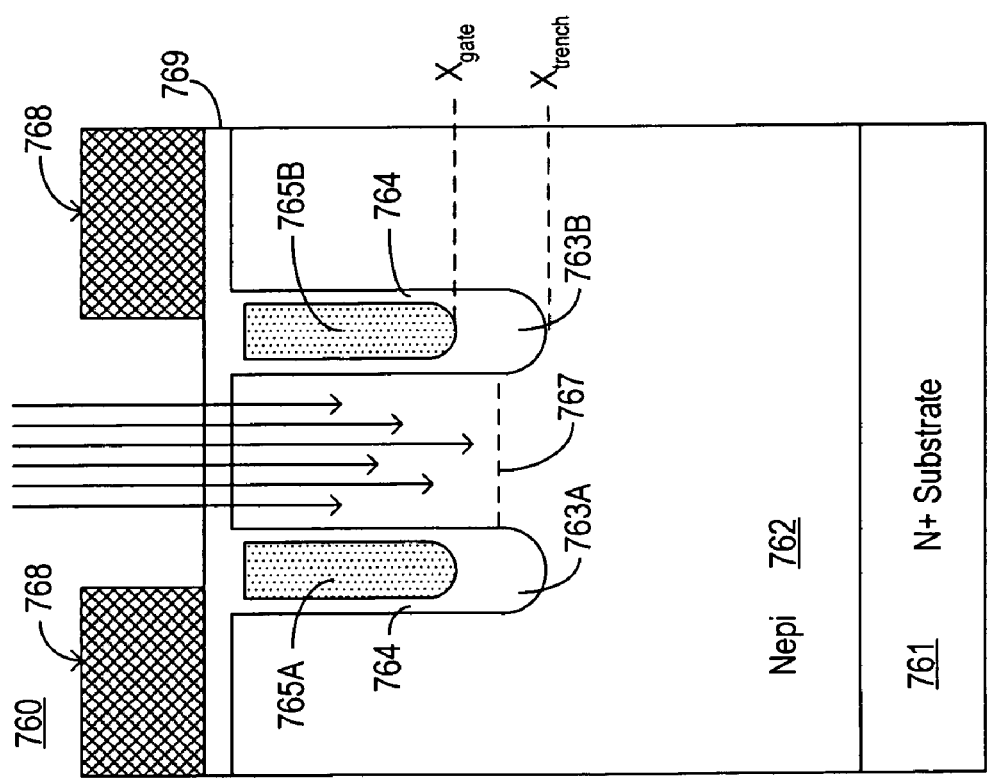
FIG. 12A shows a cross-section of a device with a thin top oxide undergoing a chained-implant for formation of a zener diode.

In FIG. 12A, a trench gate structure 760 shown in cross-section has been formed prior to introduction of the zener clamp. As shown at some intermediate step in the fabrication of a trench gated MOSFET, the device 760 includes an N+ substrate 761, an N-type epitaxial layer 762, etched trenches filled with thick bottom oxide 763A, 763B, thin sidewall gate oxide 764, embedded polysilicon gates 765A, 765B, and thin top oxide 769.

While the silicon trench enclosing gate polysilicon 765 and TBOX 763 may have a depth xtrench as shallow as 0.5 μm and as deep as 3.0 μm, a trench of 1.0 to 1.8 μm is easier to manufacture and reproducibility control. Excessively shallow trenches suffer from the risk of short channel effects (including punch-through breakdown) while deeper trenches may exhibit high electric fields at their trench tips (adversely affecting device reliability) and making polysilicon trench fill difficult. TBOX thickness may range from 1 kÅ to 5 kÅ in final thickness (after any sidewall oxide etch-back steps) but around 3 kÅ is preferred. The bottom of polysilicon gate electrode 765 is determined by the difference of the trench depth and the TBOX final thickness as given by the relation xgate=xtrench−xTBOX, which will typically range from 0.5 μm to 1.5 μm. The thickness of sidewall gate oxide 764 may range from 50 Å to 1200 Å with 150 Å to 500 Å being more common.

Ion implantation of the deep zener anode region 767 may include a single conventional ion implantation at 80 to 120 keV followed by a drive-in diffusion (900° C. to 1150° C. for 30 min to 10 hours) or preferably by a chained implant including a series of ion implantations of differing energy and dose. The deepest implant may be as high as to 3 MeV (with 1.3 MeV being more typical as a maximum energy implant). Implant doses typically may range from 1E12 cm$^{-2}$ to 5E14 cm$^{-2}$ (with 7E12 cm$^{-2}$ to 5E13 cm$^{-2}$ being preferable). The depth of region 767 as described before may vary from slightly-shallower than the gate depth xgate to over one micron deeper than the trench depth xtrench but as described previously preferably at a depth deeper than the gate depth xgate and shallower than the trench depth xtrench. Photoresist 768 must be thick enough to block the deepest ion implant and may be 3 to 4 μm thick. The photoresist 768 must have steep sidewalls, typically having an 85 to 90 degree angle relative to the wafer's surface to prevent implantation into the next device mesa. Thin top oxide 769 having a thickness of around 200 Å to 700 Å is used as a pre-implant oxide, protecting the silicon mesa regions from contamination and preventing implant channeling.

In FIG. 12B, the surface of a device 780 includes a silicon nitride layer 787 of 200 Å to 3000 Å thickness (but preferably from 500 Å to 1500 Å) with underlying oxide 786 having a thickness of 100 Å to 1000 Å (but preferably around 300 Å). Devices with silicon nitride at their surface are compatible with super self-aligned processes (such as described in Williams et al, U.S. Pat. No. 6,413,822).

Figure 12C:
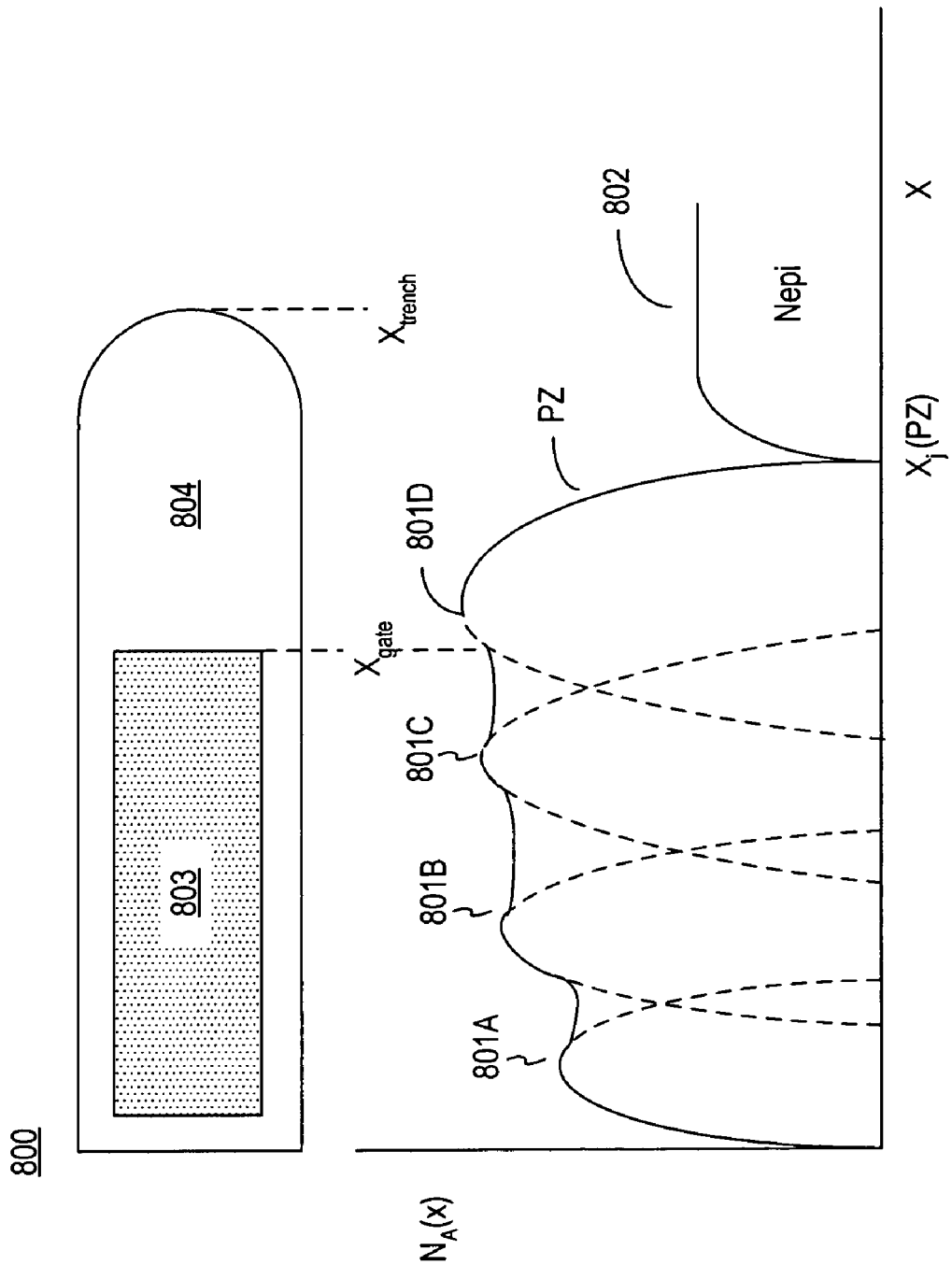
FIG. 12C shows a concentration profile resulting from a chained-implant formation of a PZ anode.

FIG. 12C illustrates one possible concentration profile for a chained implant zener voltage clamp where the deepest implants have the highest dose and the shallow implants have a lesser dose. The graph of concentration versus depth is referenced to the cross-section of a trench 800 having a depth xtrench, which is turned sidewise in FIG. 12C. The trench 800 includes a polysilicon gate 803 of depth xgate and TBOX 804 extending to the bottom of the trench 800. The chained implant shown includes a 4-implant chain of implants 801A, 801B, 801C, 801D where 801D is the deepest implant forming a PN junction with the opposite conductivity type epitaxial layer 802 at a depth $X_j(PZ)$. As shown the depth of the PZ zener clamp is preferably deeper than the gate depth xgate and shallower than the trench depth xtrench.

The PZ zener implants 801A to 801D may be of uniform dose or in the case shown in FIG. 12C higher dose at greater depths, although any arbitrary profile is possible. For example a PZ chained-implant profile may include implant 801A of 5E13 μm$^{-2}$ at 250 keV, implant 801B of 7E13 cm$^{-2}$ at 500 keV, implant 801C of 9E13 cm$^{-2}$ at 900 keV, and implant 801D of 1.2E14 cm$^{-2}$ at 1.2 MeV. This implant sequence produces a doping profile that increases gradually with depth as shown in FIG. 12C. Note that the implants needn't be spaced at uniform intervals.

Figure 12D:
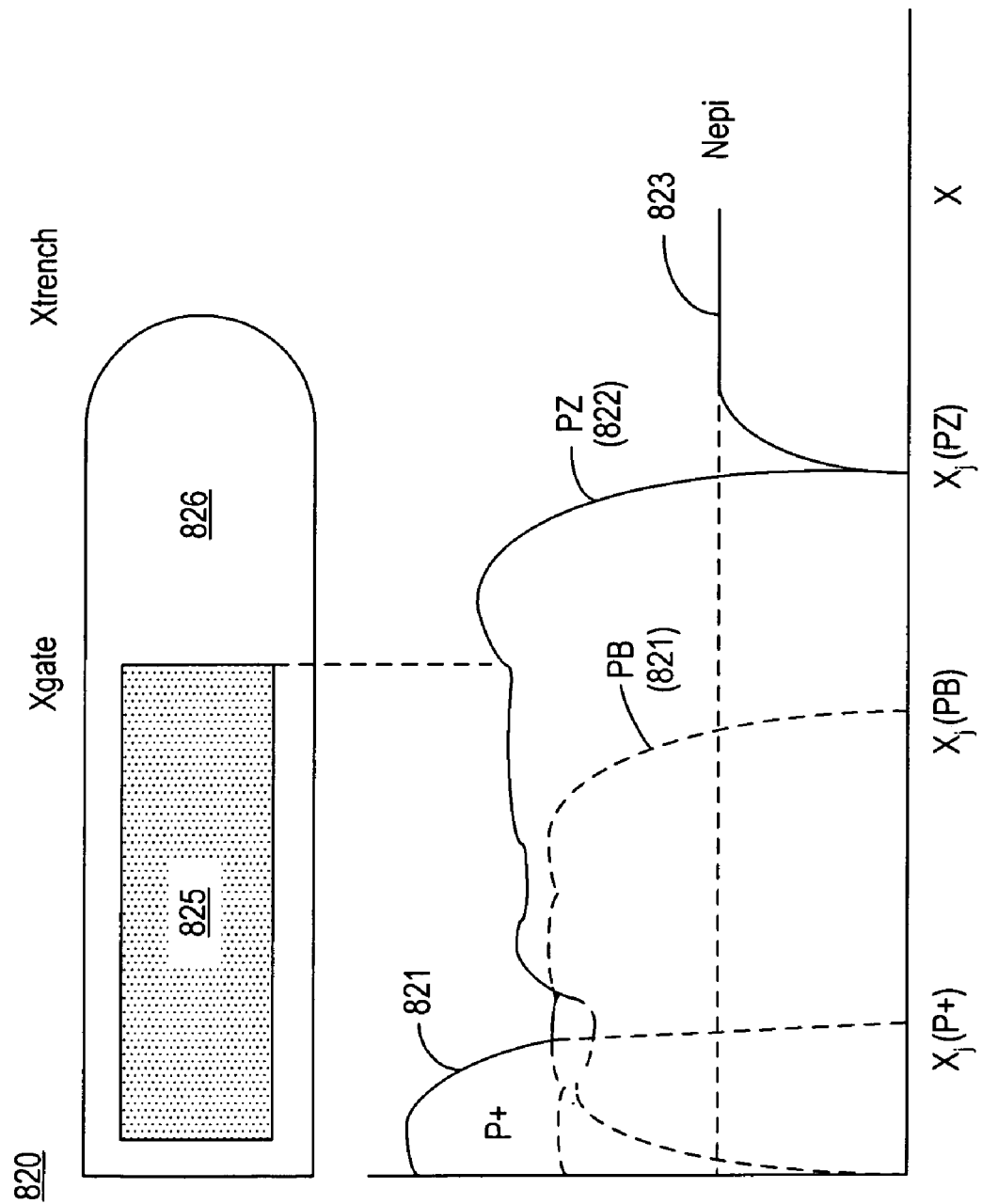
FIG. 12D shows a concentration profile resulting from a chained-implant overlapping by a shallow P+ region.

In FIG. 12D, heavily doped shallow P+ region 821 is introduced to contact the zener clamp anode region. In FIG. 12D, P+ region 821 of depth Xj(P+) merges with P-type chained implant 822 to complete the zener clamp. Implanting the shallow P+ region using a low-energy high-dose (high-beam current) ion implanter eliminates the need for implanting high concentration implants in the chained implant. Splitting the shallow high dose and deeper low dose implants into two different machines minimizes production costs by avoiding time-consuming high-dose ion implantations using expensive MeV capable (i.e., high energy) ion implanters. P+ region 821 may also be used in other locations of the device to contact the P-type body region where no PZ zener region is present.

Note also that P-type body region 824 may also include a chained implant, but at lower energies. When compared to trench cross-section 820 with embedded polysilicon gate 825 of depth xgate, thick bottom oxide 826, and a trench depth xtrench, FIG. 12D also illustrates that P-type body region has a depth Xj(PB) which necessarily is shallower than gate depth xgate to facilitate channel formation in the active transistor cells of the same device.

Figure 12E:
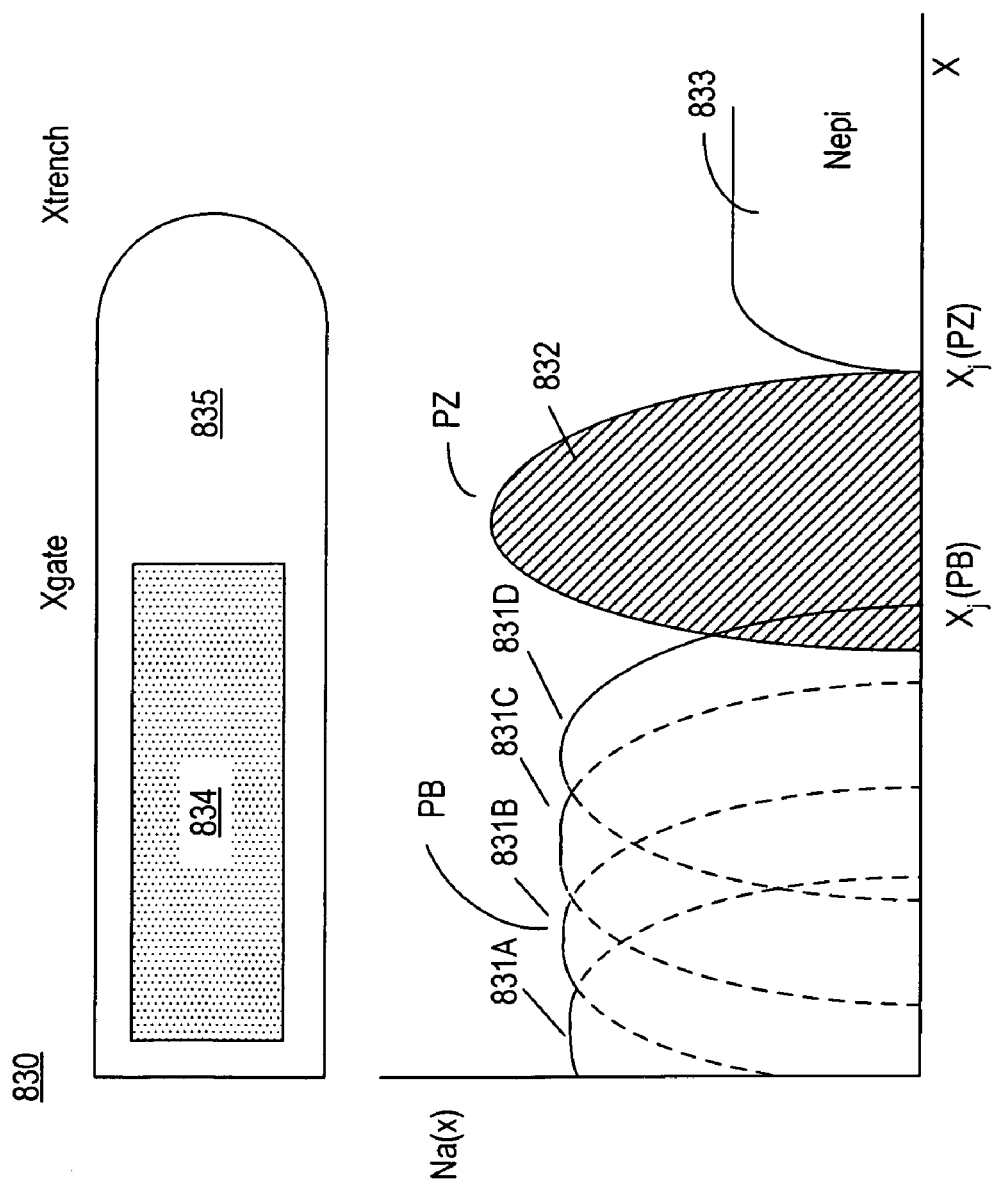
FIG. 12E shows a concentration profile for a chained-implant body with a deep zener implanted region.

Another possible PZ zener region profile is illustrated in FIG. 12E, where the PZ zener region constitutes a single deep implant 832 and no shallow PZ ion implants. In this case, the zener region connects to a top shallow P+ (not shown) through the chained body implant including implantations 831A, 831B, 831C, and 831D. As in prior examples, MOSFET operation in the active cells of the same device mandates that the body doping profile has a depth Xj(PB) shallower than the gate depth xgate. The PZ zener region implant profile of implant 832 must overlap onto the PB body implant profile 831D to guarantee electrical connection of the clamping diode. The device of FIG. 12E is easy to manufacture but exhibit a higher series resistance than the device of FIG. 12D and therefore offers less robust clamping and a correspondingly lower avalanche energy absorption capability.

In the examples shown thus far, no attention was devoted to the polysilicon gate contact. Specifically in device 840 of FIG. 13A, the embedded polysilicon gate 844 must be brought to the surface by a polysilicon region 845 to facilitate electrical contact to a metal gate bus 852 as well as to the gate bonding pad (not shown). The issue of concern is one of sequence. Since the polysilicon 845 and silicided contact region 851B extend onto the surface of the wafer, the presence of the polysilicon 845 can impede or even prevent the introduction of the deep zener clamping implant (or for that matter any P-type regions) into silicon regions beneath the polysilicon gate bus 845.

Electrically, lack of a P-type material beneath the polysilicon gate bus 845 presents several potentially significant issues. Since the gate is grounded (i.e., tied to the source potential) and since the epitaxial drain is biased to the full drain potential, the oxide and silicon beneath any unshielded polysilicon gate bus (i.e., polysilicon without an underlying P-region) sees high electric fields, and may suffer from avalanche in the silicon or potentially damage to the dielectric.

Three solutions to this problem are possible; to form a P-region in the gate bus areas before the trench gate is formed, or to implant through the gate contact polysilicon, or top split the gate polysilicon into two depositions, the first to form the embedded gates, the second to form the surface polysilicon 845 that extends out of the trench to facilitate contact.

Of the three options, the disadvantage of an early (pre-trench) implant is it experiences the entire thermal budget of the process. The adverse effects of high temperature processing are dopant diffusion (especially due to the relatively high temperature sacrificial and gate oxidation cycles), along with dopant segregation and dopant loss due to the trench etch. Both effects made it difficult to integrate the PZ zener clamp at this step in the process, since the unwanted diffusion causes lower PZ concentrations and less-abrupt PZ-clamp dopant profiles. So while the gate bus shielding problem can be remedied by incorporating a P-type implant prior to the trench, it is difficult to employ such early implants as a zener clamp.

The second option is to implant the PZ region through the polysilicon gate bus. The disadvantage of this approach is that the zener-diode doping profile and junction depth depend strongly on the polysilicon thickness (which in turn varies dramatically with poorly controlled chemical and mechanical etchback processes). Producing a zener doping profile that has a well-controlled junction depth in manufacturing is difficult whenever implanting through a surface polysilicon layer due to a large number of poorly controlled process variables.

Figure 13A:
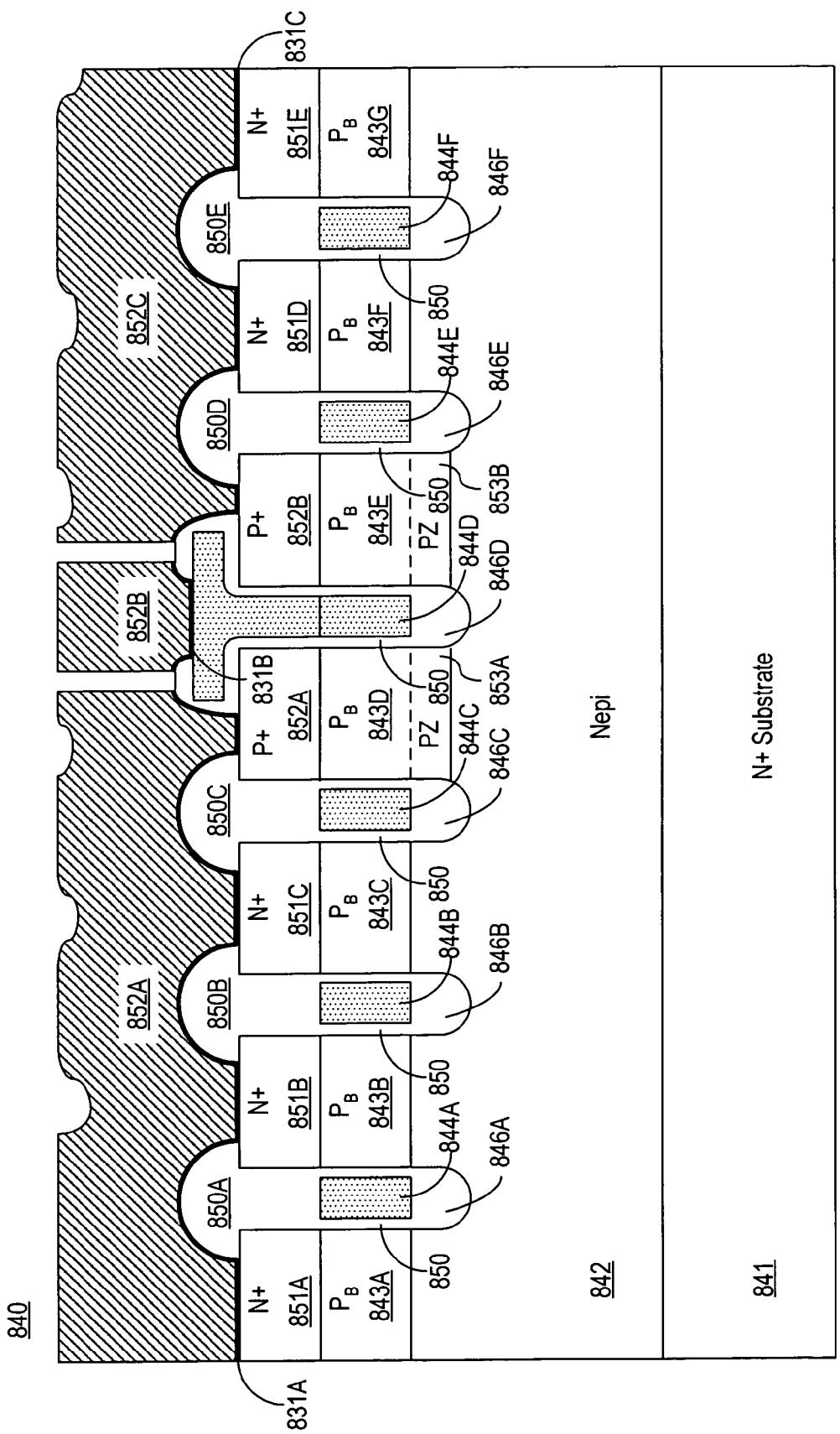
FIG. 13A shows a cross-section of a device illustrating a gate bus with an underlying PZ region.

The preferred sequence is to implant the PZ anode later in the process by splitting the polysilicon gate and gate-bus formation into two deposition steps, implanting the PZ region after the embedded polysilicon gate deposition and etchback, but prior to the deposition of a surface polysilicon layer. FIG. 13A illustrates cross-section 840 incorporating embedded gates 844A through 844F, deposited and etched back (planarized) prior to the ion implantation of P-type zener implant 853A and 853B. P-type body region 843A through 843G can also be implanted at this point in the fabrication sequence. Both body 843 and zener region 853 implants can be formed using diffused junctions or preferably using high-energy chained implants. Second polysilicon layer 845 is formed after the P-type body and zener implants as evidenced by the overlap of polysilicon 845 onto PB body regions 843D, 843E and atop PZ zener regions 853A and 853B.

Figure 13C:
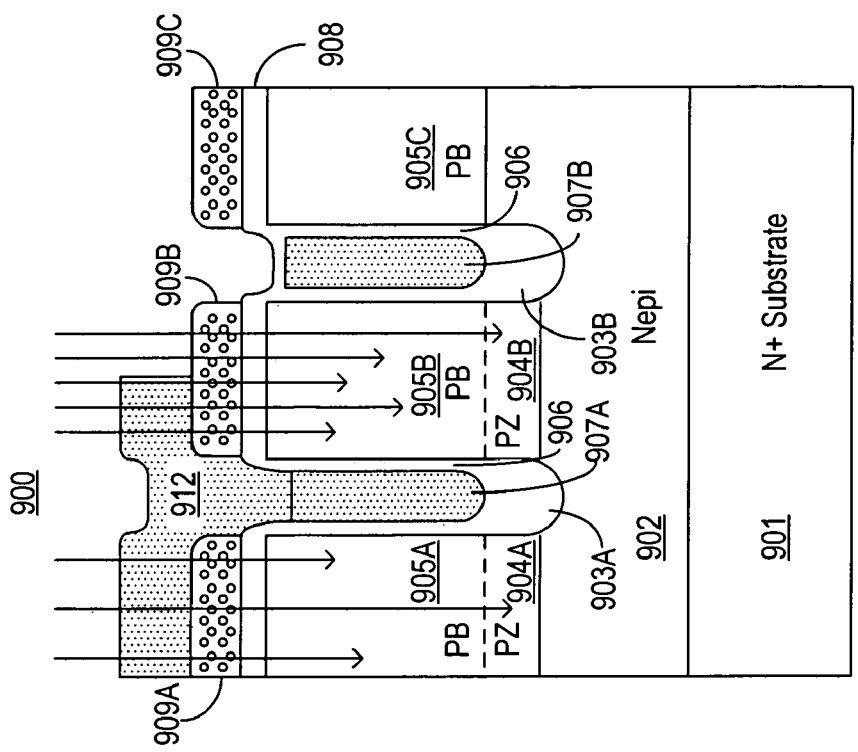
FIG. 13C shows a cross-section of a device after a second polysilicon deposition, masking, and etching.
Figure 13B:
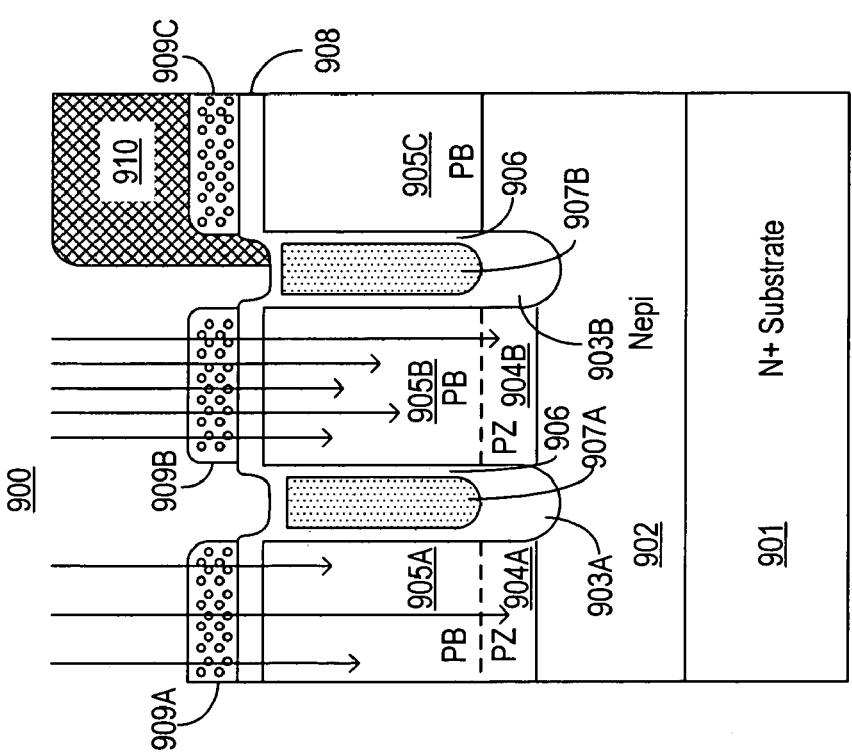
FIG. 13B shows a cross-section of a device during a zener implant that is before second polysilicon depositions.

In device 900 of FIG. 13B, a trench defined by a sandwich hardmask including thin oxide layer 908 and silicon nitride layer 909 (including regions 909A, 909B, 909C) illustrates that ion implantation can be performed through the relatively well-controlled silicon nitride layer 909 to form PZ, zener anode regions 904A and 904B. The PZ zener region is implanted after first polysilicon 907 (including 907A and 907B) is deposited and etched back, using a thick photoresist mask 910 to limit the locations receiving the PZ zener implant. In the example shown the PZ zener implant is formed in the mesa regions corresponding to PB body regions 905A and 905B, but excluded from body region 905C. The profile of photoresist 910 must be steep and vertical to prevent significant implant penetration into the protected mesas (such as the mesa containing body region 905C).

Body region 905 (including 905A, 905B, and 905C) is also preferably implanted after this embedded polysilicon gate formation, either before or after the PZ zener implantation. Thereafter, a second polysilicon gate contact or gate bus region 912 as shown in FIG. 13C is deposited, patterned by photolithography, mask and etched. Since 2nd polysilicon 912 was formed after the PB body regions 905 and PZ zener regions 904, the implanted regions can be located beneath the surface polysilicon 912. The P-regions thereby electrostatically shield gate bus 912 from the drain potential of epitaxial layer 902.

Note that if a device is manufactured using ion implantation after the top polysilicon bus is formed, the depths of body 843 and zener 853 regions would vary with surface topography, being shallow or completely blocked wherever the surface polysilicon layer is located.

Figure 14A:
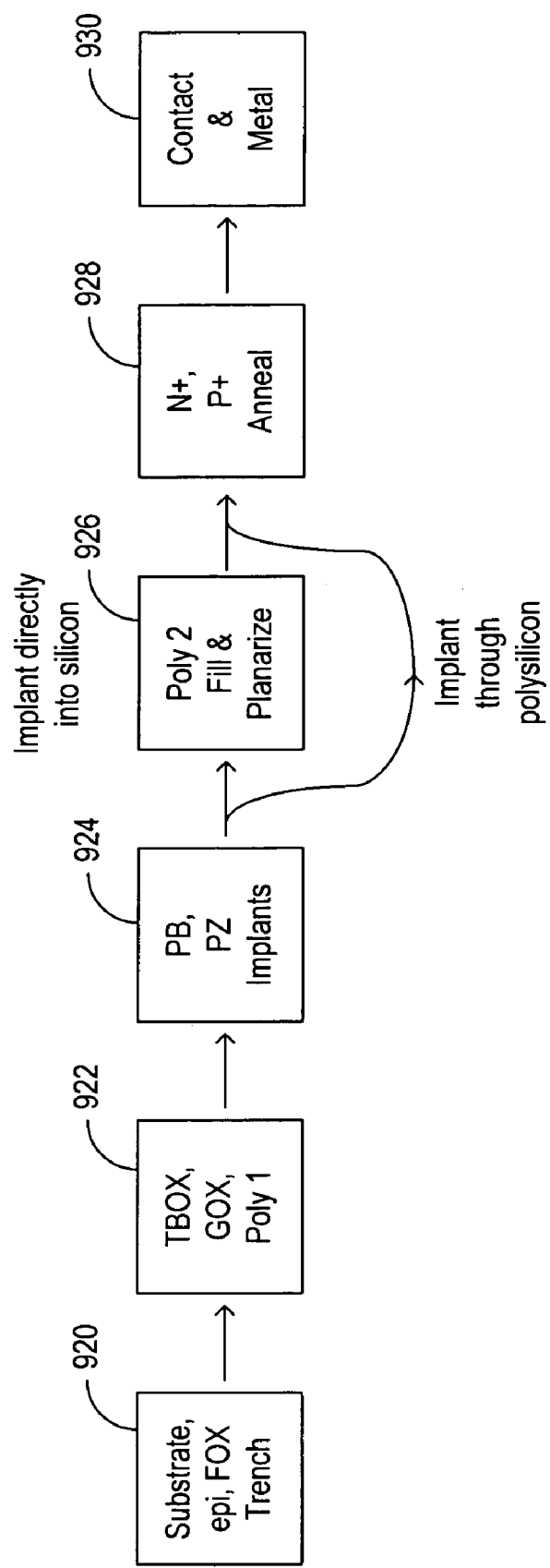
FIG. 14A shows a process flow in which trench formation precedes dopant introduction.

One possible manufacturing flow for fabrication of a trench gated MOSFET in accordance with an embodiment of the invention is represented schematically in FIG. 14A. The process of FIG. 14A includes initial steps 920 of preparation of a substrate and epitaxial layer etching trenches in the epitaxial layer. Steps 922 then include formation of thick bottom oxide (TBOX formation) in the trenches, gate oxidation (GOX) of the trench sidewalls, and formation of a first polysilicon layer "Poly 1". PB and PZ implants can be performed at this point.

Two-possible process combinations can result. If Poly 1 remained atop of the silicon while the PB body and PZ zener regions were implanted, then the need for formation of a second polysilicon layer in step 926 is avoided, and processing continues directly from step 924 to formation of N+ and P+ regions in step 928. Alternatively if first polysilicon layer "Poly 1" was etched back prior to PB the body and PZ zener implants, step 926 deposits and patterns a second-polysilicon layer "Poly 2" before N+ and P+ implantations in step 928. Contact and metal steps 928 complete the fabrication.

Figure 14B:
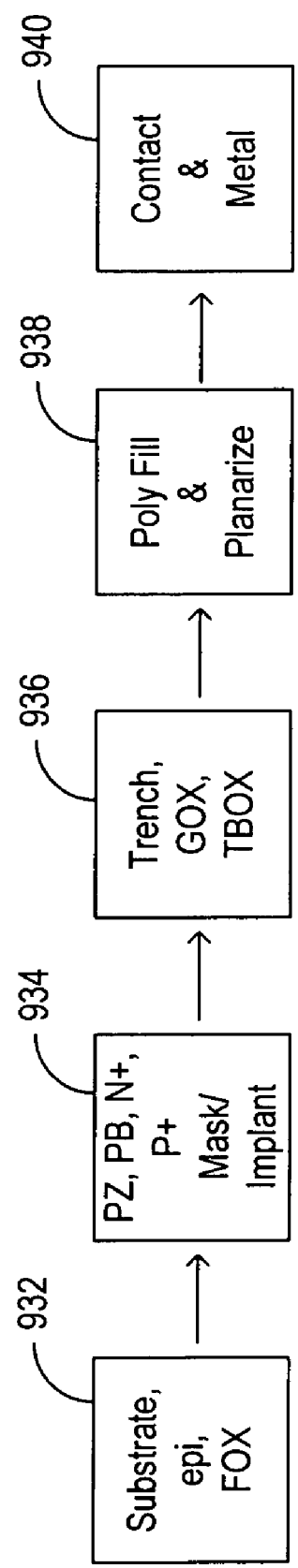
FIG. 14B shows a process flow where dopant introduction precedes trench formation.

Another process sequence shown in FIG. 14B, involves following epitaxial and field oxidation formation steps 920 with ion implantation processes 934 for all dopants, e.g., PZ, PB, N+ and P+ implants, prior to etching a trench in step 936. The trench gate is formed using trench etch, TBOX formation, and gate oxidation in step 936 and a single polysilicon deposition and masked etchback in step 938 followed by contact and metal layer processes 940.

Figure 15E:
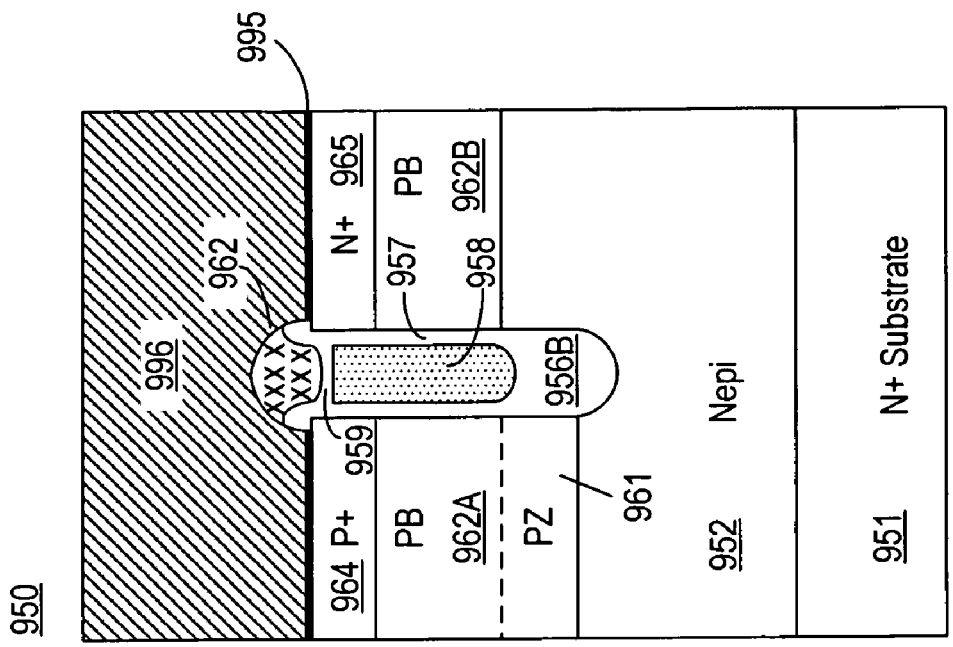

FIGS. 15A to 15E illustrate one example of an integrated process flow used to fabricate a zener-clamped TBOX trench gate device 950 in accordance with this invention. The process begins as shown in FIG. 15A with an <100> oriented N+ substrate 951, 1 to 3 mΩcm², followed by epitaxial growth of N-type silicon layer 952 range having a resistivity and thickness manufactured in accordance with the drain voltage rating of the device (see Table 1 for examples of representative epitaxial thickness and resistivity targets.)

TABLE 1

Epitaxial Material Specification Examples (by Voltage)

| Breakdown Min Spec $BV_{DSS}$ (V) | Breakdown Target $BV_{DSS}$ (V) | Epitaxial Thickness $x_{epi}$ (µm) | Epitaxial Resistivity $\rho_{epi}$ (Ωcm) | Epitaxial Dopant |
|---|---|---|---|---|
| 12 | 15 | 1.9 | 0.19 | phosphorus |
| 20 | 23 | 2.5 | 0.22 | phosphorus |
| 30 | 33 | 3.5 | 0.37 | phosphorus |
| 60 | 65 | 5.0 | 1.7 | phosphorus |
| 100 | 115 | 8.0 | 2.5 | phosphorus |
| 200 | 220 | 15.0 | 9.3 | phosphorus |

After epitaxial growth the silicon material is oxidized at a temperature between 850° C. to 1100° C. for 10 minutes to 2 hours but preferably between 900° C. to 1000° C. for 30 minutes. The resulting oxide 953 should have a target thickness of 100 Å to 1000 Å, but preferably should be around 300 Å to 500 Å in thickness. Silicon nitride layer 954 is then deposited using CVD to a thickness between 800 Å to 5000 Å but preferable to a thickness of 1500 Å to 2000 Å. Thereafter, silicon nitride layer 954 is patterned using photolithographic techniques to expose trench etch areas, followed by dry etching using plasma or RIE methods to removed exposed portions of silicon; nitride layer 954, oxide layer 953, and finally silicon epitaxial layer 952. The photoresist used to define the etch window is typically removed prior to the silicon etching steps that form trench 955. Trench 955 may range from one-half to several micrometers (µm) in depth as described previously.

To produce the structure of FIG. 15B, the trench is oxidized for 30 min to 5 hours at 900° C. to 1100° C. but preferably for 30 minutes to 1 hour at 950° C. to 1000° C. to remove any etch damage. The oxide in trench 955 is then removed in HF acid or buffered oxide etch (BOE), and a second layer of silicon dioxide (not shown), the so called "lining oxide", is grown to a thickness of several hundred Angstroms (as described earlier) using thermal conditions similar to the sacrificial oxide growth. Thick bottom oxide is then deposited using high-pressure plasma CVD to form thick bottom oxide 956B to a thickness of 1 kÅ to 5 kÅ but preferably from 2 kÅ to 3 kÅ directional deposition methods (as described in U.S. Pat. No. 6,291,298, to Williams et al.) The thick oxide also forms atop the silicon mesa regions as regions 956A, 956C. Deposition on the sidewall of trench 955 is minimal. Followed by a short HF dip, any oxide 956 deposited on the sidewall is removed along with the sidewall portion of the lining oxide. Gate oxide 957 is grown on the trench sidewalls using conditions similar to the sacrificial oxidation process previously described. The final thickness of gate oxide 957 depends on the maximum gate voltage rating $V_{GS}(max)$ of the device. In general, the maximum continuous operating voltage of the gate should not exceed a gate electric field (defined as $V_{GS}(max)/Xox$) over 4 MV/cm (except for oxides thinner than 200 Å where 5 MV/cm electric fields can safely be applied to the gate). For example, a 300 Å gate can support 12V maximum operating voltage while a 500 Å gate oxide can be used to fabricate a device with a 20V rated gate.

After gate oxidation, a polysilicon layer 958 is deposited to a thickness roughly equal to the trench depth using CVD techniques, flowed by a planarizing etchback or chemical mechanical polishing (CMP) operation. The polysilicon 958 may be doped in-situ or alternatively followed by an ion implantation and 1 hour diffusion at 950° C. to 1000° C. to drive the implanted dopant down into the trench polysilicon layer 958. Typically phosphorus is used in the case of N-channel MOSFETs (and boron used for P-channel devices, but some P-channel MOSFETs May also use phosphorus doped polysilicon, or boron polysilicon with a small amount of phosphorus present for enhanced reliability purposes). After a final etchback of polysilicon 958, a thin oxide 959 of thickness of 100 Å to 300 Å may be thermally grown at 900° C. to 950° C. for 30 minutes to 1 hour, primarily to seal the top of the polysilicon gate 958.

In FIG. 15C, glass 960, for example, silicon dioxide, TEOS, or BPSG, is deposited using spin-on or CVD techniques flowed by a planarizing etchback or CMP operation removing all glass present above the surface of silicon nitride layer 954. During this step, portions of glass 960 and all of surface TBOX 956A, 956B regions are cleared.

Also in FIG. 15C, PZ zener regions 961 and PB body region 962A, 962B are formed as previously described, preferably through chained ion implantation of boron. At this step, the oxide atop gate bus regions (not shown) is cleared and a second polysilicon layer is deposited to a thickness of 1 kÅ to 6 kÅ, but preferably of 3 kÅ. The polysilicon layer is masked and etched back to form gate bus regions (not shown).

Figure 15D:
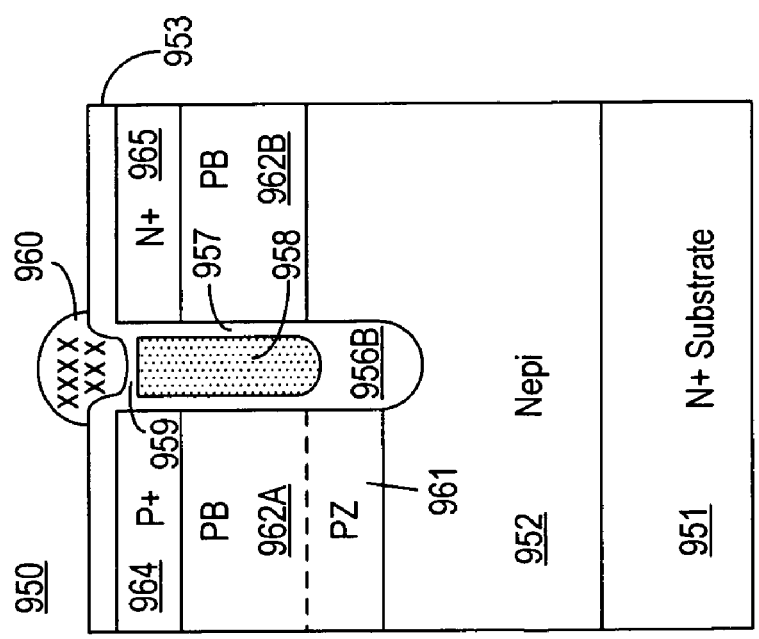

To form the structure of FIG. 15D, silicon nitride layer 954 is removed by plasma etching without clearing glass 960 from atop trench embedded polysilicon gate 958. N+ region 965 and P+ region 964 are then selectively masked and implanted into the active mesa areas. N+ implanted region 965 may include phosphorus but preferably utilizes a 5E15 cm$^{-2}$ to 8E15 cm$^{-2}$ arsenic implantation at 80 to 120 keV. P+ implanted region 964 may be formed by masked or blanket implant of boron at 60 to 100 keV at a dose of 2E15 cm$^{-2}$ to 4E 15 cm$^{-2}$.

A 20 sec RTA (rapid thermal anneal) or a 10 min 950° C. thermal anneal may follow source implantation or alternatively, implant annealing may be performed by a subsequent glass reflow step.

After source and body contact implants are performed, thin oxide 953 can be removed and the silicon mesas contacted. Alternatively any glass, BPSG, or spin-on glass (SOG) can be deposited and masked with a contact mask to expose silicon mesa regions. As shown in FIG. 15E glass 962 can be rounded after contact mask by a short thermal anneal, typically 15 minutes at 900° C. The benefit of rounding this glass is to prevent metal voids and step coverage issues. Metal formation starts with a thin titanium/TiN barrier metal 995 followed by sputtering of a thick aluminum-copper or aluminum-copper-silicon 996, typically 3 µm in thickness. The metal 995 and 996 is subsequently masked and dry etched to separate the gate bus from the source metal.

The resulting structure 950 illustrated in FIG. 15E includes one version of a finished voltage-clamped TBOX trench-gated MOSFET including embedded trench gate 958 with thick bottom oxide 956B and zener clamp 961 and body 962. In such a process, the gate 958 is formed prior to the junctions of zener claim 961 and body 962.

An alternative process flow shown in FIGS. 16A and 16B forms the doped regions first then introduces the trench. In this alternative, a device 980 includes PZ zener clamp 982, a PB body region 983, an N+ source 984, and a P+ 985, formed in an N-type epitaxial layer 982 on an N+ substrate 981, by successive masking and ion implantation and chained ion implants. Optionally high-temperature diffusion can be used to drive-in body 983 and zener 982 regions. Implant doses for this process flow are similar to aforementioned energy and dose conditions used in the manufacture of device 950 in FIG. 15E.

To produce the structure shown in FIG. 16A, the trench gate is then formed using silicon trench etching followed by sacrificial oxidation, lining oxide formation, TBOX 990A and 990B deposition, gate oxidation 991, and deposition of polysilicon refill and etchback to form gates 992A and 992B. Note that zener clamp 982 is not self aligned to the trench gate 992A and therefore may extend on both sides of the trench gate.

Figure 17:
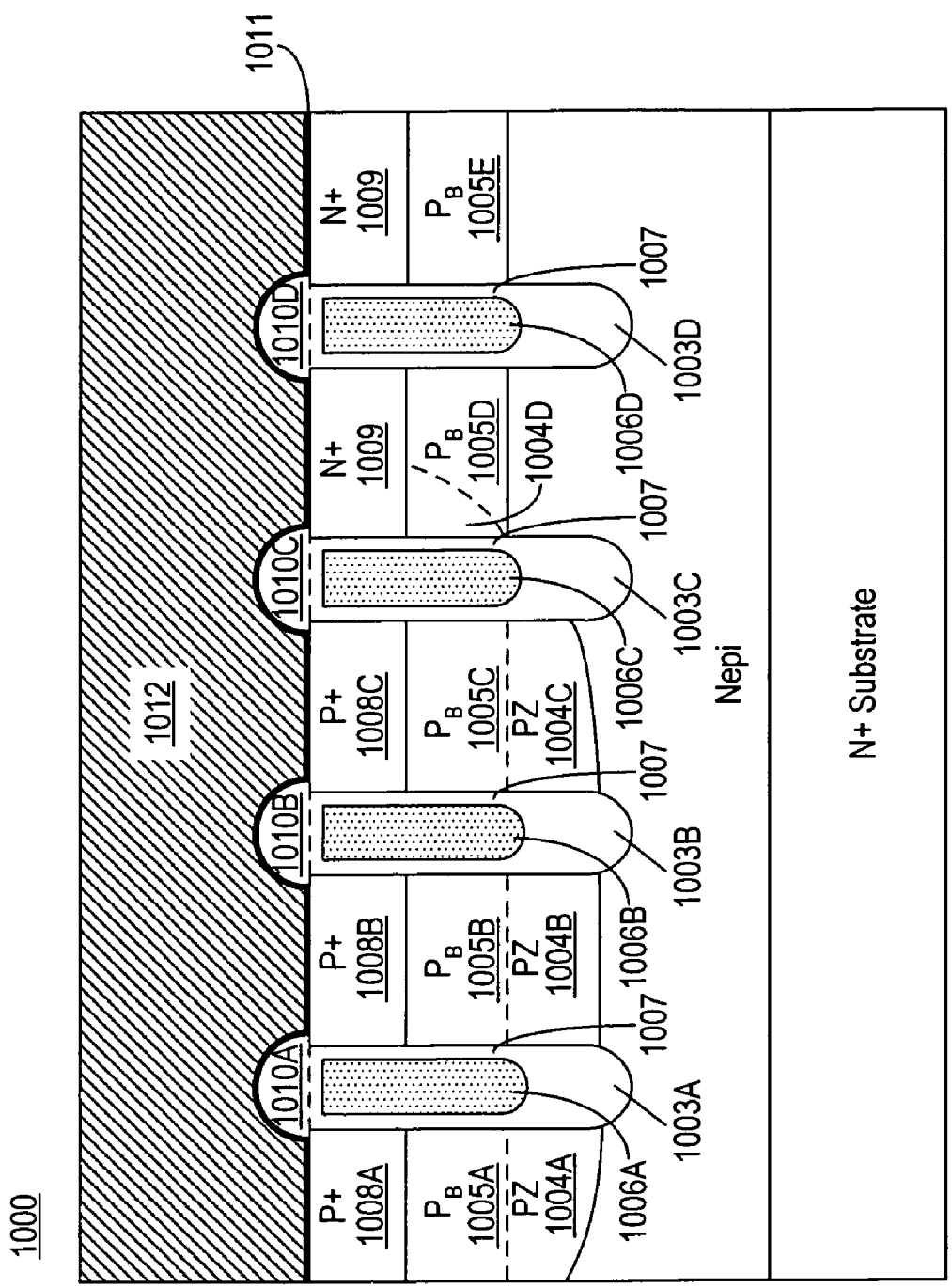
FIG. 17 shows a cross-section of a zener clamped TBOX trench-gated MOSFET with extra wide zener anode overlapping multiple gates.

Using either process flow (i.e., trench before doping or trench after doping) the size of the zener diode clamp can be adjusted to handle the full avalanche current of the device. In FIG. 17, the zener diode includes zener regions 1004A through 1004C, the diode extending over a span of several trench gates 1003A, 1003B, and 1003C. The contact to the mesa regions where the zener regions 1004A to 1004C are located includes shallow P+ regions 1008A, 1008B, and 1008C, preferably with no N+ source region 1009 present within or substantially overlapping onto said zener diode regions.

Figure 18B:
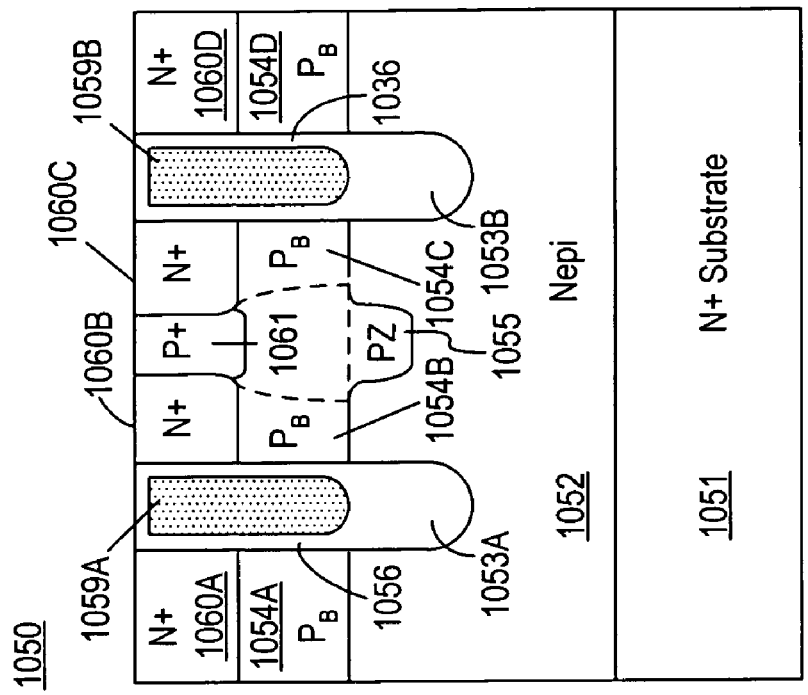
FIG. 18B shows a TBOX trench-gated MOSFET in accordance with an embodiment of the invention having a narrow implanted zener column in the center of an active cell.
Figure 18A:
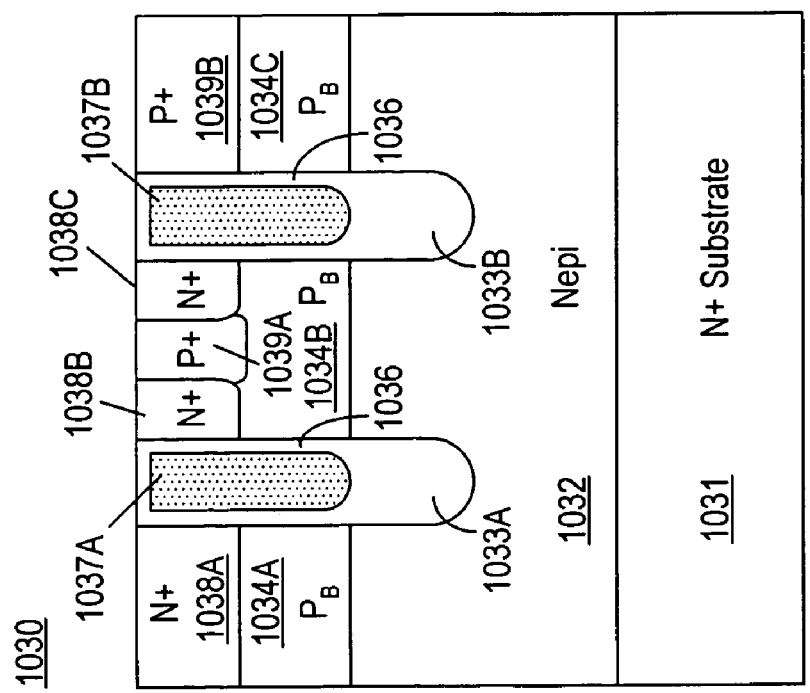
FIG. 18A shows a TBOX trench-gated MOSFET in accordance with an embodiment of the invention having a zener cell separate from the active cells.
Figure 18C:
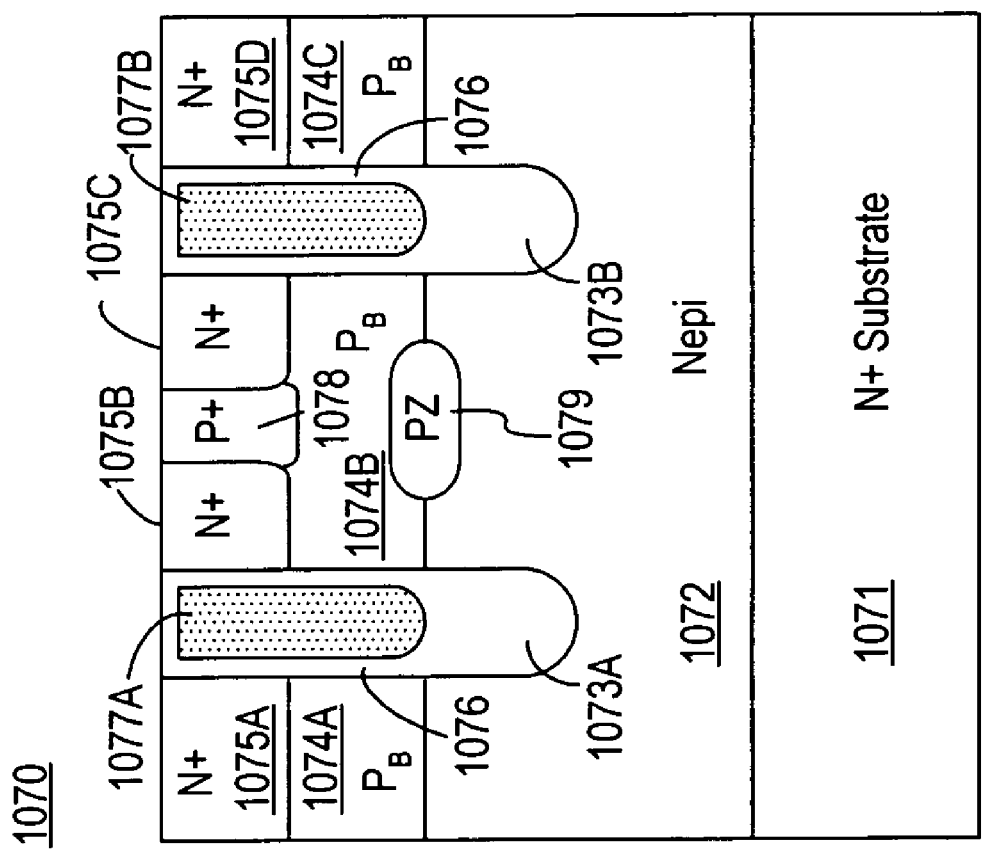
FIG. 18C shows a TBOX trench-gated MOSFET in accordance with an embodiment of the invention having a deep implanted zener in the center of an active cell.

FIGS. 18A, 18B, and 18C illustrate various zener diode clamp designs for TBOX trench gated MOSFETs. In FIG. 18A, zener clamp 1035 and P+ region 1039B are located in non-active (diode-only) cells or mesa regions, while the active transistors may contain shallow P+ 1039A forming a butting contact to source regions 1038B, 1038C.

In another embodiment of a device with a source-body short, FIG. 18B illustrates that in wide mesa devices surface P+ region 1061 combined with the PZ zener clamp 1055 may be integrated into the center portion of an active cell. Unlike prior clamped device, the PZ zener clamp 1055 extends below the gate polysilicon 1059 but preferably not below the bottom of the trench and corresponding TBOX portion 1053.

In another embodiment of this invention, the zener clamp of FIG. 18C may include a single deep PZ implanted clamp region 1079 (without employing a chain implant to fabricate a P-type column as shown in FIG. 18B). Such a device, however, exhibits higher impedance in breakdown than devices (such as the device in FIG. 18A) incorporating a P-type zener including a high concentration region from the surface to the bottom of the junction.

Figure 19B:
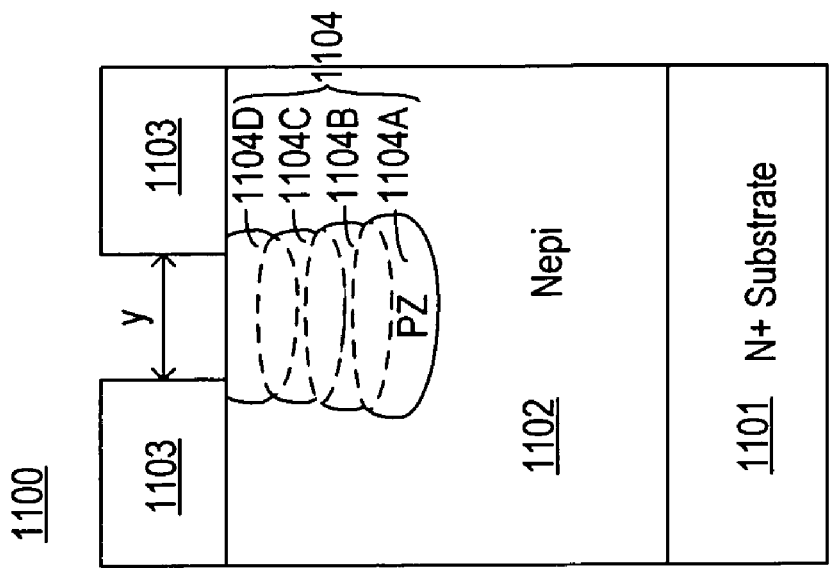
FIG. 19B shows a cross-section of a structure during formation of a chained implanted zener diode.
Figure 19A:
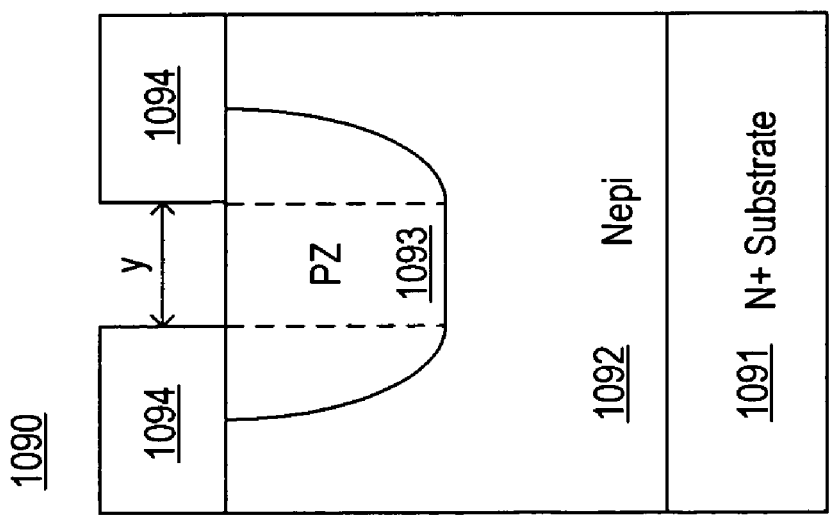
FIG. 19A shows a cross-section of a structure during formation of a deep diffused zener diode.

FIGS. 19A and 19B illustrate zener clamp structures made in accordance with alternative embodiments of this invention. In diode 1090 of FIG. 19A, the PZ zener anode region 1093 is diffused into epitaxial layer 1092. After a single shallow high-dose implant, a high-temperature drive-in diffusion from 1050° C. to 1150° C. for 3 hrs to 10 hrs is used to drive the P-type zener anode region 1093 to its target depth. For N-channel MOSFETs, the zener implant is boron with a dose of 5E14 cm$^{-2}$ to 5E15 cm$^{-2}$ at 80 keV. For P-channel devices, the zener implant is phosphorus of comparable dose, but slightly higher energy (roughly 100 keV to 120 keV). As described earlier, a diffused junction generally exhibits a Gaussian dopant profile and is necessarily lower in concentration at greater depth, not a preferred dopant profile to fabricate a reproducible voltage clamp. Furthermore the width of the junction, if unconstrained by trench gates, expands laterally as it diffuses vertically. The diffused Junction's width can be triple that of the mask opening width y used to photolithographically define the PZ diode since the lateral diffusion is typically 80% of its depth, per side.

In contrast, chained PZ anode-implanted diode 1100 shown in FIG. 19B has a nearly-vertical columnar structure of P-type material formed by combining overlapping implants 1104A through 1104D varying in dose and energy. The depth of the composite zener structure 1104 is determined by the energy of the deepest implant 1104A. The width of the PZ column is slightly wider than drawn mask width y due to lateral straggle (ricochets) of the implant. Contrary to diffused junctions, the width of the implanted regions is wider at greater depths (since the lateral straggle increases in proportion to implant energy). Masking material 1103, which may be thick photoresist, silicon dioxide, silicon nitride, or any other dielectric, must be chosen to be sufficiently thick to block the highest energy implant from penetrating into epitaxial layer 1102 through mask protected areas.

In the event that a trench abuts one side of the PZ implant, or on both sides, the lateral straggle of the implant is constrained by the trench (unless the trench is too thin).

Figure 20B:
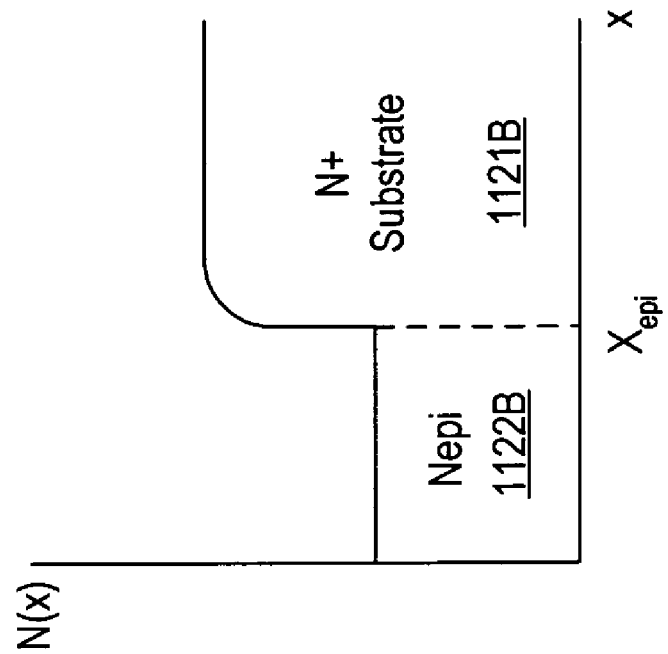
FIGS. 20A and 20B respectively show a cross-section and a dopant profile of a structure including a uniform epitaxial layer.
Figure 20A:
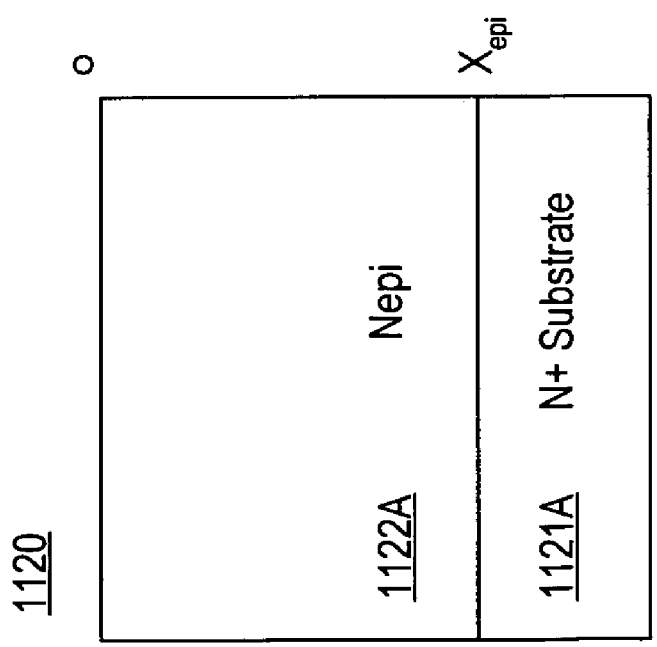

FIGS. 20A to 20H illustrate various examples of epitaxial layers made in accordance with embodiment of this invention. In each case, the goal of the epitaxial layer is to minimize the ionization currents near the thin gate oxide without sacrificing the voltage clamping capability of the PZ zener clamp. In FIG. 20A, cross-section 1120 includes a uniformly doped epitaxial layer 1122A of thickness xepi formed atop N+ substrate 1121A, corresponding to the dopant profiles 1122B and 1121B shown in FIG. 20B.

Figure 20D:
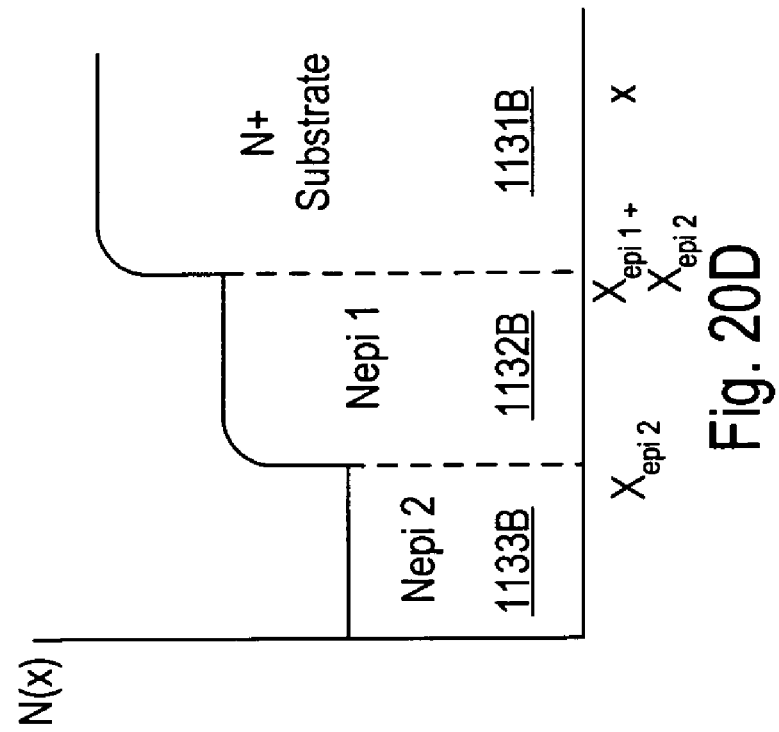
FIGS. 20C and 20D respectively show across-section and a dopant profile of a structure including a stepped epitaxial layer.
Figure 20C:
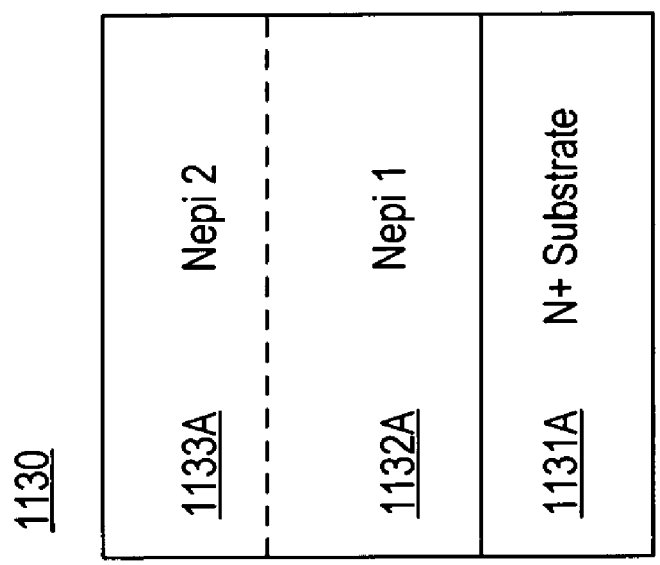

In FIG. 20C, cross-section 1130 includes a heavily doped N+ substrate 1131A, a first N-type epitaxial layer 1132A formed atop N+ substrate 1131A, and a second N-type epitaxial layer 1133A, located atop epitaxial layer 1132A. FIG. 20D illustrates that the stepped epitaxial layer includes a dopant profile 1133B of top epitaxial layer 1133A (of thickness xepi2) having a concentration Nepi2 lower than the dopant concentration Nepi1 shown by dopant profile 1132B of the bottom epitaxial layer 1132A. The concentration Nepi2 of the top epitaxial layer 1133A can be 5% to 40% lower than that of the bottom epitaxial layer 1132A, but preferably concentration Nepi2 should be in the range of 15% to 25% lower than that of the bottom epitaxial, layer 1132A. The thickness of the bottom epitaxial xepi1 layer needs only to support the depletion spreading on the zener voltage clamp in breakdown.

Figure 20F:
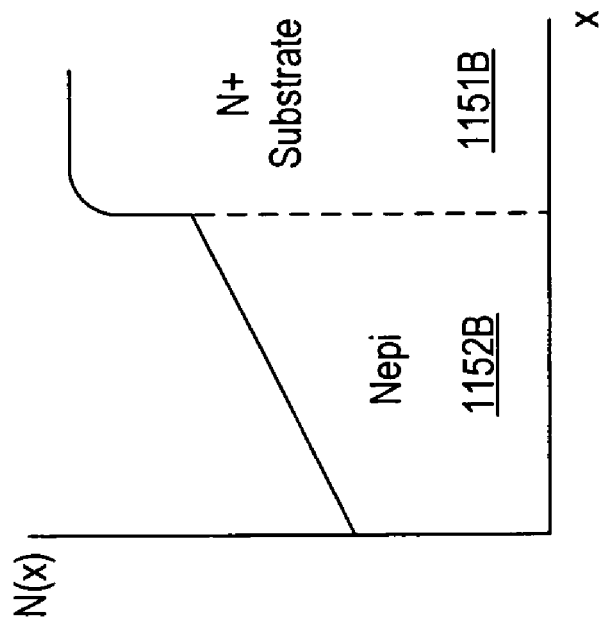
FIGS. 20E and 20F respectively show across-section and a dopant profile of a structure including a graded epitaxial layer.
Figure 20E:
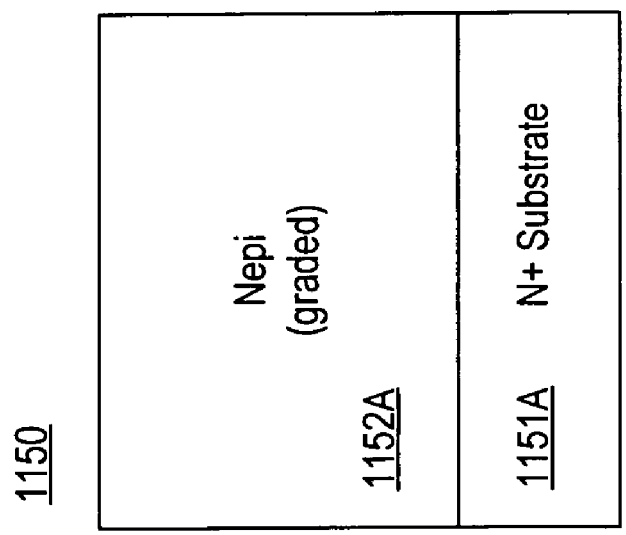

FIG. 20E illustrates a continuously graded epitaxial layer 1152A, higher in concentration near the substrate 1151A and diminishing continuously toward the surface, as shown in the concentration plot 1152B of FIG. 20F. Such an epitaxial layer 1152A, while more difficult to grow than a constant concentration epitaxial layer, doesn't exhibit a single step in its concentration profile (which may be difficult to reproducibly control).

Figure 20H:
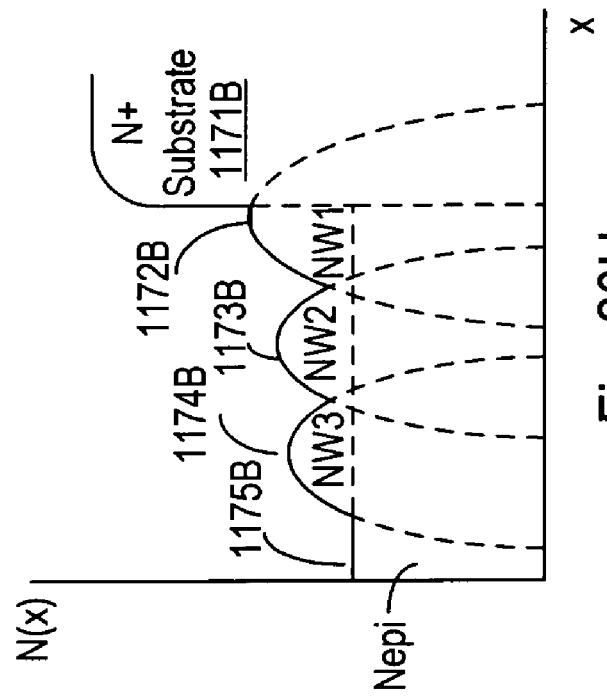
FIGS. 20G and 20H respectively show a cross-section and a dopant profile of a structure including a uniform epitaxial layer with chained implants.
Figure 20G:
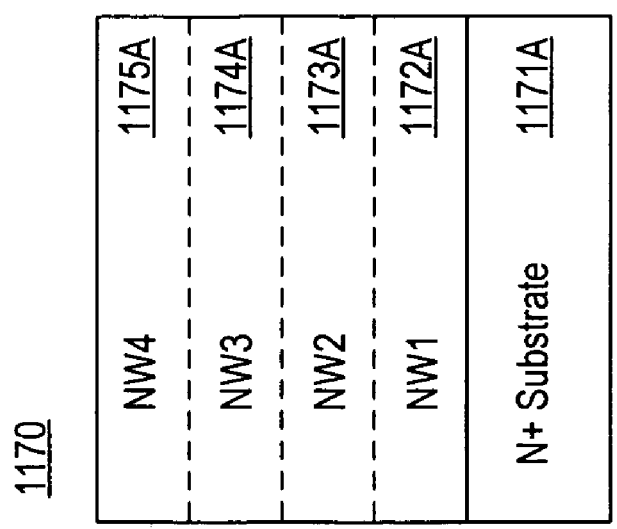

A novel method to synthesize a graded epitaxial layer through the use of multiple ion implantations 1172A, 1173A, and 1174A of differing dose and energy is shown in FIG. 20G as cross-section 1170 and the resulting concentration profiles 1172B, 1173B, and 1174B as shown in FIG. 20H. In this structure, a lightly-doped epitaxial layer of uniform concentration Nepi 1175A is grown atop N+ substrate 1171A, followed by a succession of ion implantations including a deep high energy implantation 1172A labeled NW1, a shallower medium-energy ion implantation 1173A labeled NW2, followed by an even lower energy implant 1174A labeled as NW3. The lowest energy implant may extend to the surface or alternatively be implanted to subsurface depth, leaving a portion of epitaxial layer 1175A uncompensated.

Figure 21A:
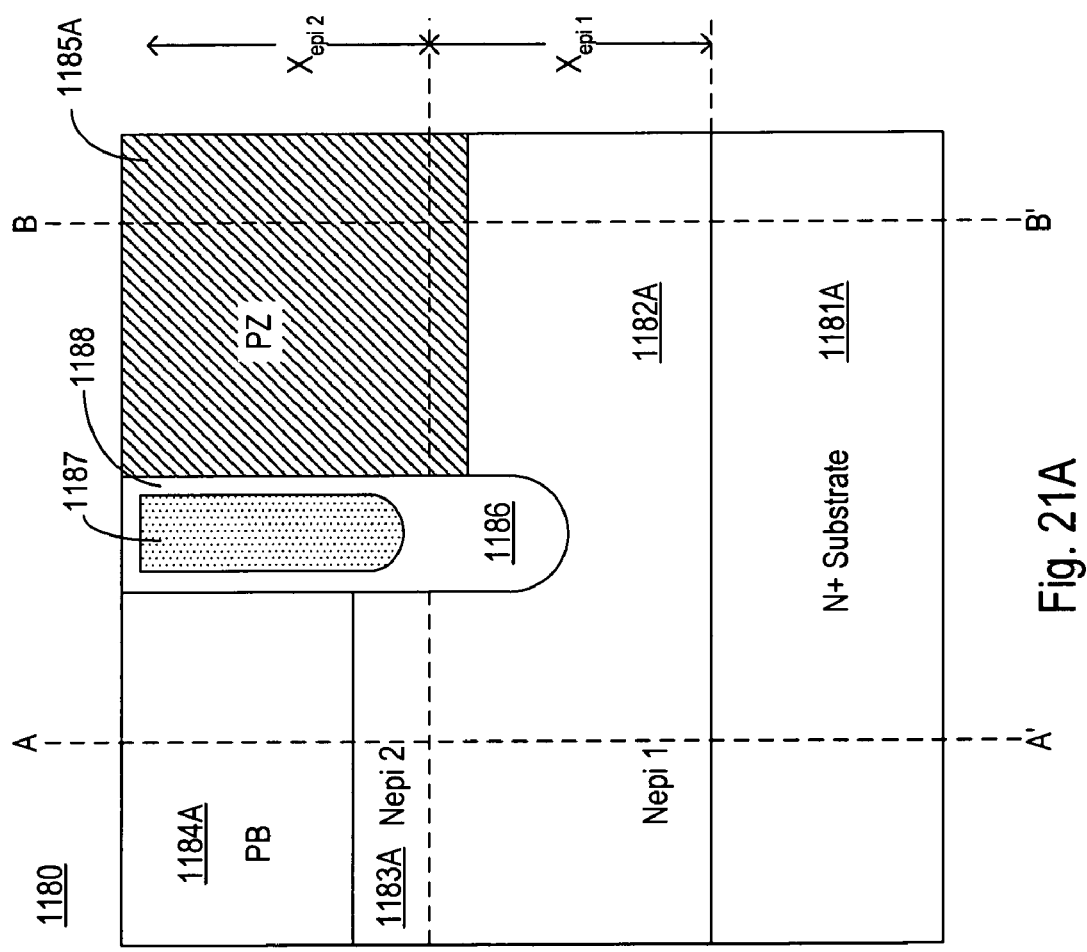
FIG. 21A shows a cross-section of a zener-clamped TBOX trench-gated MOSFET in accordance with an embodiment of the invention having a stepped epitaxy drain.

The value of combining stepped or graded epitaxy with zener-clamped TBOX trench-gate devices is to further minimize the ionization currents near the thin gate oxide without sacrificing the voltage-clamping capability of the PZ zener clamp. FIG. 21A illustrates the relative depth of stepped epitaxial layers 1882, 1183 to the trench gate within device 1180. The top epitaxial layer 1183 has a thickness xepi2 chosen to be deeper than the bottom of the embedded polysilicon gate 1187 (so that the hot carrier generation near the gate oxide sidewall 1188 is low). Furthermore the bottom of the PZ anode region 1185 should overlap onto the first epitaxial layer 1182 so that first epitaxial layer 1182, not the top epitaxial layer 1183, determines the clamping diode breakdown.

As an example, consider a 1.7-μm trench MOSFET with a 0.3 μm thick TBOX layer. 1186. In such a device, the bottom of the embedded polysilicon gate 1185 is at a depth of 1.4 μm. Accordingly, the transition of the first and the second epitaxial layers (i.e., depth xepi2) should be between 1.4 μm and 1.8 μm, but preferably deeper than 1.6 μm (to stay sufficiently far away from the thin gate oxide sidewall 1188 of the device).

Figure 21C:
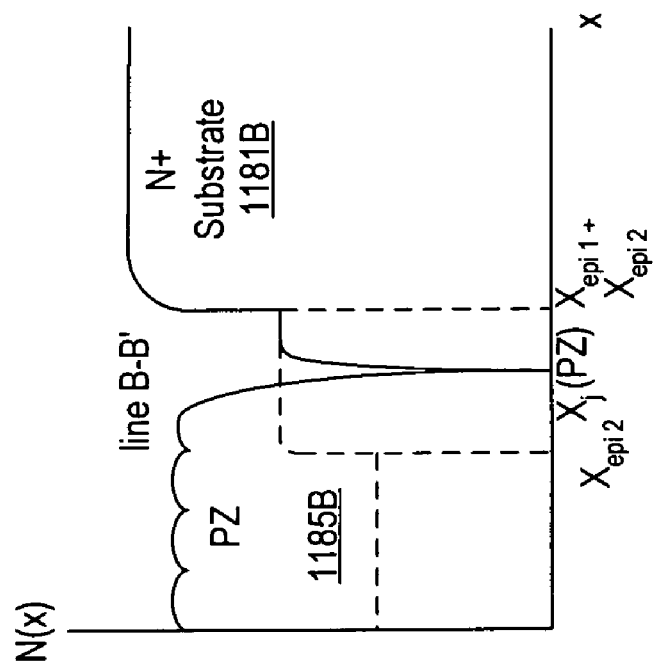
FIGS. 21B and 21C show dopant profiles along respective locations in the MOSFET of FIG. 21A.)
Figure 21B:
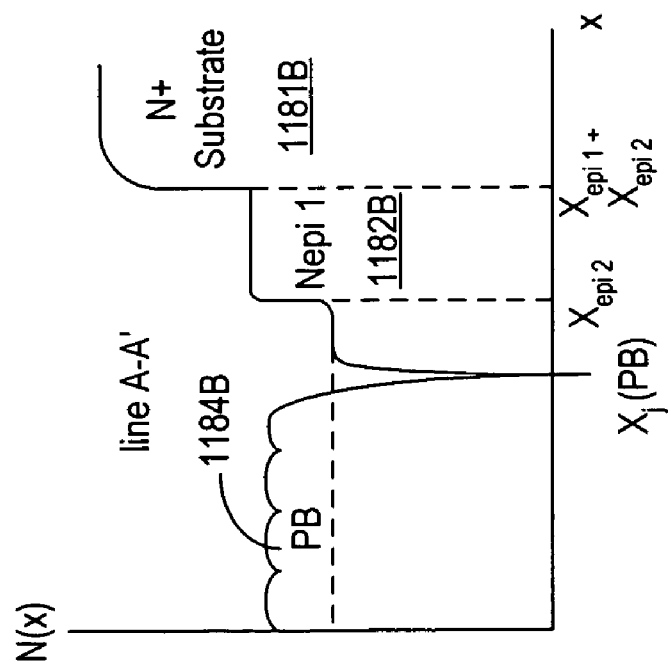

FIG. 21B illustrates the dopant profile through the active MOSFET channel cut line A–A' of device 1180 of FIG. 21A. The doping profile illustrates implanted PB body region 1184A having profile 1184B is shallower than top epitaxial layer 1183, hence junction depth (PB) is less that the depth $X_{epi2}$ of the top epitaxial layer 1183A.

Since the PB body region 1184A does not extend into the heavier-doped bottom epitaxial layer 1182A, the ionization rate in the epitaxial drain (in the vicinity of the gate) is lower than if the device were manufactured using uniformly doped epitaxial layer.

FIG. 21C illustrates the dopant profiles 1185B and 1181B through the PZ zener clamp anode 1185A along the cut line B–B' of device 1180. The doping profile 1185B illustrates that implanted PZ anode region 1185A is deeper than the top epitaxial layer 1183A and extends down into the bottom epitaxial layer 1182A. The PZ region anode 1185A is also shallower than the total thickness of the epitaxial layers, so that the depth $x_{epi2}$ of the top epitaxial layer 1183A is less than the depth $x_j(PZ)$ of the zener diode junction, which is less than the total thickness $(x_{epi1}+x_{epi2})$ of the epitaxial layers.

Bottom epitaxial layer 1182A thickness xepi1 must sustain the rated breakdown voltage $BV_{DSS}$ of the device, ideally just before hitting the reachthrough breakdown limit. The reachthrough limit is imposed by the net epitaxial thickness of the epitaxial region between the bottom of the PZ anode 1185A and the top of the N+ substrate 1181A. Since the PZ anode region 1185A overlaps onto the bottom epitaxial layer 1182A, the net epitaxial thickness of the zener is the total epitaxial thickness (xepi1+xepi2) less the junction depth xj(PZ) of the PZ anode region 1185A. Accordingly, the depths and thicknesses preferably satisfy Equation 1.

$$x_j(PB)<x_{epi2}<x_j(PZ)<(x_{epi1}+x_{epi2}) \quad \text{Equation 1}$$

Assuming the doping of the top epitaxial layer 1183A is lower than that of the bottom layer 1182A then, Equation 1 confirms that the body-to-epitaxial junction breakdown voltage $BV_{body}$ should be higher than that of the zener breakdown voltage $BV_Z$.

Defining the depth of the bottom of the embedded polysilicon trench gate 1187 as xpoly and further defining the depth of the bottom of the trench (i.e., the bottom of the TBOX region 1186) as xtrench, we can further determine that polysilicon gate 1187 must be deeper than body 1184A and in a preferred embodiment should be shallower than the thickness of the more lightly-doped top epitaxial layer 1183A, so that Equation 2 applies.

$$x_j(PB)<x_{poly}<x_{epi2} \quad \text{Equation 2}$$

Combining the trench poly-gate criteria with the aforementioned stepped-epitaxial junction breakdown criteria gives us the general rule for improving a zener-clamped TBOX trench gate MOSFET with a stepped epitaxial layer, namely Equation 3.

$$x_j(PB)<x_{poly}<x_{epi2}<x_j(PZ)<(x_{epi1}+x_{epi2}) \quad \text{Equation 3}$$

In summary the body must be shallower than the polysilicon gate, which should be shallower than the lightly-doped top epitaxial layer, which is shallower than the PZ zener clamp junction depth, which is shallower than the total epitaxial thickness.

In a preferred embodiment the depth of the PZ zener clamp junction is also shallower than bottom of the trench, so that Equation 4 applies.

$$x_j(PB)<x_{poly}<x_{epi2}<x_j(PZ)<x_{trench}<(x_{epi1}+x_{epi2}) \quad \text{Equation 4}$$

Such criteria can only be achieved if the trench is substantially deeper than the gate, i.e., only if thick bottom oxide is present.

It should be noted that while all disclosed devices made in accordance with this invention, along with any process sequence used in their fabrication (such as those shown in FIGS. 15A to 15E and FIGS. 16A and 16B) are the N-channel, the methods described herein can be applied equally well to P-channel devices. Those skilled in the art can substitute phosphorus and arsenic by boron (and vise versa) to form P-channel devices, adjusting implant energies accordingly to accommodate the differing dopant species and their charge-to-mass ratios during ion implantation. Furthermore, the examples shown are not intended to limit or exhaustively describe all possible process flows. In many cases the sequences can be permuted without fundamentally changing the resulting structure or benefits of voltage clamped TBOX trench-gate MOSFETs.

What is claimed is:

1. A semiconductor device comprising:

a substrate of a first conductivity type;

a gate structure in a plurality of trenches in the substrate, wherein in each of the trenches, the gate structure comprises a conductive gate surrounded by an insulating material that has a first thickness at a sidewall of the trench and a second thickness at a bottom of the trench, the second thickness being greater than the first thickness;

a first region of a second conductivity type adjacent to at least one of the trenches, the first region extending to a first depth in the substrate and including a channel region adjacent to the trenches;

a second region of the second conductivity type, wherein the second region is in electrical contact with the first region, and the second region extends to a second depth that is deeper than the first depth and shallower than the trenches; and a third region of the first conductivity type atop the first region, wherein a voltage on the conductive gate controls a current flow from the third region through the first region to an underlying portion of the substrate, wherein the substrate comprises a layer in which the trenches reside, the layer having a graded dopant profile such that a concentration of dopants of the first conductivity increases with depth in the layer.

2. The semiconductor device of claim 1, wherein the substrate comprises a series of implantations having varying depths and dopant concentrations such that the concentrations of the dopants of the first conductivity increase with depth in the substrate.

3. A semiconductor device comprising:

a substrate of a first conductivity type;

a gate structure in a plurality of trenches in the substrate, wherein in each of the trenches, the gate structure comprises a conductive gate surrounded by an insulating material that has a first thickness at a sidewall of the trench and a second thickness at a bottom of the trench, the second thickness being greater than the first thickness;

a first region of a second conductivity type adjacent to at least one of the trenches, the first region extending to a first depth in the substrate and including a channel region adjacent to the trenches;

a second region of the second conductivity type, wherein the second region comprises a series of implantations at varying depths, is in electrical contact with the first region, and extends to a second depth that is deeper than the first depth and shallower than the trenches; and a third region of the first conductivity type atop the first region, wherein a voltage on the conductive gate controls a current flow from the third region through the first region to an underlying portion of the substrate.

* * * * *